United States Patent

Hayashi et al.

[11] Patent Number: 6,104,639
[45] Date of Patent: Aug. 15, 2000

[54] MEMORY CELL WITH STORED CHARGE ON ITS GATE AND PROCESS FOR THE MANUFACTURE THEREOF

[75] Inventors: Yutaka Hayashi, Ibaraki; Mikio Mukai; Yasutoshi Komatsu, both of Kanagawa, all of Japan

[73] Assignee: Sony Corporation, Japan

[21] Appl. No.: 08/998,281

[22] Filed: Dec. 24, 1997

[30] Foreign Application Priority Data

| Dec. 25, 1996 | [JP] | Japan | 8-345474 |
| Mar. 6, 1997 | [JP] | Japan | 9-051584 |
| Nov. 27, 1997 | [JP] | Japan | 9-326242 |
| Dec. 18, 1997 | [JP] | Japan | 9-349060 |

[51] Int. Cl.[7] .................................................. G11C 16/04
[52] U.S. Cl. .................... 365/187; 365/185.26; 365/149; 365/72
[58] Field of Search ................................. 275/351, 369; 365/187, 148, 149, 180, 182, 189.02, 243, 72, 100, 46

[56] References Cited

U.S. PATENT DOCUMENTS

| 5,506,436 | 4/1996 | Hayashi et al. | 257/351 |
| 5,576,571 | 11/1996 | Hayashi et al. | 257/369 |
| 5,578,852 | 11/1996 | Hayashi et al. | 257/351 |
| 5,578,853 | 11/1996 | Hayashi et al. | 257/351 |
| 5,581,106 | 12/1996 | Hayashi et al. | 257/369 |

*Primary Examiner*—Trong Phan
*Assistant Examiner*—Thong Le
*Attorney, Agent, or Firm*—Rader, Fishman & Grauer; Ronald P. Kananen

[57] ABSTRACT

A memory cell with a stored charge on its gate, comprising (A) a channel forming region, (B) a first gate formed on an insulation layer formed on the surface of the channel forming region, the first gate and the channel forming region facing each other through the insulation layer, (C) a second gate capacitively coupled with the first gate, (D) source/drain regions formed in contact with the channel forming region, one source/drain region being spaced from the other, and (E) a non-linear resistance element having at least two ends with one end connected to the first gate.

154 Claims, 37 Drawing Sheets

EXAMPLE OF V-I CHARACTERISTIC OF NON-LINEAR RESISTANCE ELEMENT

EXAMPLE OF V-I CHARACTERISTIC OF 2ND NON-LINEAR RESISTANCE ELEMENT

[STEP-100]

[STEP-110]

[STEP-110]

[ STEP-120 ]

[ STEP-120 ]

[STEP-610]

[STEP-620]

[STEP-630]

[STEP-700]

[STEP-710]

[STEP-720]

[STEP-910]

[STEP-920]

[STEP-1000]

[STEP-1010]

[STEP-1010] CONTINUED

[STEP-1020]

[STEP-1030]

[STEP-1040]

[STEP-1050]

[STEP-1060]

MEMORY CELL WITH STORED CHARGE ON ITS GATE AND PROCESS FOR THE MANUFACTURE THEREOF

BACKGROUND OF THE INVENTION AND RELATED ART

The present invention relates to a memory cell with a stored charge on its gate, a kind of so-called DRAM gain cell, and a process for the manufacture thereof.

A DRAM cell is composed of one transistor and one capacitor which can generally accomplish the minimum area among conventional RAM cells. With a design rule being finer, however, it is requested to develop a complicated capacitor structure and a new capacitor material for achieving a small area and a capacitance which a capacitor is required to attain. And, the cost of DRAM production is increasing due to the formation and processing of dielectric materials and electrode films, research and development of passivation techniques and introduction of novel manufacturing apparatus, and the cost of the capacitor production is now much more expensive than that the transistor production. Readout signals lessen as a finer semiconductor device is structured, and it is ultimately difficult to detect information stored in a memory cell without a change in structure and materials.

For overcoming the above problem, one DRAM gain cell is known in "Super-Low-Voltage Operation of a Semi-Static Complementary Gain DRAM Memory Cell", S. Shukuri, et al., 1993 Symposium on VLSI Technology, Digest of Tech. Papers, 3A-4, pp23–24, 1993. FIG. 40 shows an equivalent circuit of the above DRAM gain cell composed of a memory transistor RM having a floating gate and a complementary word transistor WM. In the DRAM gain cell, a gate of the word transistor WM and a gate of the memory transistor RM are connected to a common word line WL, and one source/drain region of the word transistor WM and one source/drain region of the memory transistor RM are connected to a common bit line BL, so that the number of external wiring is decreased. When information is written in the above DRAM gain cell, a voltage of 1.5 Volts is applied to the bit line BL, and a minus voltage is applied to the word line WL. As a result, a positive charge is stored on the floating gate of the memory transistor RM, and a gate threshold voltage of the memory transistor RM shifts toward a minus direction. When the DRAM gain cell is in a standby state, a potential is applied to the word line WL so that the memory transistor RM and the word transistor WM are not brought into an on-state. When information is read out, applied to the word line WL is a potential between the gate threshold voltage of the memory transistor RM when a positive charge is stored on the floating gate and the gate threshold voltage when no positive charge is stored. As a result, when a positive charge is stored on the floating gate, a current flows through the DRAM gain cell.

As explained above, the DRAM gain cell shown in FIG. 40 in principle requires no capacitor although it is required as an auxiliary in some cases. However, when it is attempted to decrease the area of the DRAM gain cell, the word transistor WM is required to be composed of a thin film transistor (TFT), and the problem is that the production process is complicated and that the DRAM gain cell can be no longer produced by a conventional production process. Further, there is another problem that controllability and reproducibility of TFTs are difficult when mass production technologies available at present are applied. Moreover, there is another problem that since the above DRAM gain cell has a small operation margin, it is required to connect the gates or the drains of the two transistors to different word lines or different bit lines for securing the operation margin, and that the area of such a DRAM gain cell cannot be decreased.

OBJECT AND SUMMARY OF THE INVENTION

It is therefore an object of the present invention to provide a memory cell with a stored charge on its gate, which requires no much complicated production process, which serves to suppress an increase in the number of external wiring and the area of a terminal portion, which can be produced almost equally by applying a process of producing a conventional flash memory, which requires no complicated structured capacitor unlike a conventional DRAM and which can suppress an increase in a cell area, and to provide a process for the manufacture thereof.

The memory cell with a stored charge on its gate provided by the present invention for achieving the above object is a memory cell comprising;

(A) a channel forming region,
(B) a first gate formed on an insulation layer formed on the surface of the channel forming region, the first gate and the channel forming region facing each other through the insulation layer,
(C) a second gate capacitively coupled with the first gate,
(D) source/drain regions formed in contact with the channel forming region, one source/drain region being spaced from the other, and
(E) a non-linear resistance element having at least two ends with one end connected to the first gate.

The above "one end connected to the first gate" includes a case where said one end of the non-linear resistance element has a common region with the first gate.

In the memory cell with a stored charge on its gate of the present invention (to be simply referred to as "memory cell" hereinafter), the non-linear resistance element may have a two-terminal operation characteristic. The term "two-terminal operation characteristic" refers to an operation characteristic that the amount of current which flows between two regions is uniquely determined depending upon a voltage between the two regions as in a diode, or to the following operation mode in a field effect transistor. For four main regions (source region, drain region, channel forming region and gate region) as in a field effect transistor, and when the gate region and the drain region are, for example, connected to each other, the current which flows between the source region and the drain region is uniquely determined depending upon a voltage between the source region and the drain region. The "two-terminal operation characteristic" to be described hereinafter also has the same meaning.

In the memory cell of the present invention, the non-linear resistance element preferably has characteristics that it is brought into a low resistive state when a first voltage having the same polarity as that of a forward conduction voltage and having an absolute value which is equal to, or greater than, an absolute value of the forward conduction voltage is applied across the two ends and that it is brought into a high resistive state when a second voltage having the same polarity as that of the forward conduction voltage and having an absolute value smaller than the absolute value of the forward conduction voltage or a voltage having an opposite polarity to the forward conduction voltage is applied across the two ends. The above memory cell of the present invention will be called "first configuration of the present invention". For example, when the non-linear resistance element is formed of a diode, it is preferred to use a diode having characteristics that it is brought into a low resistive state when the first voltage is applied.

In the memory cell according to the first configuration of the present invention, the non-linear resistance element preferably has characteristics that it is brought into a high resistive state when a third voltage having an opposite polarity to the forward conduction voltage and having an absolute value smaller than an absolute value of a reverse conduction voltage is applied across the two ends and that it is brought into a low resistive state when a fourth voltage having an opposite polarity to the forward conduction voltage and having an absolute value which is equal to, or greater than, the absolute value of the reverse conduction voltage is applied across the two ends.

As the non-linear resistance element having the above characteristics, a pn junction diode can be used. In this case, the pn junction diode may have a semiconductor region which is the same as the source/drain regions in conductivity type and a semiconductor region which is opposite to the source/drain regions in conductivity type, the semiconductor region which is opposite to the source/drain regions in conductivity type corresponds to said one end of the non-linear resistance element, and the semiconductor region which is the same as the source/drain regions in conductivity type corresponds to the other end of the non-linear resistance element. The pn junction diode preferably has a pn junction region formed of a single crystal semiconductor, for the higher resistance value of the non-linear resistance element in a high resistive, for the smaller variation of the reverse conduction voltage in the non-linear resistance element and for the better reproducibility. The reverse conduction voltage of the non-linear resistance formed of the pn junction diode can be determined by a punchthrough, an avalanche breakdown or a Zener breakdown. Or, the pn junction diode preferably has a lateral pn junction for the higher resistance value of the non-linear resistance element in a high resistive state, for the smaller variation of the reverse conduction voltage and for the better reproducibility.

Alternatively, as the non-linear resistance element having the above characteristics, a field effect transistor can be used. In this case, the reverse conduction voltage of the non-linear resistance element can be controlled by a gate threshold voltage of the field effect transistor.

In the memory cell according to the first configuration of the present invention, a hetero-junction diode can be used as the non-linear resistance element, for the decreased forward conduction voltage.

In the memory cell of the present invention, the second gate can be capacitively coupled with the first gate through a dielectric film. The dielectric film can be formed of, for example, $SiO_2$, $SiO_2/Si_xN_y$, $SiO_2/Si_xN_y/SiO_2$ or $Ta_2O_5/Si_xN_y$.

The memory cell according to the first configuration of the present invention, preferably, further has a second non-linear resistance element having at least two ends with one end connected to the first gate. The above memory cell will be called "second configuration of the present invention". In this case, the second non-linear resistance element preferably has a two-terminal operation characteristic. Otherwise, the second non-linear resistance element preferably has characteristics that it is brought into a low resistive state when a fifth voltage having the same polarity as that of a second forward conduction voltage and having an absolute value which is equal to, or greater than, an absolute value of the second forward conduction voltage is applied across the two ends and that it is brought into a high resistive state when a sixth voltage having the same polarity as that of the second forward conduction voltage and having an absolute value smaller than the absolute value of the second forward conduction voltage or a seventh voltage having an opposite polarity to the second forward conduction is applied across the two ends.

The second non-linear resistance element having the above characteristics is preferably formed of a pn junction diode having a semiconductor region which is the same as the source/drain regions in conductivity type and a semiconductor region which is opposite to the source/drain regions in conductivity type, the semiconductor region which is the same as the source/drain regions in conductivity type corresponds to said one end of the second non-linear resistance element, and the semiconductor region which is opposite to the source/drain regions in conductivity type corresponds to the other end of the second non-linear resistance element. The pn junction diode preferably has a pn junction region formed of a single crystal semiconductor, for the higher resistance value of the second non-linear resistance element in a high resistive state. Otherwise, the pn junction diode preferably has a lateral pn junction, for the higher resistance value of the second non-linear resistance element in a high resistive state.

As the second non-linear resistance element having the above characteristics, a hetero-junction diode can be used from the view point of decreasing the forward conduction voltage.

The memory cell according to the first configuration of the present invention preferably has a configuration in which the second gate is connected to a word line, the other end of the non-linear resistance element is connected to a bit line, and one source/drain region is connected to a read line. The above memory cell of the present invention will be called "first A configuration of the present invention". The read line may be formed in parallel with the word line or may be formed in parallel with the bit line. That is, there may be a structure in which a plurality of the memory cells are connected to one word line and one read line or a plurality of the memory cells are connected to one bit line and one read line. Further, there may be a constitution in which the memory cells in an arbitrary number, disposed in an arbitrary position, are connected with one read line.

In the memory cell according to the first A configuration of the present invention, preferably, a first bit-line potential is applied to the bit line, a first read-line potential is applied to the read line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, whereby a charge of a first polarity is transported from the bit line to the first gate through the non-linear resistance element and the charge of a first polarity is stored on or in the first gate. In this manner, information is written in the memory cell.

In the memory cell according to the first A configuration of the present invention, preferably, a second bit-line potential is applied to the bit line, a first read-line potential is applied to the read line and then a word-line potential is switched from a first word-line potential to a second word-line potential, thereby to generate the second voltage or a voltage having an opposite polarity to the forward conduction voltage (and having an absolute value smaller than an absolute value of a reverse conduction voltage), between the first gate and said other end of the non-linear resistance element through the capacitive coupling between the first gate and the second gate and to keep the non-linear resistance element in a high resistive state, whereby the charge stored on or in the first gate is prevented from undergoing a change in state. In this manner, writing information in the memory cell can be inhibited.

In the memory cell according to the first A configuration of the present invention, preferably, the on-linear resistance element further has characteristics that it is brought into a high resistive state when a third voltage having an opposite polarity to the forward conduction voltage and having an absolute value smaller than an absolute value of a reverse conduction voltage is applied across the two ends and that it is brought into a low resistive state when a fourth voltage having an opposite polarity to the forward conduction voltage and having an absolute value which is equal to, or greater than, the absolute value of the reverse conduction voltage is applied across the two ends. Preferably, a third word-line potential is applied to the word line and a third bit-line potential is applied to the bit line, thereby to generate the fourth voltage between the first gate and said other end of the non-linear resistance element through the capacitive coupling between the first gate and the second gate and to bring the non-linear resistance element into a low resistive state, and a charge of a second polarity which is an opposite polarity to a first polarity is transported from the bit line to the first gate through the non-linear resistance element, or the charge of a first polarity is discharged from the first gate to the bit line through the non-linear resistance element, whereby the charge-stored state of the first gate is brought into a second charge-stored state. In this manner, information stored in the memory cell can be erased.

In the memory cell according to the first A configuration of the present invention, preferably, the non-linear resistance element is formed of a pn junction diode and is formed in the first gate or formed in or on an extended region of the first gate, for the simplification of its structure. The above pn junction diode can have a semiconductor region which is the same as the source/drain regions in conductivity type and a semiconductor region which is opposite to the source/drain regions in conductivity type, the semiconductor region which is opposite to the source/drain regions in conductivity type corresponds to said one end of the non-linear resistance element, and the semiconductor region which is the same as the source/drain regions in conductivity type corresponds to said other end of the non-linear resistance element.

When the first gate or the extended region of the first gate is formed of a polysilicon film, the above pn junction diode may be structured so as to have a lateral pn junction formed in the polysilicon film. Further, preferably, polysilicon is single-crystallized, and at least the pn junction region is formed in a single-crystallized portion, i.e., the pn junction region of the pn junction diode is formed of a single crystal semiconductor, for the higher resistance value of the non-linear resistance element in a high resistive state, for the smaller variation of the reverse conduction voltage and for better reproducibility.

Alternatively, in the memory cell according to the first A configuration of the present invention, the non-linear resistance element can be formed of a hetero-junction diode, and the non-linear resistance element can be formed on the first gate or on an extended region of the first gate, from the view point of decreasing the forward conduction voltage.

The memory cell according to the second configuration of the present invention preferably has a configuration in which the second gate is connected to a word line, the other end of the non-linear resistance element is connected to a bit line, one source/drain region is connected to a read line, and the other end of the second non-linear resistance element is connected to an erase line. The above memory cell of the present invention will be called "second A configuration of the present invention". In the memory cells according to the second A configuration of the present invention or according to the second B or second C configuration of the present invention to be described later, the non-linear resistance element having said other end connected, e.g., to the bit line will be sometimes called "first non-linear resistance element" as a matter of convenience for distinguishing it from the second non-linear resistance element.

In the memory cell according to the second A configuration of the present invention, preferably, a first bit-line potential is applied to the bit line, a first read-line potential is applied to the read line, a first erase-line potential is applied to the erase line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate, whereby a charge of a first polarity is transported from the bit line to the first gate through the non-linear resistance element and the charge of a first polarity is stored on or in the first gate. In this manner, information can be stored in the memory cell.

In the memory cell according to the second A configuration of the present invention, preferably, a second bit-line potential is applied to the bit line, a first read-line potential is applied to the read line, a first erase-line potential is applied to the erase line and then a word-line potential is switched from a first word-line potential to a second word-line potential, thereby to generate the second voltage or a voltage having an opposite polarity to the forward conduction voltage (and having an absolute value smaller than an absolute value of a reverse conduction voltage) of the non-linear resistance element, between the first gate and said other end of the non-linear resistance element through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state. In this manner, writing information in the memory cell can be inhibited.

Further, in the memory cell according to the second A configuration of the present invention, preferably, a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state. In this manner, information stored in the memory cell can be erased.

When the reverse conduction voltage in the first non-linear resistance element varies in each memory cell, the charge on the first gate after the erasing of a charge stored on or in the first gate varies. When the above variation takes place, not only a readout margin decreases, but also the charge stored on or in the first gate varies when information is written in the first gate in a short period of time (with fast access). However, when said one end of the second non-linear resistance element is connected to the first gate and said other end is connected to the erase line, the variation of a charge on the first gate after the erasing of the charge stored on or in the first gate can be decreased. The reason thereof is as follows; the forward conduction voltage of a non-linear resistance element is generally low, and the variation of the forward conduction voltage can be controlled so as to be smaller than the variation of a reverse conduction voltage.

The erase line may be formed in parallel with the word line or may be formed in parallel with the bit line. That is, there may be a structure in which a plurality of the memory cells are connected to one word line and one erase line, or there may be a constitution in which a plurality of the memory cells are connected to one bit line and one erase line. In second B configuration and second C configuration to be described later, an erase line may have the same wiring constitution.

In the memory cell according to the second A configuration of the present invention, preferably, each of the non-linear resistance element and the second non-linear resistance element or one of these non-linear resistance elements is formed of a pn junction diode and is formed in the first gate or formed in or on an extended region of the first gate, from the view point of simplifying the structure.

In the above case, the non-linear resistance element is preferably formed of a pn junction diode having a first semiconductor region which is the same as the source/drain regions in conductivity type and a second semiconductor region which is opposite to the source/drain regions in conductivity type, the second semiconductor region corresponds to said one end of the non-linear resistance element, and the first semiconductor region corresponds to said other end of the non-linear resistance element. Further, the second non-linear resistance element is preferably formed of a pn junction diode having a third semiconductor region which is the same as the source/drain regions in conductivity type and a fourth semiconductor region which is opposite to the source/drain regions in conductivity type, the third semiconductor region corresponds to said one end of the second non-linear resistance element, and the fourth semiconductor region corresponds to said other end of the second non-linear resistance element.

When the first gate or the extended region of the first gate is formed of a polysilicon film, each of the above pn junction diodes or one of the above pn junction diodes may be structured so as to have a lateral pn junction formed in the polysilicon film. Further, preferably, polysilicon is single-crystallized, and at least the pn junction region is formed in a single-crystallized portion, i.e., the pn junction region of each or one of the pn junction diodes constituting the first non-linear resistance element and the second non-linear resistance element is formed of a single crystal semiconductor, for the higher resistance value of the first non-linear resistance element and/or the second non-linear resistance element in a high resistive state, for the smaller variation of the reverse conduction voltage of the first non-linear resistance element and for better reproducibility.

Alternatively, in the memory cell according to the second A configuration of the present invention, each or one of the first non-linear resistance element and the second non-linear resistance element can be formed of a hetero-junction diode, and each or one of the non-linear resistance element and the second non-linear resistance element can be formed on the first gate or on an extended region of the first gate from the view point of decreasing the forward conduction voltage.

The memory cell according to the first configuration of the present invention preferably has a configuration in which the second gate is connected to a word line, and the other end of the non-linear resistance element and one source/drain region are connected to a bit line. The above memory cell of the present invention will be called "first B configuration of the present invention.

In the memory cell according to the first B configuration of the present invention, preferably, a first bit-line potential is applied to the bit line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, whereby a charge of a first polarity is transported from the bit line to the first gate through the non-linear resistance element and the charge of a first polarity is stored on or in the first gate. In this manner, information can be written in the memory cell.

In the memory cell according to the first B configuration of the present invention, preferably, a second bit-line potential is applied to the bit line and then a word-line potential is switched from a first word-line potential to a second word-line potential, thereby to generate the second voltage or a voltage having an opposite polarity to the forward conduction voltage (and having an absolute value smaller than an absolute value of a reverse conduction voltage), between the first gate and said other end of the non-linear resistance element through the capacitive coupling between the first gate and the second gate and to keep the non-linear resistance element in a high resistive state, whereby the charge stored on or in the first gate is prevented from undergoing a change in state. In this manner, writing information in the memory cell can be inhibited.

In the memory cell according to the first B configuration of the present invention, preferably, the non-linear resistance element has characteristics that it is brought into a high resistive state when a third voltage having an opposite polarity to the forward conduction voltage and having an absolute value smaller than an absolute value of a reverse conduction voltage is applied across the two ends and that it is brought into a low resistive state when a fourth voltage having an opposite polarity to the forward conduction voltage and having an absolute value which is equal to, or greater than, the absolute value of the reverse conduction voltage is applied across the two ends. In this case, preferably, a third word-line potential is applied to the word line and a third bit-line potential is applied to the bit line, thereby to generate the fourth voltage between the first gate and said other end of the non-linear resistance element through the capacitive coupling between the first gate and the second gate and to bring the non-linear resistance element into a low resistive state, and a charge of a second polarity which is an opposite polarity to a first polarity is transported from the bit line to the first gate through the non-linear resistance element, or the charge of a first polarity is discharged from the first gate to the bit line through the non-linear resistance element, whereby the charge-stored state of the first gate is brought into a second charge-stored state. In this manner, information stored in the memory cell can be erased.

In the memory cell according to the first B configuration of the present invention, the non-linear resistance element is preferably formed of a pn junction diode and is formed in the first gate or formed in or on an extended region of the first gate, which is preferred from the view point of simplifying the structure. The pn junction diode preferably has a semiconductor region which is the same as the source/drain regions in conductivity type and a semiconductor region which is opposite to the source/drain regions in conductivity type, the semiconductor region which is opposite to the source/drain regions in conductivity type corresponds to said one end of the non-linear resistance element, and the semiconductor region which is the same as the source/drain regions in conductivity type corresponds to said other end of the non-linear resistance element.

When the first gate or the extended region of the first gate is formed of a polysilicon film, the above pn junction diode may be structured so as to have a lateral pn junction formed in the polysilicon film. Further, preferably, polysilicon is single-crystalloid, and at least the pn junction region is formed in a single-crystallized portion, i.e., the pn junction region of the pn junction diode is formed of a single crystal semiconductor, for the higher resistance value of the non-linear resistance element in a high resistive state, for the smaller variation of the reverse conduction and for better reproducibility.

Alternatively, in the memory cell according to the first B configuration of the present invention, the non-linear resistance element can be formed of a hetero-junction diode, and the non-linear resistance element can be formed on the first gate or on an extended region of the first gate, from the view point of decreasing the forward conduction voltage.

The memory cell according to the second configuration of the present invention preferably has a configuration in which the second gate is connected to a word line, the other end of the non-linear resistance element and one source/drain region are connected to a bit line, and the other end of the second non-linear resistance element is connected to an erase line. The above memory cell of the present invention will be called "second B configuration of the present invention".

In the memory cell according to the second B configuration of the present invention, preferably, a first bit-line potential is applied to the bit line, a first erase-line potential is applied to the erase line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby a charge of a first polarity is transported from the bit line to the first gate through the non-linear resistance element and the charge of a first polarity is stored on or in the first gate. In this manner, information can be written in the memory cell.

In the memory cell according to the second B configuration of the present invention, preferably, a second bit-line potential is applied to the bit line, a first erase-line potential is applied to the erase line and then a word-line potential is switched from a first word-line potential to a second word-line potential, thereby to generate the second voltage or a voltage having an opposite polarity to the forward conduction voltage (and having an absolute value smaller than an absolute value of a reverse conduction voltage) of the non-linear resistance element, between the first gate and said other end of the non-linear resistance element through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state. In this manner, writing information in the memory cell can be inhibited.

Further, in the memory cell according to the second B configuration of the present invention, preferably, a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state. In this manner, information stored in the memory cell can be erased.

In the memory cell according to the second B configuration of the present invention, each of the non-linear resistance element and the second non-linear resistance element or one of these non-linear resistance elements is preferably formed of a pn junction diode and is formed in the first gate or formed in or on an extended region of the first gate, whose structure is preferred for simplifying the structure of the memory cell.

In the above case, the non-linear resistance element is preferably formed of a pn junction diode having a first semiconductor region which is the same as the source/drain regions in conductivity type and a second semiconductor region which is opposite to the source/drain regions in conductivity type, the second semiconductor region corresponds to said one end of the non-linear resistance element, and the first semiconductor region corresponds to said other end of the non-linear resistance element. Further, the second non-linear resistance element is preferably formed of a pn junction diode having a third semiconductor region which is the same as the source/drain regions in conductivity type and a fourth semiconductor region which is opposite to the source/drain regions in conductivity type, the third semiconductor region corresponds to said one end of the second non-linear resistance element, and the fourth semiconductor region corresponds to said other end of the second non-linear resistance element.

When the first gate or the extended region of the first gate is formed of a polysilicon film, each of the above pn junction diodes or one of the above pn junction diodes may be structured to have a lateral pn junction formed in the polysilicon film. Further, preferably, polysilicon is single-crystallized, and at least the pn junction region is formed in a single-crystallized portion, i.e., the pn junction region of each or one of the pn junction diodes constituting the first non-linear resistance element and the second non-linear resistance element is formed of a single crystal semiconductor, for the higher resistance value of the first non-linear resistance element and/or the second non-linear resistance element in a high resistive state, for the smaller variation of the reverse conduction voltage of the first non-linear resistance element and for the better reproducibility.

Alternatively, in the memory cell according to the second B configuration of the present invention, each of the non-linear resistance element and the second non-linear resistance element or one of these non-linear resistance elements can be formed of a hetero-junction diode, and each or one of the non-linear resistance element and the second non-linear resistance element can be formed on the first gate or on an extended region of the first gate, whose structure is preferred from the view point of decreasing the forward conduction voltage.

The memory cell according to the first configuration of the present invention preferably has a configuration in which the second gate is connected to a word line, the other end of the non-linear resistance element is connected to one source/drain region, and said one source/drain region is connected to a bit line. The above memory cell will be called "first C configuration of the present invention". The above expression "the other end of the non-linear resistance element is connected to one source/drain region" includes a case where said other end of the non-linear resistance element has a common region with said one source/drain region.

In the memory cell according to the first C configuration of the present invention, preferably, a first bit-line potential is applied to the bit line and then a word-line potential is switched from a first word-line potential to a second word-line potential, thereby to generate the first voltage between the first gate and said one source/drain region through the capacitive coupling between the first gate and the second gate and to bring the non-linear resistance element into a low resistive state, whereby a charge of a first polarity is transported from the bit line to the first gate through said one source/drain region and the non-linear resistance element, and the charge of a first polarity is stored on or in the first gate. In this manner, information can be written in the memory cell.

In the memory cell according to the first C configuration of the present invention, preferably, a second bit-line potential is applied to the bit line and then a word-line potential is switched from a first word-line potential to a second word-line potential, thereby to generate the second voltage or a voltage having an opposite polarity to the forward conduction voltage (and having an absolute value smaller than an absolute value of a reverse conduction voltage), between the first gate and said one source/drain region through the capacitive coupling between the first gate and the second gate and to keep the non-linear resistance element in a high resistive state, whereby the charge stored on or in the first gate is prevented from undergoing a change in state. In this manner, writing information in the memory cell can be inhibited.

In the memory cell according to the first C configuration of the present invention, preferably, the non-linear resistance element has characteristics that it is brought into a high resistive state when a third voltage having an opposite polarity to the forward conduction voltage and having an absolute value smaller than an absolute value of a reverse conduction voltage is applied across the two ends and that it is brought into a low resistive state when a fourth voltage having an opposite polarity to the forward conduction voltage and having an absolute value which is equal to, or greater than, the absolute value of the reverse conduction voltage is applied across the two ends. In this case, a third word-line potential is applied to the word line and a third bit-line potential is applied to the bit line, thereby to generate the fourth voltage between the first gate and said one source/drain region through the capacitive coupling between the first gate and the second gate and to bring the non-linear resistance element into a low resistive state, and a charge of a second polarity which is an opposite polarity to a first polarity is transported from the bit line to the first gate through said one source/drain region and the non-linear resistance element, or the charge of a first polarity is discharged from the first gate to the bit line through the non-linear resistance element and said one source/drain region, whereby the charge-stored state of the first gate is brought into a second charge-stored state. In this manner, information stored in the memory cell can be erased.

In the memory cell according to the first C configuration of the present invention, the non-linear resistance element is preferably formed of a pn junction diode, one region of the pn junction diode (a region of the pn junction diode which is opposite to the source/drain regions in conductivity type) corresponding to said one end of the non-linear resistance element is formed in said one source/drain region, and the other region of the pn junction diode (a region of the pn junction diode which is the same as the source/drain regions in conductivity type) corresponding to said other end of the non-linear resistance element has a common region with said one source/drain region. Otherwise, the non-linear resistance element is preferably formed of a pn junction diode, one region of the pn junction diode (a region of the pn junction diode which is opposite to the source/drain regions in conductivity type) corresponding to said one end of the non-linear resistance element has a common region with the first gate, and the other region of the pn junction diode (a region of the pn junction diode which is the same as the source/drain regions in conductivity type) corresponding to said other end of the non-linear resistance element is formed in an extended region of the first gate extending to said one source/drain region. When the first gate or the extended region of the first gate is formed of a polysilicon, the above pn junction diode may be structured so as to have a lateral pn junction formed in the polysilicon film. Further, preferably, polysilicon is single-crystallized, and at least the pn junction region is formed in a single-crystallized portion, i.e., the pn junction region of the pn junction diode is formed of a single crystal semiconductor, for the higher resistance value of the non-linear resistance element in a high resistive state, for the smaller variation of the reverse conduction voltage of the non-linear resistance element and for the better reproducibility. Otherwise, preferably, the pn junction constituting the non-linear resistance element has a lateral pn junction, for the higher resistance value of the non-linear resistance element in a high resistive state, for the smaller variation of the reverse conduction voltage of the non-linear resistance element and for better reproducibility.

Alternatively, in the memory cell according to the first C configuration of the present invention, the non-linear resistance element can be formed of a hetero-junction diode from the viewpoint of decreasing the forward conduction voltage.

Alternatively, in the memory cell according to the first C configuration of the present invention, the non-linear resistance element may be formed of a field effect transistor for setting the reverse conduction voltage at a desired value. The field effect transistor as the non-linear resistance element is preferably formed in the surface region of said one source/drain region. Further, one source/drain portion of the field effect transistor corresponding to said one end of the non-linear resistance element is preferably connected to the first gate and to a gate portion of the field effect transistor.

The memory cell according to the second configuration of the present invention preferably has a configuration in which the second gate is connected to a word line, the other end of the non-linear resistance element is connected to one source/drain region, said one source/drain region is connected to a bit line, and the other end of the second non-linear resistance element is connected to an erase line. The above memory cell of the present invention will be called "second C configuration of the present invention".

In the memory cell according to the second C configuration of the present invention, preferably, a first bit-line potential is applied to the bit line, a first erase-line potential is applied to the erase line and then a word-line potential is switched from a first word-line potential to a second word-line potential, thereby to generate the first voltage between the first gate and said one source/drain region through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby a charge of a first polarity is transported from the bit line to the first gate through said one source/drain region and the non-linear resistance element and the charge of a first polarity is stored on or in the first gate. In this manner, information can be written in the memory cell.

In the memory cell according to the second C configuration of the present invention, preferably, a second bit-line potential is applied to the bit line, a first erase-line potential is applied to the erase line and then a word-line potential is switched from a first word-line potential to a second word-line potential, thereby to generate the second voltage or a voltage having an opposite to the forward conduction voltage (and having an absolute value smaller than an absolute value of a reverse conduction voltage) of the non-linear resistance element, between the first gate and said one source/drain region through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state. In this manner, writing information in the memory cell can be inhibited.

In the memory cell according to the second C configuration of the present invention, preferably, a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state. In this manner, information stored in the memory cell can be erased.

In the memory cell according to the second C configuration of the present invention, the non-linear resistance element is preferably formed of a pn junction diode, one region of the pn junction diode corresponding to said one end of the non-linear resistance element is formed in said one source/drain region, and the other region of the pn junction diode corresponding to said other end of the non-linear resistance element has a common region with said one source/drain region. Otherwise, the non-linear resistance element is preferably formed of a pn junction diode, one region of the pn junction diode corresponding to said one end of the non-linear resistance element has a common region with the first gate, and the other region of the pn junction diode corresponding to said other end of the non-linear resistance element is formed in an extended region of the first gate extending to said one source/drain region.

Further, in the memory cell according to the second C configuration of the present invention, the second non-linear resistance element is preferably formed of a pn junction diode, one region of the pn junction diode having the same conductivity type as the conductivity type of the source/drain regions corresponds to said one end of the second non-linear resistance element, and the other region of the pn junction diode having an opposite conductivity type to the conductivity type of the source/drain regions corresponds to said other end of the second non-linear resistance element. Further, the second non-linear resistance element can be formed of a pn junction diode, and the second non-linear resistance element can be formed in the first gate or formed in or on an extended region of the first gate.

In the memory cell according to the second C configuration of the present invention, when the first gate or the extended region of the first gate is formed of a polysilicon film, each of the first non-linear resistance element and the second non-linear resistance element or one of these non-linear resistance elements may be formed of a pn junction diode, and each or one of the pn junction diodes may be structured so as to have a lateral pn junction formed in the above polysilicon film. Further, preferably, polysilicon is single-crystallized, and at least the pn junction region is formed in a single-crystallized portion, i.e., the pn junction region of each or one of the pn junction diodes constituting the first non-linear resistance element and the second non-linear resistance element is formed of a single crystal semiconductor, for the higher resistance value of the first non-linear resistance element and/or the second non-linear resistance element in a high resistive state, for the smaller variation of the reverse conduction voltage of the first non-linear resistance element and for the better reproducibility. Preferably, the pn junction region formed in the above single-crystallized portion has a lateral pn junction, for the higher resistance value of the first non-linear resistance element and/or the second non-linear resistance element in a high resistive state, for the smaller variation of the reverse conduction voltage of the first non-linear resistance element and for the better reproducibility.

Alternatively, in the memory cell according to the second C configuration of the present invention, each of the non-linear resistance element and the second non-linear resistance element or one of these non-linear resistance elements can be formed of a hetero-junction diode from the viewpoint of decreasing the forward conduction voltage.

Alternatively, the first non-linear resistance element may be formed of a field effect transistor for setting the reverse conduction voltage at a desired value. In this case, the field effect transistor as the first non-linear resistance element is preferably formed in the surface region of said one source/drain region. Further, one source/drain portion of the field effect transistor corresponding to said one end of the first non-linear resistance element is preferably connected to the first gate and to a gate portion of the field effect transistor.

In the memory cells according to the first A, first B, first C, second A, second B or second C configuration of the present invention, preferably, the other source/drain region is reversely biased with regard to the channel forming region when the second word-line potential is applied to the word line. Specifically, when the memory cell is n type, a potential greater than a value obtained by deducting a gate threshold voltage (seen from the first gate) from a potential of the first gate can be applied to said other source/drain region, and when the memory cell is p type, a potential smaller than a value obtained by deducting a gate threshold voltage (seen from the first gate) from a potential of the first gate can be applied to said other source/drain region. Alternatively, preferably, the other source/drain region is made floating with regard to the channel forming region when the second word-line potential is applied to the word line. Specifically, for example, a transistor for selection connected to said other source/drain region can be turned off. In the above manner, the current which flows between the source/drain regions of the memory cell can be reliably inhibited when information is written, i.e., when a charge is stored on or in the first gate, and the power consumption of the memory cell can be attained.

In the memory cells according to the first A, first B, first C, second A, second B or second C configuration of the present invention, there may be employed an embodiment in which the charge to be stored on or in the first gate can correspond to stored information and the stored information is information corresponding to a level number of the first bit-line potential. In this case, there may be employed an embodiment in which the level number of the first bit-line potential to be applied to the bit line is one and the stored information is binary information, and there may be also employed another embodiment in which the level number of the first bit-line potential to be applied to the bit line is at least two and the stored information is multi-valued information.

Otherwise, there may be employed an embodiment in which the charge to be stored on or in the first gate corresponds to stored information and the stored information is information corresponding to a level number of the second word-line potential. In this case, there may be employed an embodiment in which the level number of the second word-line potential to be applied to the word line is one and the stored information is binary information, and there may be also employed another embodiment in which the level number of the second word-line potential to be applied to the word line is at least two and the stored information is multi-valued information.

Further, there may be employed an embodiment in which the charge to be stored on or in the first gate corresponds to stored information and the stored information is information corresponding to a level number of the voltage between the second word-line potential and the first bit-line potential. In this case, there may be employed an embodiment in which the level number of the voltage between the second word-line potential and the first bit-line potential is one and the stored information is binary information, and there may be also employed another embodiment in which the level number of the voltage between the second word-line potential and the first bit-line potential is at least two and the stored information is multi-valued information.

For example, when the first bit-line potential applied to the bit line has a level number of two, or when the second word-line potential applied to the word line has a level number of two, or further, when the voltage between the second word-line potential and the first bit-line potential has a level number of two, stored information is ternary information. For example, when the first bit-line potential applied to the bit line has a level number of three, or when the second word-line potential applied to the word line has a level number of three, or further, when the voltage between the second word-line potential and the first bit-line potential has a level number of three, stored information is 4-valued information. Generally, when the first bit-line potential applied to the bit line has a level number of M, or when the second word-line potential applied to the word line has a level number of M, or further, when the voltage between the second word-line potential and the first bit-line potential has a level number of M, stored information is (M+1)-valued information.

According to the first aspect of the present invention, the above object is achieved by a process for the manufacture of a memory cell with a stored charge on its gate, the memory cell having;

(A) a channel forming region,
(B) a first gate formed on an insulation layer formed on the surface of the channel forming region, the first gate and the channel forming region facing each other through the insulation layer,
(C) a second gate capacitively coupled with the first gate,
(D) source/drain regions formed in contact with the channel forming region, one source/drain region being spaced from the other,
(E) a non-linear resistance element having at least two ends with one end connected to the first gate, and
(F) an insulation region surrounding the channel forming region and the source/drain regions,
the process comprising the steps of
(a) forming the insulation region in a semiconductor layer,
(b) forming an insulation layer on the semiconductor layer, then, forming the first gate on the insulation layer, and forming an extended region of the first gate extending from the first gate onto the insulation region,
(c) forming the channel forming region and the source/drain regions in the semiconductor layer, and forming at least part of the non-linear resistance element in the first gate or in the extended region of the first gate, and
(d) forming the second gate above the first gate.

In this case, the non-linear resistance element is preferably formed of a diode. The memory cell according to the first A, first B, second A or second B configuration of the present invention can be manufactured by the process according to the first aspect of the present invention.

According to the second aspect of the present invention, the above object is achieved by a process for the manufacture of a memory cell with a stored charge on its gate, the memory cell having (A) a channel forming region,
(B) a first gate formed on an insulation layer formed on the surface of the channel forming region, the first gate and the channel forming region facing each other through the insulation layer,
(C) a second gate capacitively coupled with the first gate,
(D) source/drain regions formed in contact with the channel forming region, one source/drain region being spaced from the other, and
(E) a non-linear resistance element having at least two-ends with one end connected to the first gate and the other end connected to one source/drain region, and the process comprising the steps of
- (a) forming the insulation layer on a semiconductor layer, then, forming the first gate on the insulation layer, and forming an extended region of the first gate extending from the first gate to a region in which said one source/drain region is to be formed, on the insulation layer,
- (b) forming the channel forming region in the semiconductor layer, forming the source/drain regions in the semiconductor layer by ion implantation, and forming at least part of the non-linear resistance element in the semiconductor layer, the first gate or the extended region of the first gate, and
- (c) forming the second gate above the first gate.

The memory cell according to the first C or second C configuration of the present invention can be manufactured by the process according to the second aspect of the present invention.

In the process according to the second aspect of the present invention, the non-linear resistance element is preferably formed of a diode. In this case, there may be employed an embodiment in which the diode is formed of a pn junction diode, one region of the pn junction diode corresponding to said other end of the non-linear resistance element has a common region with said one source/drain region, and, before or after the source/drain regions are formed by ion implantation, the other region of the pn junction diode corresponding to said one end of the non-linear resistance element is formed in said one source/drain region. Otherwise, there may be also employed another embodiment in which the diode is formed of a pn junction diode, one region of the pn junction diode corresponding to said one end of the non-linear resistance element has a common region with the first gate, and, before or after the source/drain regions are formed by ion implantation, the other region of the pn junction diode corresponding to said other end of the non-linear resistance element is formed in the extended region of the first gate by ion implantation.

Alternatively, in the process according to the second aspect of the present invention, there may be employed a structure in which the diode is formed of a hetero-junction diode. The hetero-junction diode may have of a conductive region formed in or on the surface region of said one source/drain region and said one source/drain region.

Alternatively, in the process according to the second aspect of the present invention, the non-linear resistance element may be formed of a field effect transistor. In this case, the field effect transistor as the non-linear resistance element may be formed in a region of the semiconductor layer different from a region where the memory cell is formed, while it is preferably formed on the surface region of said one source/drain region. Further, one source/drain portion of the field effect transistor corresponding to said one end of the non-linear resistance element is preferably connected to the first gate and to a gate portion of the field effect transistor.

In the process according to the first or second aspect of the present invention, the second gate can be capacitively coupled with the first gate through a dielectric film. The dielectric film can be formed of, for example, $SiO_2$, $SiO_2/Si_xN_y$, $SiO_2/Si_xN_y/SiO_2$ or $Ta_2O_5/Si_xN_y$.

In the memory cell of the present invention, a simply structured DRAM gain cell can be obtained by combining a first gate, a second gate and a non-linear resistance element, and it can be produced by a production process which is not much complicated and can be produced in almost the same process as that for the production of a conventional flash memory. In the memory cell according to the first B or first C configuration of the present invention, an increase in the number of external wiring and the area of the terminal portion can be suppressed. Further, no complicatedly structured capacitor is required unlike a conventional DRAM, although an auxiliary capacitor may be required in some cases. Therefore, the memory cell of the present invention is free from a large increase in the cell area and from complicated manufacturing process steps.

BRIEF DESCRIPTION OF THE DRAWINGS

The present invention will be explained in detail with reference to drawings.

DESCRIPTION OF THE PREFERRED EMBODIMENTS

First, the operation of the memory cell of the present invention will be explained below.

[Explanation of the operational principle of the memory cell according to the first A configuration of the present invention (No. 1)]

Figure 1A:
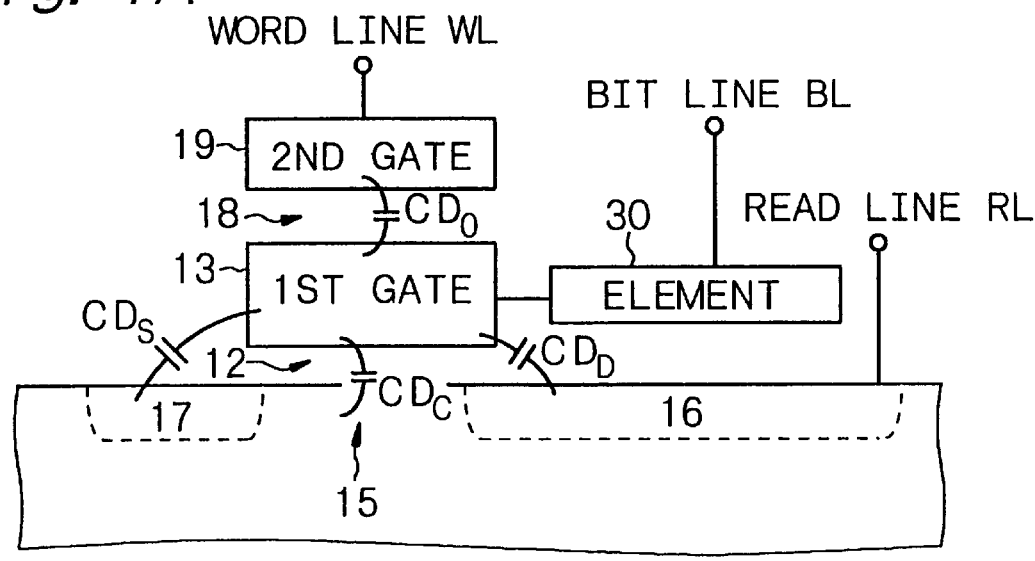
FIGS. 1A, 1B and 1C show a fundamental, principle drawing and equivalent circuits of the memory cell according to the first A configuration of the present invention.
Figure 1B:
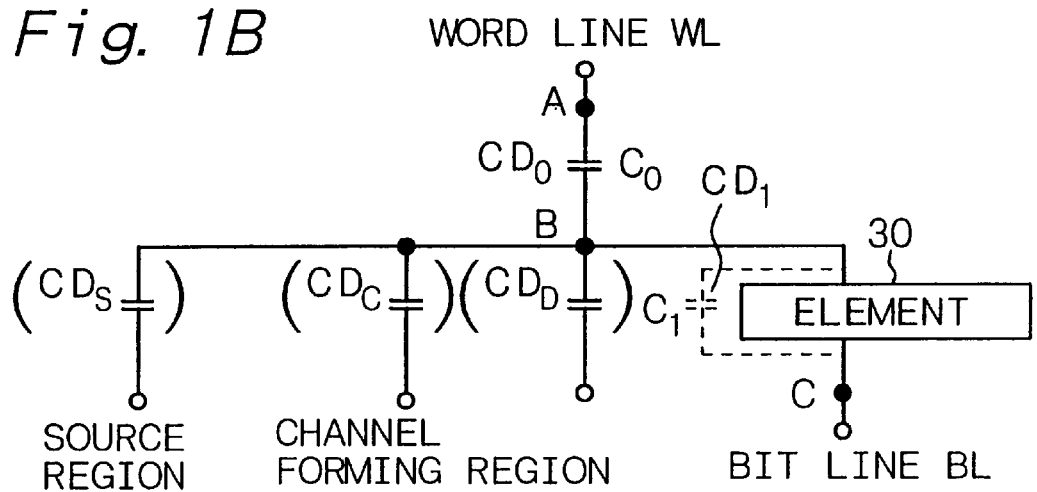
Figure 1C:
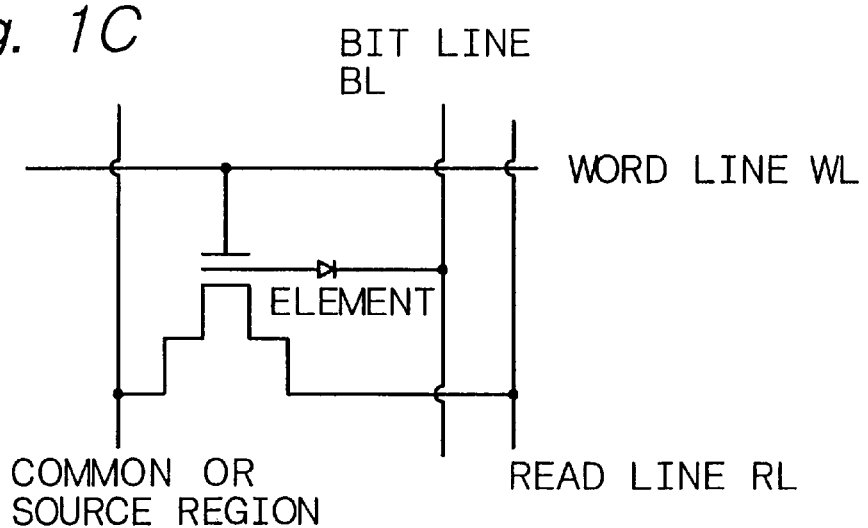

The operational principle of the memory cell according to the first A configuration of the present invention will be explained first below. FIG. 1A shows a fundamental, principle drawing of the memory cell according to the first A configuration of the present invention, and FIGS. 1B and 1C show its equivalent circuits. The following description explains the operational principle of an n-type memory cell as an example, while a p-type memory cell also similarly operates except that changes in a potential, etc., are reversed. In FIGS. 1A, 1B, 1C, 3A, 3B, 3C, 4A, 4B, 5A, 5B, 6A, 6B, 7A, 7B, 37, 38 and 39, the non-linear resistance element is simply referred to as "ELEMENT", and the second non-linear resistance element is simply referred to as "2ND ELEMENT".

The memory cell according to the first A configuration of the present invention comprises a channel forming region 15, an insulation layer 12 formed on the surface of the channel forming region 15, a first gate 13 formed on the insulation layer 12, a second gate 19 capacitively coupled with the first gate 13, source/drain regions 16 and 17 (drain region 16 and source region 17) and a non-linear resistance element 30 having at least two ends. The first gate 13 and the channel forming region 15 face each other through the insulation layer 12. The source/drain regions 16 and 17 are formed in contact with the channel forming region 15, and one source/drain region is spaced from the other. One end of the non-linear resistance element 30 (to be referred as "end A" hereinafter) is connected to the first gate 13, and the other end (to be referred as "end B" hereinafter) is connected to a bit line BL. The second gate 19 is connected to a word line WL, and one source/drain region (the drain region 16) is connected to a read line RL. The second gate 19 is capacitively coupled with the first gate 13 through a dielectric film 18. The first gate 13 is a kind of a floating gate.

In FIGS. 1A and 1B, symbol $C_1$ stands for a capacitance of a parasitic capacitance of the non-linear resistance element 30. Symbol $C_0$ stands for a capacitance of a capacitor $C_0$ composed of the first gate 13, the dielectric film 18 and the second gate 19. Further, symbol $CD_D$ stands for a capacitor composed of one source/drain region 16, the insulation layer 12 and the first gate 13. Symbol $CD_C$ stands for a capacitor composed of the first gate 13, the insulation layer 12 and the channel forming region 15, and symbol $CD_S$ stands for a capacitor composed of the first gate 13, the insulation layer 12 and the other source/drain region 17. The capacitance $C_D$ of the capacitor $CD_D$, the capacitance $C_C$ of the capacitor $CD_C$, the capacitance $C_S$ of the capacitor $CD_S$, the capacitance $C_0$ of the capacitor $CD_0$ and the capacitance $C_1$ of the parasitic capacitor $CD_1$ of the non-linear resistance element 30 diversely change depending upon the structure and size of the memory cell. On the assumption that the capacitance $C_D$ of the capacitor $CD_D$, the capacitance $C_C$ of the capacitor $CD_C$ and the capacitance $C_S$ of the capacitor $CD_S$ are negligibly small, the operational principle of the memory cell will be explained below while only taking into consideration the capacitance $C_0$ of the capacitor $CD_0$ and the capacitance $C_1$ of the parasitic capacitor $CD_1$ of the non-linear resistance element 30.

Figure 2A:
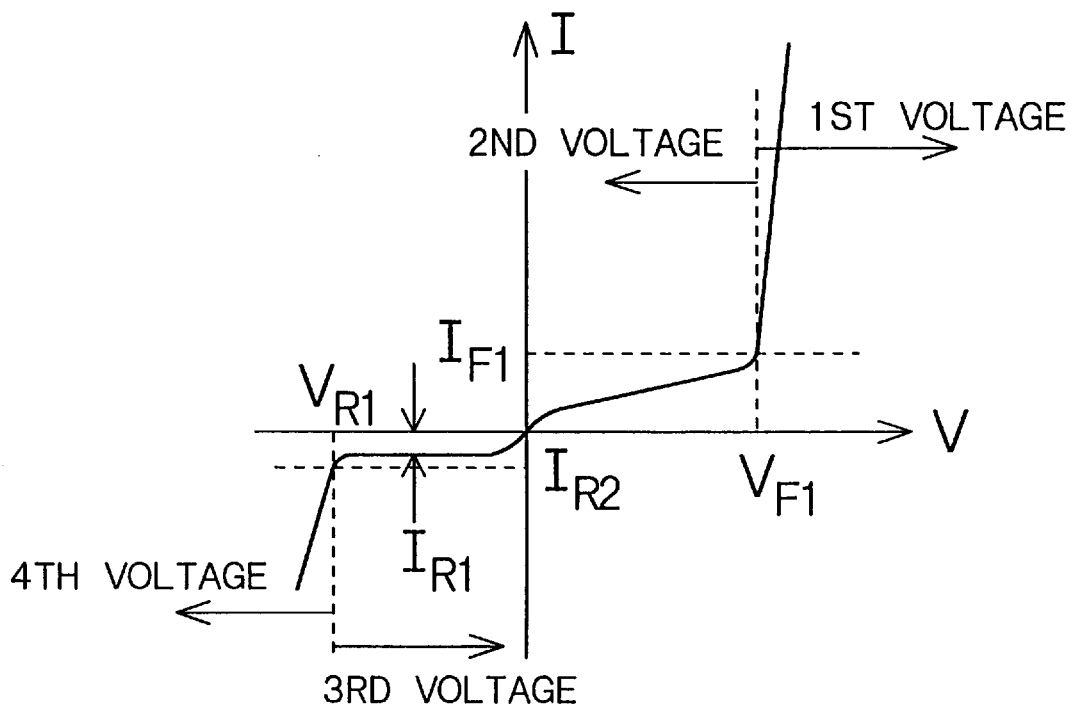
FIGS. 2A and 2B are graphs showing examples of I–V characteristics of a non-linear resistance element and a second non-linear resistance element.

FIG. 2A schematically shows the I–V characteristic of the non-linear resistance element 30. The non-linear resistance element 30 has a forward direction characteristic that it has a forward conduction voltage $V_{F1}$ at a current value of $I_{F1}$. That is, the non-linear resistance element 30 has a two-terminal operation characteristic. Further, the non-linear resistance element 30 has the following characteristics. When a first voltage which has the same polarity as that of the forwarding conductive voltage ($V_{F1}$) and has an absolute value equal to, or greater than, the absolute value of the forward conduction voltage ($V_{F1}$) is applied across the two ends (the end A and the end B), it is brought into a low resistive state, and current which flows through the non-linear resistance element 30 sharply increases. When a second voltage which has the same polarity as that of the forwarding conductive voltage ($V_{F1}$) and has an absolute value smaller than the absolute value of the forward conduction voltage ($V_{F1}$) is applied across the two ends (the end A and the end B), it is brought into a high resistive state. For example, when the non-linear resistance element 30 is formed of a pn junction diode, at a voltage increase of kT/q, a current increases e times. Further, the non-linear resistance element 30 has the following characteristics. When a third voltage which has an opposite polarity to the forward conduction voltage and has an absolute value smaller than an absolute value of a reverse conduction voltage ($V_{R1}$) is applied across the two ends (the end A and the end B), it is brought into a high resistive state, and when a fourth voltage which has an opposite polarity to the forward conduction voltage and has an absolute value equal to, or greater than, the absolute value of the reverse conduction voltage ($V_{R1}$) is applied across the two ends (the end A and the end B), it is brought into a low resistive state. That is, at a voltage up to the reverse conduction voltage ($V_{R1}$), a small reverse current $I_{R1}$ flows through the non-linear resistance element 30, and at a reverse-direction voltage equal to, or lower than, the reverse conduction voltage $V_{R1}$, a reverse current equal to, or lower than, $I_{R2}$ increases and a current which flows through the non-linear resistance element 30 sharply increases.

In the memory cell according to the first A configuration of the present invention, the charge stored on or in the first gate 13 corresponds to stored information. Initial conditions of the memory cell are assumed, for example, to be as shown in the following Table 1. In Table 1, γ is a proportional constant determined on the basis of the capacitance ratio.

TABLE 1

| | |
|---|---|
| Potential of second gate (first word-line potential): | $V_{WL1}$ |
| Potential of first gate: | $\gamma V_{WL1}$ |
| Potential of bit line: | $V_{BL0}$ |
| Potential of read line (first bit-line potential): | $V_{RL1}$ |
| Potential of source region: | $V_S$ |

Specifically, the values of $V_{WL1}$, $\gamma V_{WL1}$, $V_{BL0}$, $V_{RL1}$ and $V_S$ can be set at values close to 0 volt.

[writing of information]

When information is written in the memory cell, that is, when a negative charge $Q_F$ of a first polarity is stored on or in the first gate 13, a first bit-line potential $V_{BL1}$ is applied to the bit line BL, the first read-line potential $V_{RL1}$ is kept on as a potential of the read line, and then a word-line potential is switched from the first word-line potential $V_{WL1}$ to a second word-line potential $V_{WL2}$ (>>$V_{F1}$). The first bit-line potential $V_{BL1}$ may equal $V_{BL0}$. That is, the potential applied to the bit line BL may not be changed. When potentials in sites A, B and C in FIG. 1B are $V_A$, $V_B$ and $V_C$ in this case, $V_A$, $V_B$ and $V_C$ are as follows. In addition, in the writing procedure, first, the bit-line potential is switched from $V_{BLD}$ (e.g., 0) to the first-bit line potential $V_{BL1}$ or a second bit-line potential $V_{BL2}$ to be described later, then, the word-line potential is switched from the first word-line potential $V_{WL1}$ to the second word-line potential $V_{WL2}$, then, the word-line potential is switched back from the second word-line potential $V_{WL2}$ to the first word-line potential $V_{WL1}$, and then the bit-line potential is switched back from the first bit-line potential $V_{BL1}$ or the second bit-line potential $V_{BL2}$ to $V_{BL0}$.

$$V_A = V_{WL2} \tag{1-1}$$

$$V_B = \{C_0/(C_1+C_0)\}(V_{WL2}-V_{BL1})+V_{BL1} \tag{1-2}$$

$$V_C = V_{BL1} \tag{1-3}$$

The expression (1–2) shows a calculation on the assumption that the non-linear resistance element 30 is in a high resistive state. When the value of ($V_B-V_{BL1}$) becomes greater than $V_{F1}$, the non-linear resistance element 30 is brought into a low resistive state. In other words, the non-linear resistance element 30 is brought into a low resistive state by selecting $V_{WL2}$ and $V_{BL1}$ such that the following expression (2) is satisfied, i.e., generating the first voltage between the first gate 13 and the end B of the non-linear resistance element 30. As a result, the first gate 13 is brought from a nearly floating state where it is connected to the bit line BL at an initial high resistance to a state where it is connected to the bit line BL at a low resistance.

$$|\{C_0/(C_1+C_0)\}(V_{WL2}-V_{BL1})| > |V_{F1}| \tag{2}$$

As a result, the potential difference $V_{AB}$ between the sites A and B when seen from the site B (i.e., from the first gate 13 ) is as shown in the following expression (3).

$$V_{AB} \approx V_{WL2} - V_{F1} - V_{BL1} \tag{3}$$

Then, the potential of the second gate 19 is switched from the second word-line potential $V_{WL2}$ to the first word-line potential $V_{WL1}$ and then the potential of the bit line BL is switched to $V_{BL0}$. As a result, the non-linear resistance element 30 is brought into a high resistive state. And, the first gate 13 is again brought into a nearly floating state, and the negative charge $Q_F$ of a first polarity is freshly stored on or in the first gate 13. If the above negative charge $Q_F$ is converted to a potential of the first gate 13 to obtain a value of $V_{INF}$ (<0), when $|V_{INF}|$ exceeds $|V_{R1}|-|V_{BL1}|$, the potential difference between the first gate 13 and the bit line BL is clamped to $V_{R1}$. The above negative charge $Q_F$ stored on or in the first gate 13 corresponds to information stored in the memory cell.

As shown in the above expression (3), the potential difference VAB between the sites A and B depends upon a voltage between the second word-line potential $V_{WL2}$ and the first bit-line potential $V_{BL1}$. When the capacitance of each of the capacitors $CD_S$, $CD_C$ and $CD_D$ is not negligible, the potential difference $V_{AB}$ between the sites A and B depends upon the potential of each of the source region 16, the channel forming region 15 and the drain region 17, which is not further discussed for simplification of an explanation. For example, (A-1) if the voltage between the second word-line potential $V_{WL2}$ and the first bit-line potential $V_{BL1}$ has a level number of one, (B-1) if the first bit-line potential $V_{BL1}$ has a level number one when the second word-line potential $V_{WL2}$ is constant, or (C-1) if the second word-line potential $V_{WL2}$ has a level number of one when the first bit-line potential $V_{BL1}$ is constant, the charge corresponding to information stored on or in the first gate 13 is binary information ("0" or "1"). Otherwise, the charge stored on or in the first gate 13 depends upon a voltage between the second word-line potential $V_{WL2}$ and the first bit-line potential $V_{BL1}$. Therefore, (A-2) by designing the voltage between the second word-line potential $V_{WL2}$ and the first bit-line potential $V_{BL1}$ to have a level number of two or more, (B-2) by designing the first bit-line potential $V_{BL1}$ to have a level number of two or more (e.g., $V_{BL1}$, $V_{BL1}{}^{-1}$, $V_{BL1}{}^{-2}$, ..., $V_{BL2}$, in which $V_{BL1}$ is a minimum value and $V_{BL2}$ is a maximum value) when the second word-line potential $V_{WL2}$ is constant or (C-2) by designing the second word-line potential $V_{WL2}$ to have a level number of two or more when the first bit-line potential $V_{BL1}$ is constant, the charge stored on or in the first gate 13 can be a negative charge, $Q_F$, $Q_{F-1}$, $Q_{F-2}$, .... That is, information stored on or in the first gate 13 can be (A-3) multi-valued information corresponding to the level number of the voltage between the second word-line potential $V_{WL2}$ and the first bit-line potential $V_{BL1}$, (B-3) multi-valued information corresponding to the level number of the first bit-line potential applied to the bit line or (C-3) multi-valued information corresponding to the level number of the second word-line potential applied to the word line. As a result, values obtained by converting the above negative charges $Q_F$, $Q_{F-1}$, $Q_{F-2}$, ... to potentials of the first gate 13 are $V_{INF}$, $V_{INF-1}$, $V_{INF-2}$, ....

On the other hand, when it is not necessary to write information in the memory cell while writing information in other memory cells, first, a second bit-line potential $V_{BL2}$ is applied to the bit line BL, and then the word-line potential is switched from the first word-line potential $V_{WL1}$ to the second word-line potential $V_{WL2}$ ($>>V_{F1}$). When potentials in sites A, B and C in FIG. 1B are $V_A$, $V_B$ and $V_C$ in this case, $V_A$, $V_B$ and $V_C$ are as follows.

$$V_A = V_{WL2} \tag{4-1}$$

$$V_B = \{C_0/(C_1+C_0)\}(V_{WL2}-V_{BL2}) + V_{BL2} \tag{4-2}$$

$$V_C = V_{BL2} \tag{4-3}$$

When the value of $(V_B - V_C)$ [$=\{C_0/(C_1+C_0)\}(V_{WL2}-V_{BL2})$] is less than $V_{F1}$, the non-linear resistance element 30 is kept in a high resistive state. In other words, when the second voltage or a voltage having an opposite polarity to the forward conduction voltage ($V_{F1}$) (and having an absolute value smaller than the absolute value of the reverse conduction voltage $V_{R1}$) is generated between the first gate 13 and the end B of the non-linear resistance element 30, i.e., when $V_{BL2}$ is selected so as to satisfy the following expression (5), the non-linear resistance element 30 is kept in a high resistive state.

$$\{C_0/(C_1+C_0)\}(V_{WL2}-V_{BL2}) < V_{F1} \tag{5}$$

As a result, the first gate 13 is kept nearly in a floating state, and if the potential difference between two ends of the parasitic capacitor $CD_1$ of the non-linear resistance element 30 and the potential difference between two ends of the capacitor $CD_0$ are $V_1$ and $V_2$, $V_1$ and $V_2$ are as follows.

$$V_1 = \{C_0/(C_1+C_0)\}(V_{WL2}-V_{BL2}) \tag{6-1}$$

$$V_2 = \{C_1/(C_1+C_0)\}(V_{WL2}-V_{BL2}) \tag{6-2}$$

Then, the potential of the second gate 19 is switched from the second word-line potential $V_{WL2}$ to the first word-line potential $V_{WL1}$, and then the potential of the bit line BL is switched to $V_{BL0}$. As a result, a charge temporarily induced on each of the capacitor $CD_0$ and the non-linear resistance element 30 is discharged, and non charge is stored on or in the first gate 13. In other words, charging and discharging which occurs through the non-linear resistance element 30 are negligibly small, and therefore, the first gate 13 is brought back to an initial state. That is, no information is substantially written in the memory cell.

For reliably preventing the flow of current between the source/drain regions 16 and 17 of the memory cell when information is written, the other source/drain region (the source region 17) is preferably reversely biased with regard to the channel forming region 15. Specifically, a potential greater than a value obtained by deducting a gate threshold voltage (seen from the first gate 13) from the potential of the first gate 13 can be applied to the other source/drain region (the source region 17). Otherwise, the other source/drain region (the source region 17) is preferably made floating with regard to the channel forming region 15. Specifically, for example, a transistor for selection connected to the other source/drain region (the source region 17) can be turned off.

In a standby state, the potential of the word line WL is kept at a potential at which the memory cell is not brought into an on-state (state in which a current flows between the source/drain regions 16 and 17). Specifically, the word line WL is kept at a potential equal to, or lower than, $V_{th-L}$ to be described later. On the other hand, there is another case where other memory cell connected to the bit line BL is under operation. When the bit line BL has a potential of $V_{BL2}$ and when a potential equivalent to the charge stored on or in the first gate 13 of the memory cell is $V_{INF}$, it is required to be secured that the current flowing through the non-linear resistance element 30 of the memory is $I_{R1}$. Therefore, the potential of the word line WL in a standby state is required not to be lower than $V_{BL2} + \{(C_1+C_0)/C_0\} \times (|V_{INF}| - |V_{R1}|)$. $V_{INF}$ is a potential when the word line WL has a potential of 0 Volt.

[Readout of information]

For a period of time shorter than $Q_F/I_{R1}$, information stored on or in the first gate 13 can be read out. For example, when $C_0 = 1 \times 10^{-15}$ F and $I_{R1} = 1 \times 10^{-15}$ amperes, information can be read out for about 1 second.

The gate threshold voltage in the memory cell changes depending upon whether or not a charge is stored on or in the first gate 13. That is, when information is stored in the memory cell, in other words, when the negative charge $Q_F$ is stored on or in the first gate 13, the gate threshold voltage of the memory cell shifts toward a plus side. The above gate threshold voltage is taken as $V_{th-H}$. On the other hand, when no information is stored in the memory cell, or in other words, when no charge is stored on or in the first gate 13 (positive charge may be stored in some cases), the gate threshold voltage of the memory cell has no change (or may be shifted toward a minus side in some cases). The above gate threshold voltage is taken as $V_{th-L}$. When information stored in the memory cell is read out, the potentials of the word line, the bit line and the read line are set, for example, as shown in Table 2.

TABLE 2

| Potential of second gate (word-line potential): | $V_{WL-R}$ |
| Potential of bit line: | $V_{BL-R}$ |
| Potential of read line (second read-line potential): | $V_{RL-R}$ |
| Potential of source region: | $V_S$ |

However, the potential of the second gate (word-line potential), $V_{WL-R}$, is to satisfy $V_{th^-L}<V_{WL-R}<V_{th^-H}$. The second read-line potential which is a potential of the read line RL is to have a value from 0.5 Volt to a power source potential $V_{dd}$. Further, the potential, $V_{BL-R}$, of the bit line can be a value which satisfies $V_{BL0}<V_{BL-R}<V_{BL2}$.

As a result, the non-linear resistance element 30 is kept in a high resistive state. Further, when information is stored in the memory cell, the memory cell is kept in an off-state. On the other hand, when no memory is stored in the memory cell, the memory cell is in an on-state. Therefore, it can be determined whether or not information is stored in the memory cell by detecting whether or not a current flows through the source/drain regions 16 and 17 of the memory cell.

When multi-valued information is stored on or in the first gate 13, i.e., one of negative charge $Q_F$, $Q_{F1}$, $Q_{F2}$, . . . is stored on or in the first gate 13, the gate threshold voltage of the memory cell shifts toward a plus side. For the convenience of an explanation, $|Q_F|>|Q_{F1}|>|Q_{F2}|$. . . , and the gate threshold voltage is assumed to be $V_{th^-H}$, $V_{th^-1}$, $V_{th^-2}$. When information stored in the memory cell is read out, first, a potential between $V_{th^-(N-1)}$ and $V_{th^-N}$ is applied to the word line WL. When N=1, a potential between $V_{th^-H}$ and $V_{th^-L}$ is applied to the word line. The above "N" is an N-th level and stands for the highest level. As a result, when information having the N-th level is stored in the memory cell, the memory cell is kept in an off-state. On the other hand, when no information is stored in the memory cell, or when information having a level equal to, or below, the (N−1)-th level is stored in the memory cell, the memory cell is in an on-state. It can be therefore determined whether or not information having an N-th level is stored in the memory cell by detecting whether or not a current flows through the source/drain regions 16 and 17 of the memory cell.

[Erasing of information]

When information is erased in the memory cell in which the information is stored, i.e., in which the negative charge $Q_F$ is stored on or in the first gate 13, a negative potential $V_{WL3}$ which is a third word-line potential is applied to the word line WL (in an n-type memory cell), and a third bit-line potential $V_{BL3}$ is applied to the bit line BL. If the reverse conduction voltage $V_{R1}$ of the non-linear resistance element 30 satisfies the following expression (7-1) in this case, i.e., if the third word-line potential $V_{WL3}$ is applied to the word line WL and a third bit-line potential $V_{BL3}$ is applied to the bit line BL to generate the above fourth voltage between the first gate 13 and the end B of the non-linear resistance element 30 through the capacitive coupling between the first gate 13 and the second gate 19, the non-linear resistance element 30 is brought into a low resistive state. As a result, a charge of a second polarity opposite to a first polarity is transported to the first gate 13 from the bit line BL through the non-linear resistance element 30, or the charge of a first polarity is discharged to the bit line BL from the first gate 13 through the non-linear resistance element 30. Owing to the above, the first gate 13 is brought into a zero or positively charged state (second charge-stored state), i.e., the first gate changes in the charge-stored state, and information is erased. When information is not erased in the memory cell, the potential of $V_{BL1}$ is applied to the bit line BL. If the reverse conduction voltage $B_{R1}$ of the non-linear resistance element 30 satisfies the following expression (7-2) in this case, i.e., if the third word-line potential $V_{WL3}$ is applied to the word line WL and the first bit-line potential $V_{BL1}$ is applied to the bit line BL, thereby to generate the above third voltage between the first gate 13 and the end B of the non-linear resistance element 30 through the capacitive coupling between the first gate 13 and the second gate 19, the non-linear resistance element 30 is kept in a high resistive state. As a result, no charge is transported to the first gate 13, and the first gate 13 keeps on the negative charge $Q_F$.

$$|V_{R1}|<|\{(C_0)/(C_1+C_0)\}(V_{WL3}-V_{BL3})| \qquad (7\text{-}1)$$

$$|V_{R1}|>|\{(C_0)/(C_1+C_0)\}(V_{WL3}-V_{BL1})| \qquad (7\text{-}2)$$

[Explanation of operational principle of the memory cell according to the first B or first C configuration of the present invention (No. 1)]

Figure 3A:
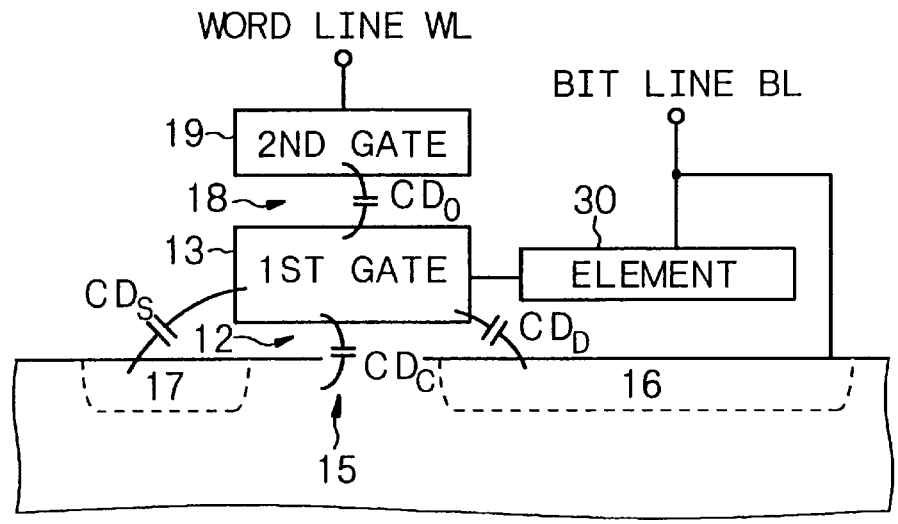
FIGS. 3A, 3B and 3C show a fundamental, principle drawing and equivalent circuits of the memory cell according to the first B configuration of the present invention.
Figure 3B:
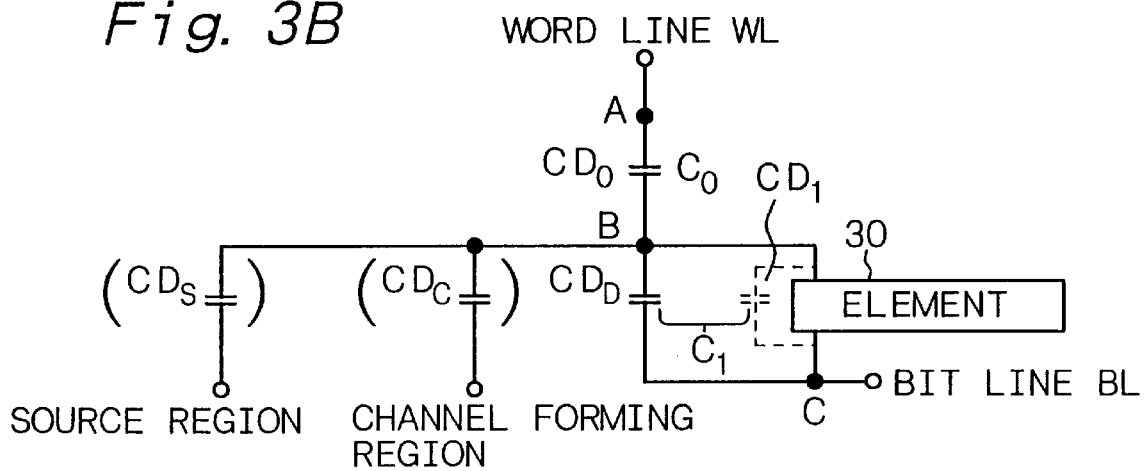
Figure 3C:
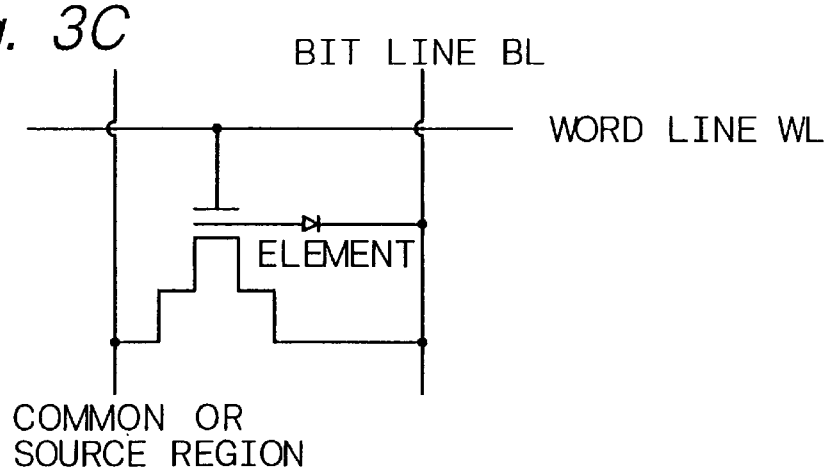
Figure 4A:
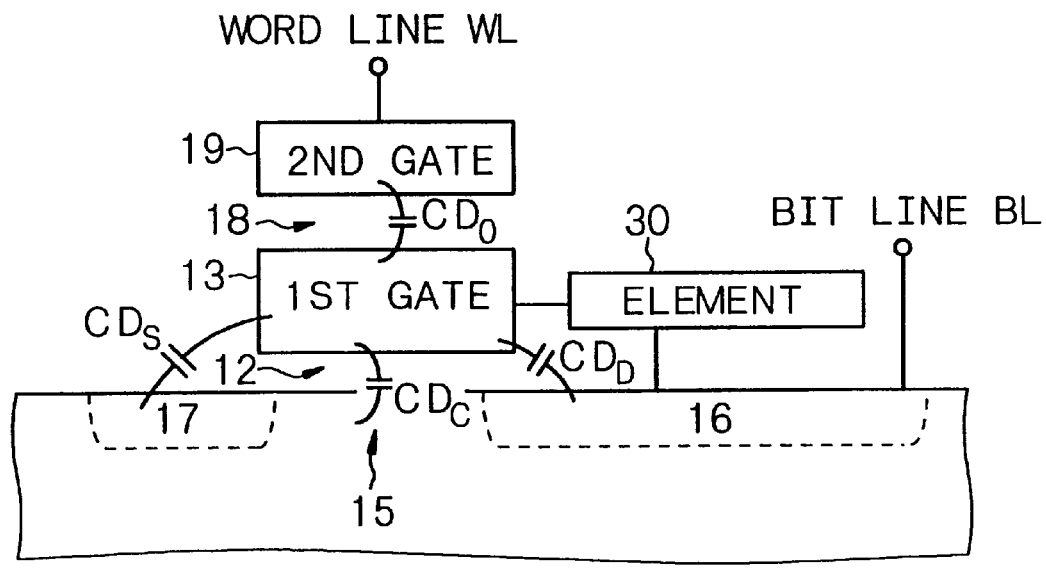
FIGS. 4A and 4B show a fundamental, principle drawing and an equivalent circuit of the memory cell according to the first C configuration of the present invention.
Figure 4B:
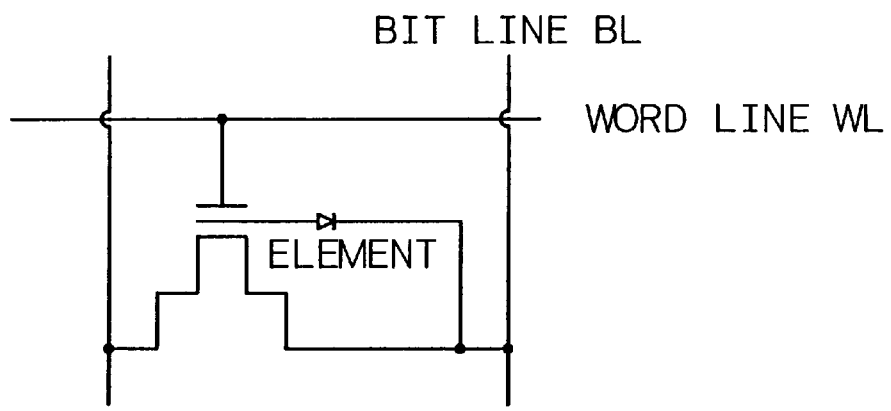

The operational principle of the memory cell according to the first B or first C configuration of the present invention will be explained hereinafter. FIG. 3A shows a fundamental, principle drawing of the memory cell according to the first B configuration of the present invention, and FIGS. 3B and 3C show equivalent circuits. FIG. 4A shows a fundamental, principle drawing of the memory cell according to the first C configuration of the present invention, and FIG. 4B shows an equivalent circuit. The following explanation refers to an n-type memory cell as an example, while a p-type memory cell operates similarly except that potentials, etc., are reversed.

The memory cell according to the first B or first C configuration of the present invention differs from the memory cell according to the first A configuration of the present invention in the connection of the end B of the non-linear resistance element 30 or one source/drain region 16. The memory cell according to the first B or first c configuration of the present invention is the same as the memory cell according to the first A configuration of the present invention in other constitution. That is, in the memory cell according to the first B configuration of the present invention, the end B of the non-linear resistance element 30 and one source/drain region 16 are connected to the bit line BL. In the memory cell according to the first C configuration of the present invention, the end B of the non-linear resistance element 30 is connected to one source/drain region 16, and said one source/drain region 16 is connected to the bit line BL.

In the equivalent circuit of the memory cell according to the first B or first C configuration of the present invention, shown in FIG. 3B, $C_1$ stands for a parallel composite capacitance of the capacitor $CD_D$ composed of one source/drain region 16, the insulation layer 12 and the first gate 13 and a parasitic capacitor of the non-linear resistance element 30, unlike in the equivalent circuit of the memory cell according to the first A configuration of the present invention. The composite capacitance $C_1$ is generally greater than the capacitance of each of the capacitors $CD_C$ and $CD_S$ in many cases, and the capacitance $C_C$ of the capacitor $CD_C$ and the capacitance $C_S$ of the capacitor $CD_S$ will be omitted in an explanation to follow. The I–V characteristic of the non-linear resistance element 30 can be considered the same as that shown in FIG. 2A.

In the memory cell according to the first B or first C configuration of the present invention, a charge stored on or in the first gate 13 corresponds to stored information as well.

Initial conditions of the memory cell can be set, for example, as shown in the following Table 3. Specifically, the values of $V_{WL1}$, $\gamma V_{WL1}$, $V_{BL0}$ and $V_S$ can be set at values close to 0 volt.

TABLE 3

| Potential of second gate (first word-line potential): | $V_{WL1}$ |
|---|---|
| Potential of first gate: | $\gamma V_{WL1}$ |
| Potential of bit line: | $V_{BL0}$ |
| Potential of source region: | $V_S$ |

[Writing of information]

The operational principle of writing information in the memory cell is as explained with regard to the memory cell according to the first A configuration of the present invention, and detailed explanations thereof are therefore omitted.

[Readout of information]

The gate threshold voltage in the memory cell differs depending upon whether or not a charge is stored on or in the first gate 13. The gate threshold voltage when information is stored in the memory cell is set at $V_{th-H}$. On the other hand, the gate threshold voltage when no information is stored in the memory cell is set at $V_{th-L}$. When information stored in the memory cell is read out, the potentials of the word line and the bit line are set, for example, as shown in Table 4.

TABLE 4

| Potential of second gate (word-line potential): | $V_{WL-R}$ |
|---|---|
| Potential of bit line: | $V_{BL-R}$ |
| Potential of source region: | $V_S$ |

However, the potential $V_{WL-R}$ of the second gate (word-line potential) is set so as to satisfy $V_{th-L} < V_{WL-R} < V_{th-H}$. Further, the potential $V_{BL-R}$ of the bit line can be set so as to satisfy $V_{BL0} < V_{BL-R} < V_{BL2}$.

As a result, the non-linear resistance element 30 is kept in a high resistive state. When information is stored in the memory cell, the memory cell is kept on in an off-state. On the other hand, when no information is stored in the memory cell, the memory cell is in an on-state. It can be therefore determined whether or not information is stored in the memory cell by detecting whether or not a current flows through the source/drain regions 16 and 17 of the memory cell.

[Erasing of information]

The operational principle in erasing information stored in the memory cell is as explained with regard to the memory cell according to the first A configuration of the present invention, and detailed explanations thereof are therefore omitted.

Further, the operational principle when the information stored on or in the first gate is multi-valued information can be also, in principle, as explained with regard to the memory cell according to the first A configuration of the present invention, and detailed explanations thereof are omitted.

[Explanation of operational principle of the memory cell according to the first A, the first B or first C configuration of the present invention (No. 2)]

In the memory cell according to the first A configuration of the present invention, the capacitance $C_D$ of the capacitor $CD_D$, the capacitance $C_C$ of the capacitor $CD_C$, the capacitance $C_S$ of the capacitor $CD_S$ and the capacitance $C_1$ of the parasitic capacitor $CD_1$ of the non-linear resistance element 30 are negligibly small in some cases depending upon the structure and the size of the memory cell. The operational principle of the memory cell will be explained by taking into consideration the capacitance $C_0$ of the capacitor $CD_0$ alone hereinafter. In this case, the proportional constant $\gamma$ determined on the basis of the capacitance ratio is close to 1. The I–V characteristic of the non-linear resistance element 30 can be the same as that shown in FIG. 2A. Further, the operational principles of the memory cells according to the first B and first C configurations of the present invention are, in principle, the same as that of the memory cell according to the first A configuration of the present invention, and explanations of the operational principles of the memory cells according to the first B and first C configurations of the present invention are therefore omitted.

Initial conditions of the memory cell can be, for example, as shown in the above Table 1.

[Writing of information]

The procedure of writing information in the memory cell can be the same as that explained in [Explanation of operational principle of memory cell according to the first A configuration of the present invention (No. 1)]. Potentials $V_A$, $V_B$ and $V_C$ in sites A, B and C in FIG. 1B are as follows.

$$V_A = V_{WL2} \tag{8-1}$$

$$V_B = \gamma V_{WL2} \tag{8-2}$$

$$V_C = V_{BL1} \tag{8-3}$$

If the value of $(V_B - V_{BL1})$ is greater than $V_{F1}$, the non-linear resistance element 30 is brought into a low resistive state. In other words, If $V_{WL2}$ and $V_{BL1}$ are selected so as to satisfy the following expression (9), i.e., if the first voltage is generated between the first gate 13 and the end B of the non-linear resistance element 30, the non-linear resistance element 30 is brought into a low resistive state. As a result, the first gate 13 is brought from a nearly floating state where it is connected to the bit line BL in an initial high resistive state, to a state where it is connected to the bit line BL at a low resistance.

$$|\gamma V_{WL2} - V_{BL1}| > |V_{F1}| \tag{9}$$

As a consequence, the potential difference $V_{AB}$ between the sites A and B, seen from the site B (i.e., seen from the first gate 13) is as shown in the following expression (10).

$$V_{AB} \approx V_{WL2} - V_{F1} - V_{BL1} \tag{10}$$

Then, the potential of the second gate 19 is switched from the second word-line potential $V_{WL2}$ to the first word-line potential $V_{WL1}$ and then the potential of the bit line BL is switched to $V_{BL0}$. As a result, the non-linear resistance element 30 is brought into a high resistive state. And, the first gate 13 is again brought into a nearly floating state, and a negative charge $Q_F$ of a first polarity is freshly stored on or in the first gate 13. If the above negative charge $Q_F$ is converted to a potential of the first gate 13 to obtain a value of $V_{INF}$ (<0), when $|V_{INF}|$ exceeds $|V_{R1}| - |V_{BL1}|$, the potential difference between the first gate 13 and the bit line BL is clamped to $V_{R1}$. The above negative charge $Q_F$ stored on or in the first gate 13 corresponds to information stored in the memory cell.

On the other hand, when it is not necessary to write information on the memory cell while writing information in other memory cells, first, a second bit-line potential $V_{BL2}$ is applied to the bit line BL, and then the word-line potential is switched from the first word-line potential $V_{WL1}$ to the second word-line potential $V_{WL2}$ (>>$V_{F1}$). When potentials in the sites A, B and C in FIG. 1B are $V_A$, $V_B$ and $V_C$ in this case, $V_A$, $V_B$ and $V_C$ are as follows.

$$V_A = V_{WL2} \quad (11\text{-}1)$$

$$V_B = \gamma V_{WL2} \quad (11\text{-}2)$$

$$V_C = V_{BL2} \quad (11\text{-}3)$$

If the value of $(V_B-V_C)$ [=$\gamma V_{WL2}-V_{BL2}$] is less than $V_{F1}$, the non-linear resistance element 30 is kept in a high resistive state. In other words, when the second voltage or a voltage having an opposite polarity to the forward conduction voltage ($V_{F1}$) (and having an absolute value smaller than the absolute value of the reverse conduction voltage $V_{R1}$) is generated between the first gate 13 and the end B of the non-linear resistance element 30, i.e., when $V_{BL2}$ is selected so as to satisfy the following expression (12), the non-linear resistance element 30 is kept in a high resistive state. As a result, the first gate 13 is approximately kept in a floating state.

$$\gamma V_{WL2}-V_{BL2} < V_{F1} \quad (12)$$

Then, the potential of the second gate 19 is switched from the second word-line potential $V_{WL2}$ to the first word-line potential $V_{WL1}$, and then the potential of the bit line is switched to $V_{BL0}$. As a result, a charge temporarily induced on the capacitor $CD_0$ is discharged, and no charge is stored on or in the first gate 13. In other words, charging and discharging through the non-linear resistance element 30 are negligibly small, and therefore, the first gate 13 is brought back to an initial state. That is, substantially, no information is written in the memory cell.

For reliably preventing the flowing of current between the source/drain regions 16 and 17 of the memory cell when information is written, the other source/drain region (the source region 17) is preferably reverse biased with regard to the channel forming region 15, or the other source/drain region (the source region 17) is preferably made floating with regard to the channel forming region 15. Specifically, the same procedures as those explained in [Explanation of the operational principle of memory cell according to the first A configuration of the present invention (No. 1)] can be carried out.

In a standby state, the potential of the word line WL is kept at a potential at which the memory cell is not brought into an on-state (state in which a current flows between the source/drain regions 16 and 17). Specifically, the word line WL is kept at a potential equal to, or lower than, $V_{th-L}$ to be described later. On the other hand, there can be another state where other memory cell connected to the bit line BL is operating. It is therefore required to be secured that the current flowing through the non-linear resistance element 30 of the memory cell is $I_{R1}$ even when the bit line BL has a potential of $V_{BL2}$ and the first gate 13 of the memory cell has a potential of $V_{INF}$. Therefore, the potential of the word line WL in a standby state is required not to be lower than $V_{BL2}+(|V_{INF}|-|V_{R1}|)$.

[Readout of information]

The operational principle of readout of information can be the same as that explained in [Explanation of operational principle of memory cell according to the first A configuration of the present invention (No. 1)], and detailed explanations thereof are therefore omitted.

[Erasing of information]

When information is erased in the memory cell in which the information is stored, i.e., in which the negative charge $Q_F$ is stored on or in the first gate 13, a negative potential $V_{WL3}$ which is a third word-line potential is applied to the word line WL (in an n-type memory cell), and a third bit-line potential $V_{BL3}$ is applied to the bit line BL. If the reverse conduction voltage $V_{R1}$ of the non-linear resistance element 30 satisfies the following expression (13-1) in this case, i.e., if the third word-line potential $V_{WL3}$ is applied to the word line WL and the third bit-line potential $V_{BL3}$ is applied to the bit line BL to generate the above fourth voltage between the first gate 13 and the end B of the non-linear resistance element 30 through the capacitive coupling between the first gate 13 and the second gate 19, the non-linear resistance element 30 is brought into a low resistive state. As a result, a charge of a second polarity opposite to a first polarity, i.e., a positive charge, is transported to the first gate 13 from the bit line BL through the non-linear resistance element 30, or the charge of a first polarity is discharged to the bit line BL from the first gate 13 through the non-linear resistance element 30. In this manner, the first gate 13 is brought into a zero or positively charged state (second charge-stored state), the first gate changes in the charge-stored state, and information is erased. When information is not erased in the memory cell, the potential of $V_{BL1}$ is applied to the bit line BL. If the reverse conduction voltage $B_{R1}$ of the non-linear resistance element 30 satisfies the following expression (13-2) in this case, i.e., if the third word-line potential $V_{WL3}$ is applied to the word line WL and the first bit-line potential $V_{BL1}$ is applied to the bit line BL to generate the above third voltage between the first gate 13 and the end B of the non-linear resistance element 30 through the capacitive coupling between the first gate 13 and the second gate 19, the non-linear resistance element 30 is kept in a high resistive state. As a result, no charge is transported to the first gate 13, and the first gate 13 keeps the negative charge $Q_F$.

$$|V_{R1}| < |V_{WL3}-V_{BL3}| \quad (13\text{-}1)$$

$$|V_{R1}| > |V_{WL3}-V_{BL1}| \quad (13\text{-}2)$$

The operational principle and the readout principle when information stored on or in the first gate 13 is multi-valued information are the same as those explained already, and detailed explanations thereof are therefore omitted.

[Explanation of operational principle of memory cell according to the second A configuration of the present invention (No. 1)]

Figure 5A:
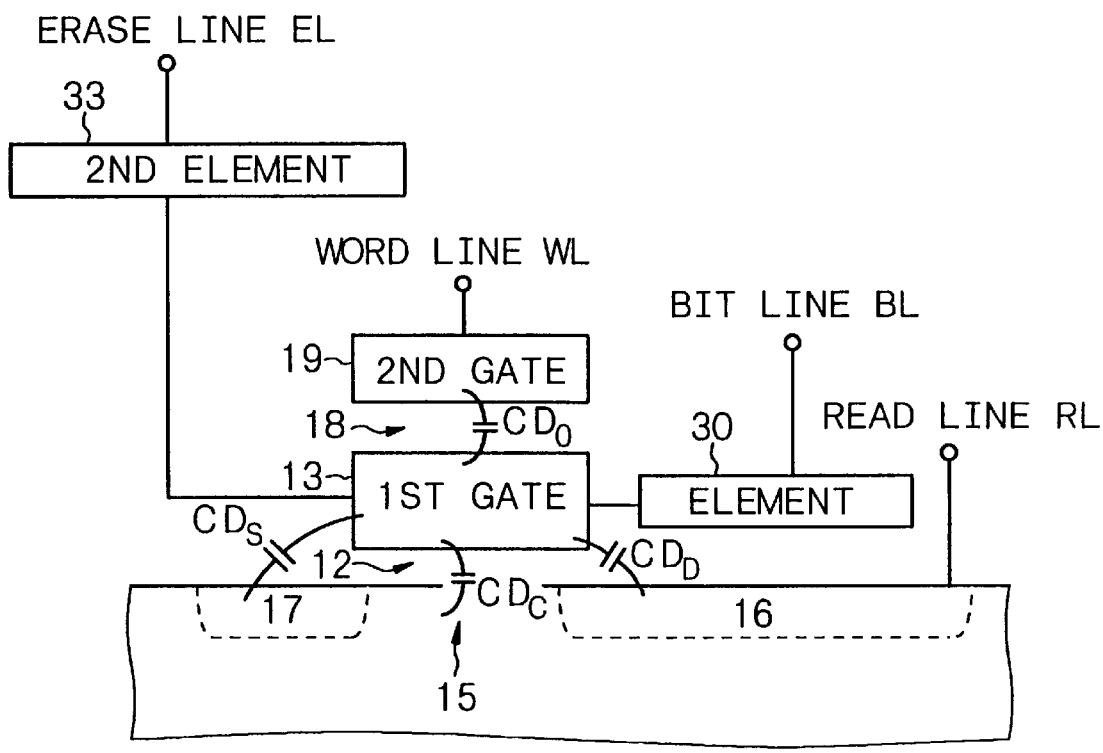
FIGS. 5A and 5B show a fundamental, principle drawing and an equivalent circuit of the memory cell according to the second A configuration of the present invention.

The operational principle of the memory cell according to the second A configuration of the present invention will be explained hereinafter. FIG. 5A shows a fundamental, principle drawing of the memory cell according to the second A configuration of the present invention. The following explanation refers to an n-type memory cell as an example, while a p-type memory cell operates similarly except that potentials, etc., reversely change.

The memory cell according to the second A configuration of the present invention has the same constitution as that of the memory cell according to the first A configuration of the present invention except that it has a second non-linear resistance element 33 and that the second non-linear resistance element 33 has one end (to be referred as "end A" hereinafter) connected to the first gate 13 and the other end (to be referred as "end B" hereinafter) connected to the erase line EL. In the following explanation, it is assumed that the capacitance of a capacitor $CD_D$ composed of one source/ drain region 16, an insulation layer 12 and a first gate 13, the capacitance of a capacitor $CD_C$ composed of the first gate 13, the insulation layer 12 and a channel forming region 15, the capacitance of a capacitor $CD_S$ composed of the first gate 13, the insulation layer 12 and the other source/drain region 17 and the capacitance of a parasitic capacitor of the second non-linear resistance element 33 are negligibly small. The operational principle of the memory cell will be explained by taking into consideration the capacitance $C_0$ of a capacitor $CD_0$ and the capacitance $C_1$ of a parasitic capacitor $CD_1$ of the non-linear resistance element 30 alone.

Figure 2B:
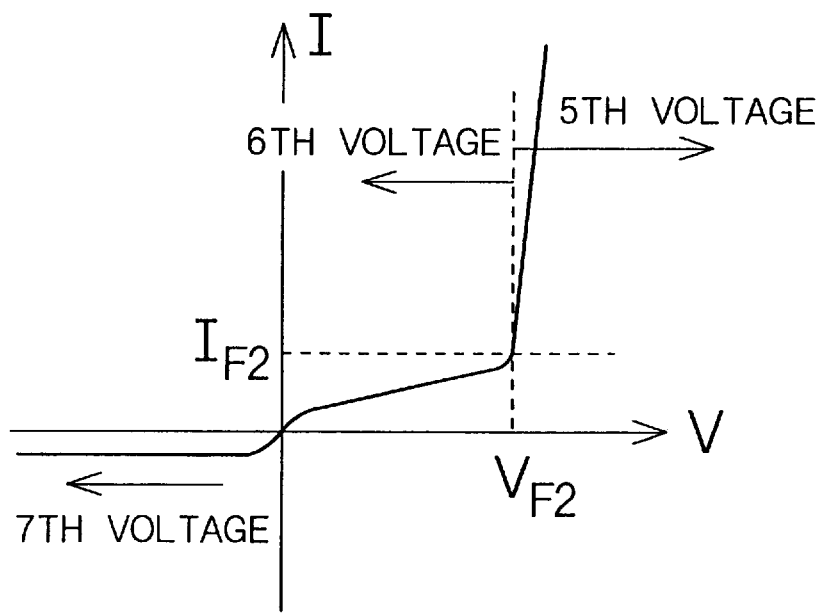

FIG. 2B schematically shows the I–V characteristic of the second non-linear resistance element 33. The second non-linear resistance element 33 has a forward direction characteristic that it has a second forward conduction voltage $V_{F2}$ at a current value of $I_{F2}$. That is, the second non-linear resistance element 33 has a two-terminal operation characteristic. Further, the second non-linear resistance element 33 has the following characteristics. That is, when a fifth voltage having the same polarity as that of the second forward conduction voltage $V_{F2}$ and having an absolute value which is equal to, or greater than, an absolute value of the second forward conduction voltage $V_{F2}$ is applied across the two ends (the end A and the end B), it is brought into a low resistive state. When a sixth voltage having the same polarity as that of the second forward conduction voltage $V_{F2}$ and having an absolute value smaller than the absolute value of the second forward conduction voltage $V_{F2}$ or a seventh voltage having an opposite polarity to the second forward conduction $V_{F2}$ is applied across the two ends (the end A and the end B), it is brought into a high resistive state.

In the memory cell according to the second A configuration of the present invention, a charge stored on or in the first gate 13 corresponds to stored information. Initial conditions of the memory cell are, for example, as shown in the following Table 5. In Table 5, γ is a proportional constant determined on the basis of the capacitance ratio.

TABLE 5

| | |
|---|---|
| Potential of second gate (first word-line potential): | $V_{WL1}$ |
| Potential of first gate: | $\gamma V_{WL1}$ |
| Potential of bit line: | $V_{BL0}$ |
| Potential of read line (first bit-line potential): | $V_{RL1}$ |
| Potential of erase line: | $V_{EL0}$ |
| Potential of source region: | $V_S$ |

Specifically, the values of $V_{WL1}, \gamma V_{WL1}, V_{BL0}, V_{RL1}, V_{EL0}$ and $V_S$ can be set at values close to 0 Volt.

[Writing of information]

The operational principle of writing information in the memory cell, i.e., storing a negative charge $Q_F$ of a first polarity on the first gate 13 can be same as that explained in [Explanation of operational principle of memory cell according to the first A configuration of the present invention (No. 1)], and detailed explanations thereof are therefore omitted. In this case, a first erase-line potential $V_{EL1}$ is applied to the erase line. When information is written into the memory cell, it is required to be secured that the second non-linear resistance element 33 is in a high resistive state. Therefore, when the potential in a site similar to the site B in FIG. 1B is $V_B$ [see the expression (1-2)], the value of $(V_{EL1}-V_B)$ is required to be smaller than $V_{F2}$, and when the potential in a site similar to the site B in FIG. 1B, after the first non-linear resistance element 30 is brought into a low resistive state, is $(V_{F1}+V_{BL1})$, the value of $\{V_{EL1}-(V_{F1}+V_{BL1})\}$ is required to be smaller than $V_{F2}$. In other words, if $V_{EL1}$ is selected so as to satisfy the following expressions (14-1) and (14-2), i.e., if the sixth voltage or the seventh voltage is generated between the first gate 13 and the end B of the second non-linear resistance element 33, the second non-linear resistance element 33 is brought into a high resistive state. Further, when writing information in the memory cell is inhibited, it is required to be secured that the second non-linear resistance element 33 is in a high resistive state. Therefore, when the potential in a site similar to the site B in FIG. 1B is $V_B$ [see the expression (4-2)], the value of $(V_{EL1}-V_B)$ is required to be smaller than $V_{F2}$. In other words, if $V_{EL1}$ is selected so as to satisfy the following expression (14-3), i.e., if the sixth voltage or the seventh voltage is generated between the first gate 13 and the end B of the second non-linear resistance element 33, the second non-linear resistance element 33 is brought into a high resistive state. For the second non-linear resistance element 33 to be in a high resistive state even in a standby state after information is written, $V_{EL1}$ is set so as to satisfy the following expression (14-4) as well.

$$V_{EL1} < \{C_0/(C_1+C_0)\}(V_{WL2}-V_{BL1})+V_{BL1}+V_{F2} \quad (14\text{-}1)$$

$$V_{EL1} < V_{F1}+V_{BL1}+V_{F2} \quad (14\text{-}2)$$

$$V_{EL1} < \{C_0/(C_1+C_0)\}(V_{WL2}-V_{BL2})+V_{BL2}+V_{F2} \quad (14\text{-}3)$$

$$V_{EL1} < \{C_0/(C_1+C_0)\}(V_{WL1}-V_{BL0})+V_{BL0}+V_{F2}+V_{INF} \quad (14\text{-}4)$$

[Readout of information]

The operational principle of readout of information can be the same as that explained in [Explanation of operational principle of memory cell according to the first A configuration of the present invention (No. 1)], and explanations thereof are therefore omitted. It is sufficient to apply a potential to the erase line EL such that the voltage between the potential $V_{INF}$ of the first gate 13 and the potential of the erase line EL is the sixth voltage or the seventh voltage, and to keep the second non-linear resistance element 33 in a high resistive state.

[Erasing of information]

When information is erased in the memory cell in which information is stored, i.e., in which the negative charge $Q_F$ is stored on or in the first gate 13, a second erase-line potential $V_{EL2}(>V_{F2})$ is applied to the erase line EL. That is, the above fifth voltage is generated between the first gate 13 and the end B of the second non-linear resistance element 33 to bring the second non-linear resistance element 33 into a low resistive state, and a charge of a second polarity opposite to a first polarity is transported from the erase line EL to the first gate 13 through the second non-linear resistance element 33, or the charge of a first polarity is discharged from the first gate 13 to the erase line EL through the second non-linear resistance element 33, whereby the charge-stored state of the first gate 13 is changed to a second charge-stored state, the charge-stored state of the first gate 13 changes, and information is erased.

The operational principle of writing information when the information stored on or in the first gate 13 is multi-valued information is the same as that explained in [Explanation of memory cell according to the first A configuration of the present invention (No. 1)], and detailed explanations thereof are therefore omitted.

[Explanation of operational principle of memory cell according to the second B or second C configuration of the present invention (No. 1)]

Figure 6A:
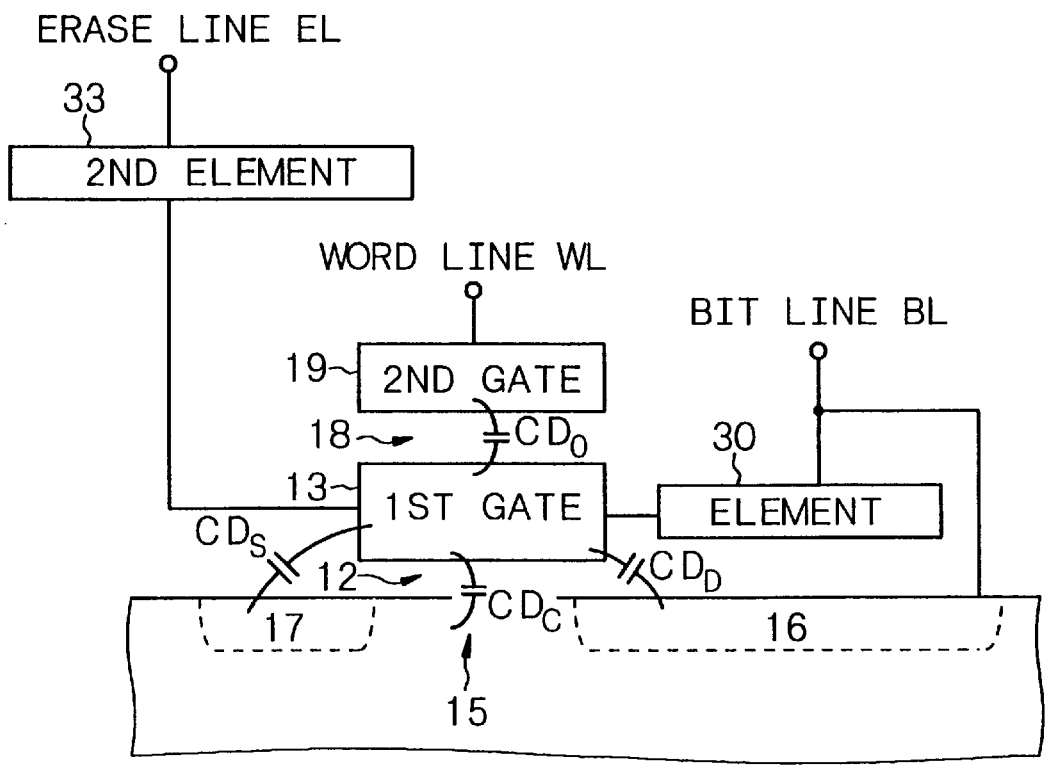
FIGS. 6A and 6B show a fundamental, principle drawing and an equivalent circuit of the memory cell according to the second B configuration of the present invention.
Figure 6B:
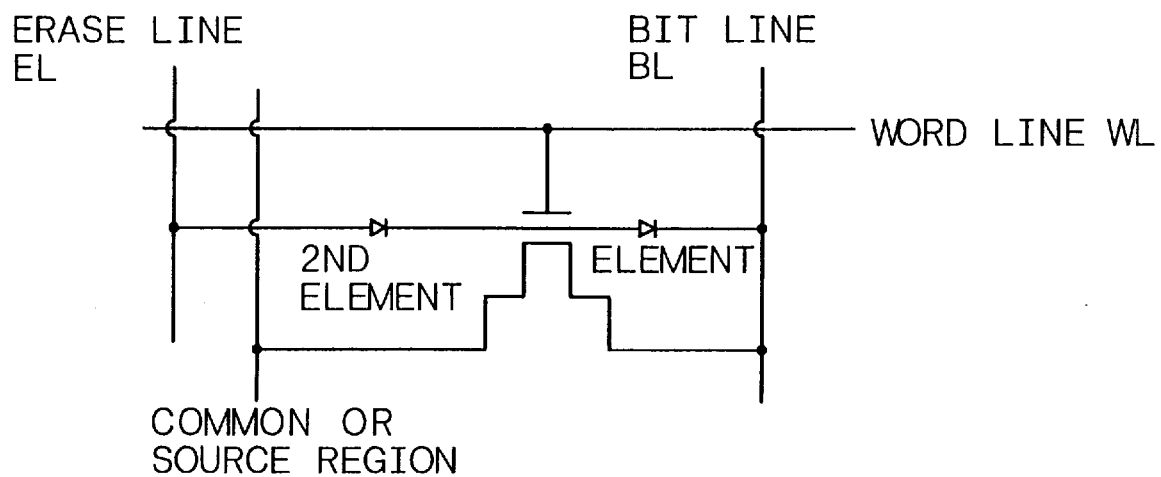
Figure 7A:
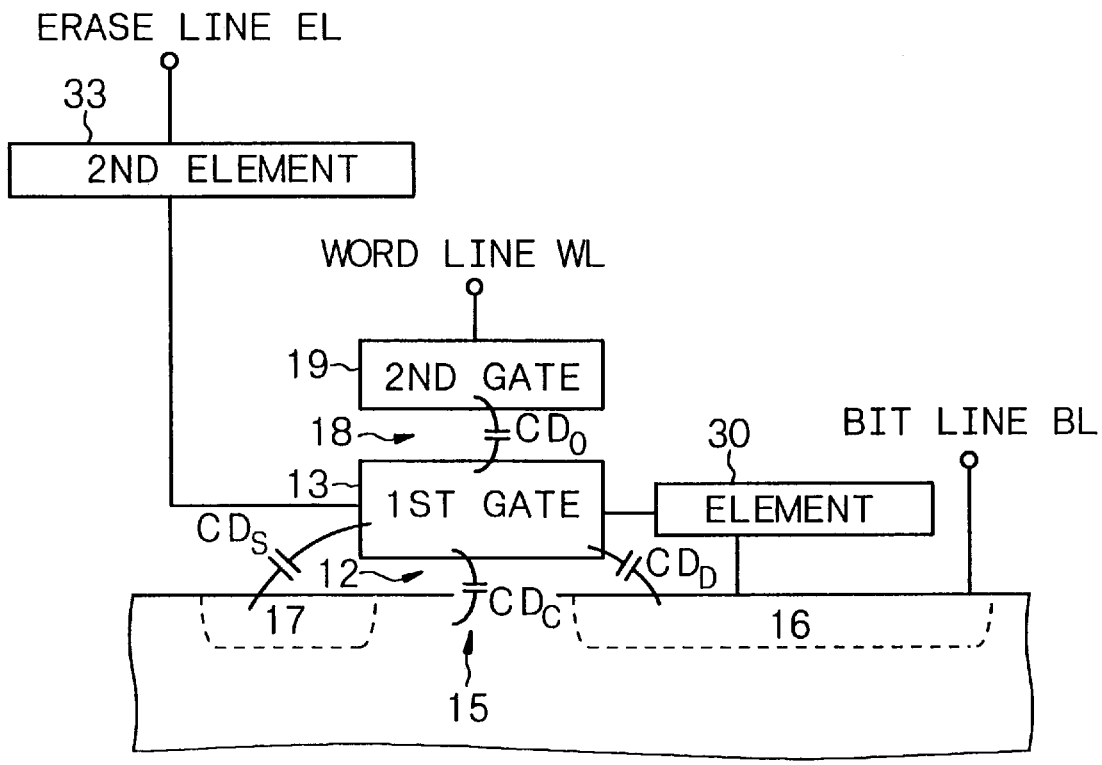
FIGS. 7A and 7B show a fundamental, principle drawing and an equivalent circuit of the memory cell according to the second C configuration of the present invention.
Figure 7B:
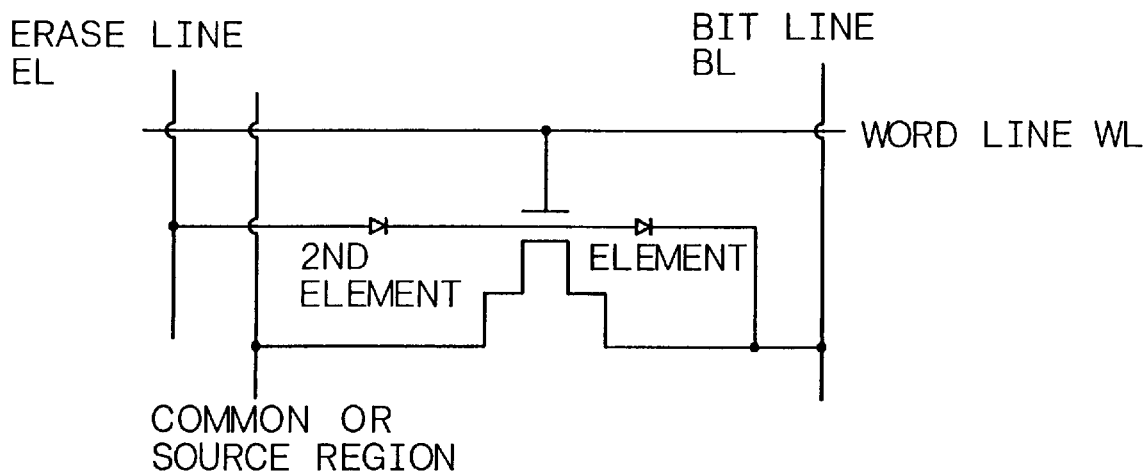

The operational principle of the memory cell according to the second B or second C configuration of the present invention will be explained hereinafter. FIG. 6A shows a fundamental, principle drawing of the memory cell according to the second B configuration of the present invention, and FIG. 6B shows an equivalent circuit thereof. FIG. 7A shows a fundamental, principle drawing of the memory cell according to the second C configuration of the present invention, and FIG. 7B shows an equivalent circuit thereof. The following explanation refers to an n-type memory cell as an example, while a p-type memory cell operates similarly except that potentials, etc., reversely change.

The memory cells according to the second B and second C configurations of the present invention have the same structures as those of the memory cells according to the first B and first C configurations of the present invention except that they have a second non-linear resistance element 33 and that the second non-linear resistance element 33 has one end (end A) connected to the first gate 13 and the other end (end B) connected to the erase line EL. The I–V characteristic of the second non-linear resistance element 33 can be the same as that shown in FIG. 2B. In the following explanation, the capacitance of a parasitic capacitor of the second non-linear resistance element 33 is ignored, and further, as explained in [Explanation of operational principle of the memory cell according to the first B or first C configuration of the present invention (No. 1)], the operation of the memory cells will be explained by taking into consideration only the composite capacitance $C_1$ of a capacitor $CD_D$ composed of one source/drain region 16, the insulation layer 12 and the first gate 13 and the parasitic capacitor of the non-linear resistance element 30, and the capacitance $C_0$ of the capacitor $CD_0$ composed of the first gate 13, the dielectric film 18 and the second gate 19.

In the memory cell according to the second B or second C configuration of the present invention, a charge stored on or in the first gate 13 corresponds to stored information. Initial conditions of the memory cell are, for example, as shown in Table 6. Specifically, the values of $V_{WL1}$, $\gamma V_{WL1}$, $V_{BL0}$, $V_S$ and $V_{EL0}$ can be set at values close to 0 volt.

TABLE 6

| Potential of second gate (first word-line potential): | $V_{WL1}$ |
|---|---|
| Potential of first gate: | $\gamma V_{WL1}$ |
| Potential of bit line: | $V_{BL0}$ |
| Potential of source region: | $V_S$ |
| Potential of erase line: | $V_{EL0}$ |

[Writing of information]

The operational principle of writing information in the memory cell, i.e., storing the negative charge $Q_F$ of a first polarity on the first gate 13 can be the same as that explained with regard to [Explanation of operational principle of memory cell according to the first B or first C configuration of the present invention (No. 1)], and detailed explanations thereof are therefore omitted. In this case, the first erase-line potential $V_{EL1}$ is applied to the erase line EL.

[Readout of information]

The operational principle of reading out information can be the same as that explained with regard to [Explanation of operational principle of memory cell according to the first B or first C configuration of the present invention (No. 1)], and detailed explanations thereof are therefore omitted. It is sufficient to apply a potential to the erase line EL such that the voltage between the potential $V_{INF}$ of the first gate 13 and the potential of the erase line EL is the sixth voltage or the seventh voltage, and to keep the second non-linear resistance element 33 in a high resistive state.

[Erasing of information]

When information is erased in the memory cell in which information is stored, i.e., in which the negative charge $Q_F$ is stored on or in the first gate 13, a second erase-line potential $V_{EL2}$ ($>V_{F2}$) is applied to the erase line EL. That is, the above fifth voltage is generated between the first gate 13 and the end B of the second non-linear resistance element 33, to bring the second non-linear resistance element 33 into a low resistive state. As a result, a charge of a second polarity opposite to a first polarity is transported from the erase line EL to the first gate 13 through the second non-linear resistance element 33, or the charge of a first polarity is discharged from the first gate 13 to the erase line EL through the second non-linear resistance element 33, whereby the charge-stored state of the first gate 13 can be changed to a second charge-stored state, the charge-stored state of the first gate 13 changes, and information is erased.

The operational principle of writing information when the information stored on or in the first gate 13 is multi-valued information is the same as that explained in [Explanation of memory cell according to the first A configuration of the present invention (No. 1)], and detailed explanations thereof are therefore omitted.

[Explanation of operational principle of memory cell according to the second A, second B or second C configuration of the present invention (No. 2)]

In the memory cell according to the second A configuration of the present invention, the capacitance of the capacitor $CD_D$, the capacitance of the capacitor $CD_C$, the capacitance of the capacitor $CD_S$, the capacitance of a parasitic capacitor of the non-linear resistance element 30 and the capacitance of a parasitic capacitor of the second non-linear resistance element 33 are negligibly small in some cases depending upon the structure and the size of the memory cell. The operational principle of the memory cell will be explained by taking into consideration the capacitance $C_0$ of the capacitor $CD_0$ alone hereinafter. The I–V characteristic of the second non-linear resistance element 33 can be the same as that shown in FIG. 2B. Further, the operational principles of the memory cells according to the second B and second C configurations of the present invention are, in principle, the same as that of the memory cell according to the second A configuration of the present invention, and explanations of the operational principles of the memory cells according to the second B and second C configurations of the present invention are omitted.

Initial conditions of the memory cell can be, for example, as shown in the above Table 5.

[Writing of information]

The operational principle of writing information in the memory cell, i.e., storing the negative charge $Q_F$ of a first polarity on the first gate 13 can be the same as that explained with regard to [Explanation of operational principle of memory cell according to the first A, first B or first C configuration of the present invention (No. 2)], and detailed explanations thereof are therefore omitted. In this case, the first erase-line potential $V_{EL1}$ is applied to the erase line. When information is written in the memory cell, it is required to be secured that the second non-linear resistance element 33 is in a high resistive state. Therefore, when the potential in a site similar to the site B in FIG. 1B is $V_B$ [see the expression (8-2)], the value of ($V_{EL1}-V_B$) is required to be smaller than the value of $V_{F2}$. Further, when the potential in the site similar to the site B in FIG. 1B after the first non-linear resistance element 30 is brought into a low resistive state is ($V_{F1}+V_{BL1}$), the value of $\{V_{EL1}-(V_{F1}+V_{BL1})\}$ is required to be smaller than the value of $V_{F2}$. In other words, if $V_{EL1}$ is selected so as to satisfy the following expressions (15-1) and (15-2), i.e., if the sixth voltage or the seventh voltage is generated between the first gate 13 and the end B of the second non-linear resistance element 33, the second non-linear resistance element 33 is brought into a high resistive state. Further, when writing information in the memory cell is inhibited, it is required to be secured that the second non-linear resistance element 33 is in a high resistive state. Therefore, when the potential in a site similar to the site B in FIG. 1B is $V_B$ [see the expression (11-2)], the value of ($V_{EL1}-V_B$) is required to be smaller than the value of $V_{F2}$. In other words, similarly, if $V_{EL1}$ is selected so as to satisfy the following expression (15-1), i.e., if the sixth voltage or the seventh voltage is generated between the first gate 13 and the end B of the second non-linear resistance element 33, the second non-linear resistance element 33 is brought into a high resistive state. For the second non-linear resistance element 33 to be in a high resistive state even in a standby state after information is written, $V_{EL1}$ is set so as to satisfy the condition of the following expression (15-3) as well.

$$V_{EL1}<\gamma V_{WL2}+V_{F2} \tag{15-1}$$

$$V_{EL1}<V_{F1}+V_{BL1}+V_{F2} \tag{15-2}$$

$$V_{EL1}<\gamma V_{WL1}+V_{F2}+V_{INF} \tag{15-3}$$

For reliably inhibiting the flowing of current between the source/drain regions 16 and 17 of the memory cell when information is written, it is preferred to reversely bias the other source/drain region (the source region 17) with regard to the channel forming region 15. Otherwise, it is preferred to make the other source/drain region (the source region 17) floating with regard to the channel forming region 15. Specifically, the same procedures as those explained in [Explanation of operational principle of memory cell according to the first A configuration of the present invention (No. 1)] can be carried out.

[Readout of information]

The operational principle of readout of information can be the same as that explained in [Explanation of operational principle of memory cell according to the second A configuration of the present invention (No. 1)], and explanations thereof are therefore omitted. It is sufficient to apply a potential to the erase line EL such that the voltage between the potential $V_{INF}$ of the first gate 13 and the potential of the erase line EL is the sixth voltage or the seventh voltage, and to keep the second non-linear resistance element 33 in a high resistive state.

[Erasing of information]

When information is erased from the memory cell in which information is stored, i.e., in which the negative charge $Q_F$ is stored on or in the first gate 13, a second erase-line potential $V_{EL2}$ ($>V_{F2}$) is applied to the erase line EL. That is, the above fifth voltage is generated between the first gate 13 and the end B of the second non-linear resistance element 33, to bring the second non-linear resistance element 33 into a low resistive state. As a result, a charge of a second polarity opposite to a first polarity is transported from the erase line EL to the first gate 13 through the second non-linear resistance element 33, or the charge of a first polarity is discharged from the first gate 13 to the erase line EL through the second non-linear resistance element 33, whereby the charge-stored state of the first gate 13 can be changed to a second charge-stored state, the charge-stored state of the first gate 13 changes, and information is erased.

The operational principle of writing information when the information stored on or in the first gate 13 is multi-valued information is the same as that explained in [Explanation of memory cell according to the first A configuration of the present invention (No. 1)], and detailed explanations thereof are therefore omitted.

EXAMPLE 1

Figure 8A:
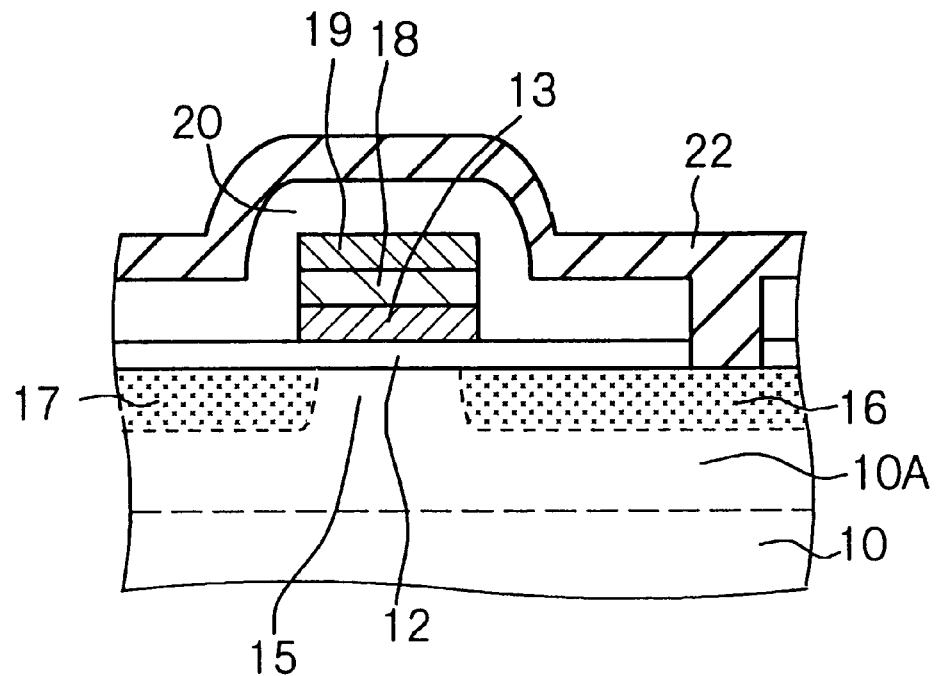
FIGS. 8A and 8B are schematic cross-sectional views of the memory cell in Example 1.
Figure 8B:
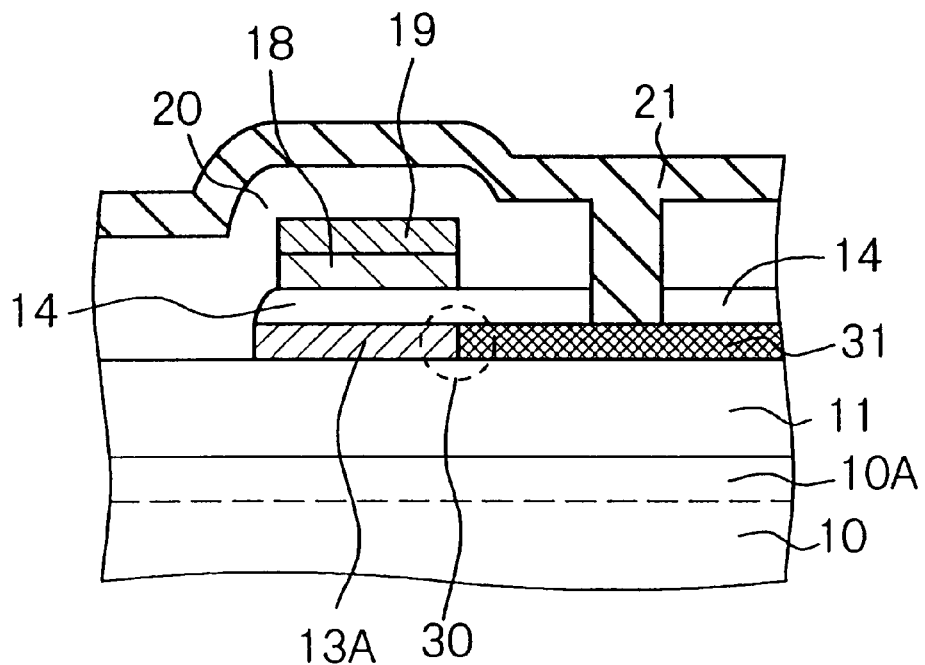
Figure 9A:
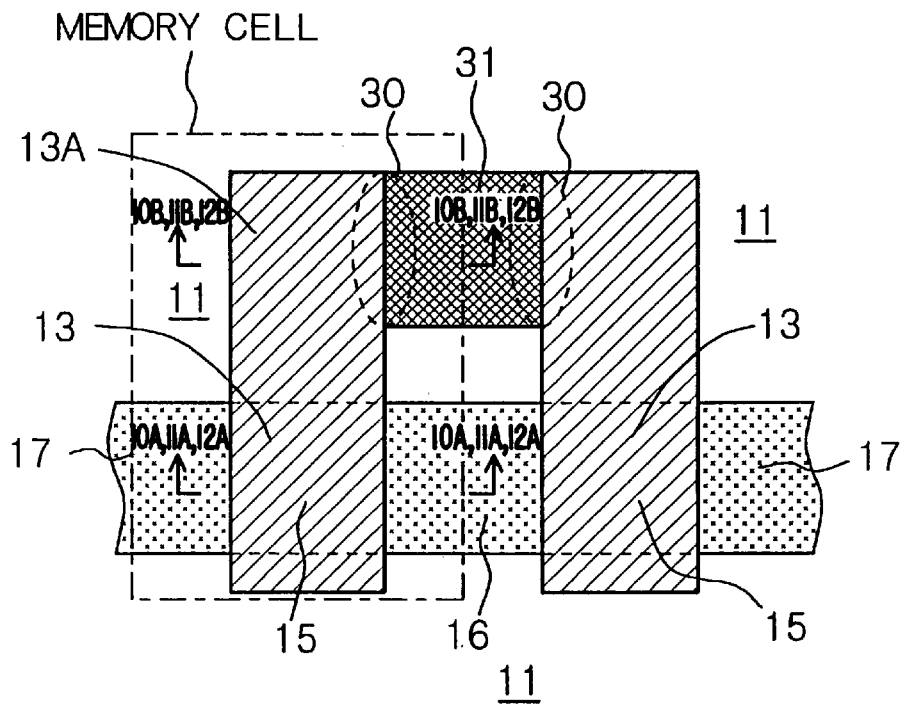
FIGS. 9A and 9B show a schematic and partial layout of the memory cell in Example 1 and a schematic and partial layout of a patterned silicon thin film and an etching stopper layer in Example 1.

Example 1 is concerned with the memory cell according to the first A configuration of the present invention and further with a process for the manufacture of the memory cell according to the first aspect of the present invention. FIGS. 1B and 1C show equivalent circuits of the memory cell of Example 1, and FIGS. 8A and 8B schematically show partial cross-sectional views of the memory cell of Example 1. Further, FIG. 9A schematically shows the layout of a first gate 13, an extended region 13A of the first gate (to be referred to as "first gate extended region 13A" hereinafter), a channel forming region 15, a drain region 16, a source region 17 and a non-linear resistance element 30 in each of memory cells adjacent to each other. FIG. 8A is a schematic, partial cross sectional view taken along arrows A—A in FIG. 9A, and FIG. 8B is a schematic, partial cross sectional view taken along arrows B—B in FIG. 9A.

The memory cell of Example 1 has the channel forming region 15, an insulation layer 12 which is a so-called gate insulation layer, the first gate 13 formed on the insulation layer 12, the first gate 13 facing the channel forming region 15 thorough the insulation layer 12, a second gate 19 capacitively coupled with the first gate 13, the source/drain regions 16 and 17 (the drain region 16 and the source region 17) formed in contact with the channel forming region 15 and spaced from each other, and the non-linear resistance element 30. The non-linear resistance element 30 has two ends (end A and end B). The above capacitive coupling is formed by sandwiching a dielectric film 18 with the first gate 13 and the second gate 19. Reference numeral 10 indicates a semiconductor substrate, and reference numeral 10A is a well which formed in the surface of the semiconductor substrate 10 as required. When the memory cell is an n-channel type, the well 10A has a p-type conductivity, and when the memory cell is a p-channel type, the well 10A has an n-type conductivity. In drawings other than FIGS. 8A and 8B, no well is shown for simplification of showing. Reference numeral 11 is a device separation region, reference numeral 14 is an etching stopper layer, and reference numeral 20 is an insulation interlayer.

In Example 1, the second gate 19 is connected to a word line WL, and one source/drain region (the drain region 16) is connected to a read line (RL) 22. In Examples, the second gate 19 has a common region with the word line WL.

One end (the end A) of the non-linear resistance element 30 is connected to the first gate 13, and the other end (the end B) is connected to a bit line (BL) 21. The above non-linear resistance element 30 has a two-terminal operation characteristic, and further specifically, it has characteristics that when the first voltage having the same polarity as that of the forward conduction voltage ($V_{F1}$) and having an absolute value equal to, or greater than, the absolute value of the forward conduction voltage ($V_{F1}$) is applied across the two ends (the end A and the end B), it is brought into a low resistive state and that when the second voltage having the same polarity as that of the forward conduction voltage ($V_{F1}$) and having an absolute value smaller than the absolute value of the forward conduction voltage ($V_{F1}$) or a voltage having an opposite polarity to the forward conduction voltage ($V_{F1}$) is applied across the two ends (the end A and the end B), it is brought into a high resistive state, as shown in FIG. 2A. Further, the non-linear resistance element 30 has characteristics that when the third voltage having an opposite polarity to the forward conduction voltage ($V_{F1}$) and having an absolute value smaller than the absolute value of the reverse conduction voltage ($V_{R1}$) is applied across the two ends (the end A and the end B), it is brought into a high resistive state, and that when the fourth voltage having an opposite polarity to the forward conduction voltage ($V_{F1}$) and having an absolute value which is equal to, or greater than, the absolute value of the reverse conduction voltage ($V_{R1}$) is applied across the two ends (the end A and the end B), it is brought into a low resistive state.

That is, the non-linear resistance element 30 has a characteristic that when a predetermined voltage is applied, it is brought into a low resistive state. Specifically, the non-linear resistance element 30 is formed of a diode of which the reverse conduction voltage ($V_{R1}$) is controlled to a defined value, more specifically, of a pn junction diode. The reverse conduction voltage ($V_{R1}$) can be controlled by utilizing a Zener breakdown or an avalanche breakdown.

The non-linear resistance element 30 composed of a pn junction diode is formed in the first gate extended region 13A which extends on an insulation region (the device separation region 11 having a LOCOS structure and/or a trench structure in Example 1). The pn junction diode has a semiconductor region 31 which is the same as the source/drain regions 16 and 17 in conductivity type and a semiconductor region (the first gate extended region 13 A in Example 1) which is opposite to the source/drain regions 16 and 17 in conductivity type. The first gate extended region 13A corresponds to the end A of the non-linear resistance element 30. On the other hand, the semiconductor region 31 which is the same as the source/drain regions 16 and 17 in conductivity type corresponds to the end B of the non-linear resistance element 30. Specifically, the semiconductor region 31 containing an n-type dopant (impurity) is formed in the first gate extended region 13A [containing a p$^+$-type dopant (impurity)], and a lateral pn junction is formed in the first gate extended region 13A. The semiconductor region 31 corresponding to the end B of the non-linear resistance element, 30 is connected to the bit line (BL) 21. In FIG. 9A, the pn junction region is positioned on a line extending from an end portion of the first gate 13, while the position of the pn junction region may change depending upon the dopant (impurity) concentration in the first gate extended region 13A and the dopant (impurity) concentration in the semiconductor region 31 or the form of a mask used for introducing a dopant.

Figure 10A:
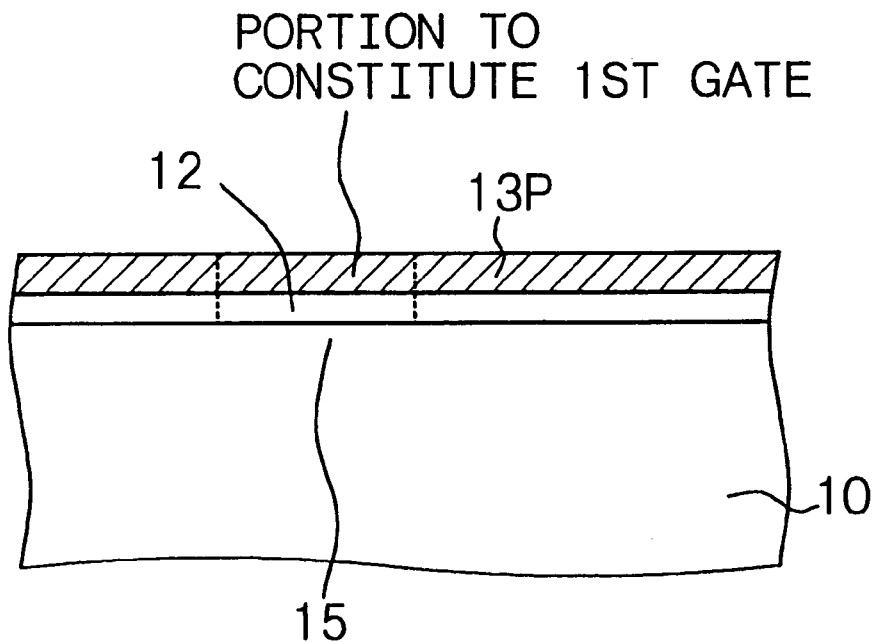
FIGS. 10A and 10B are schematic, partial cross-sectional views of a semiconductor substrate, etc., for explaining the process for the manufacture of a memory cell in Example 1.
Figure 10B:
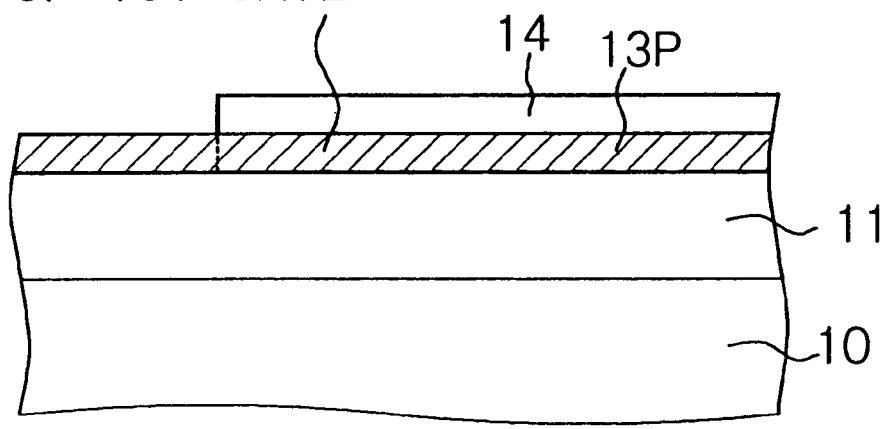
Figure 11A:
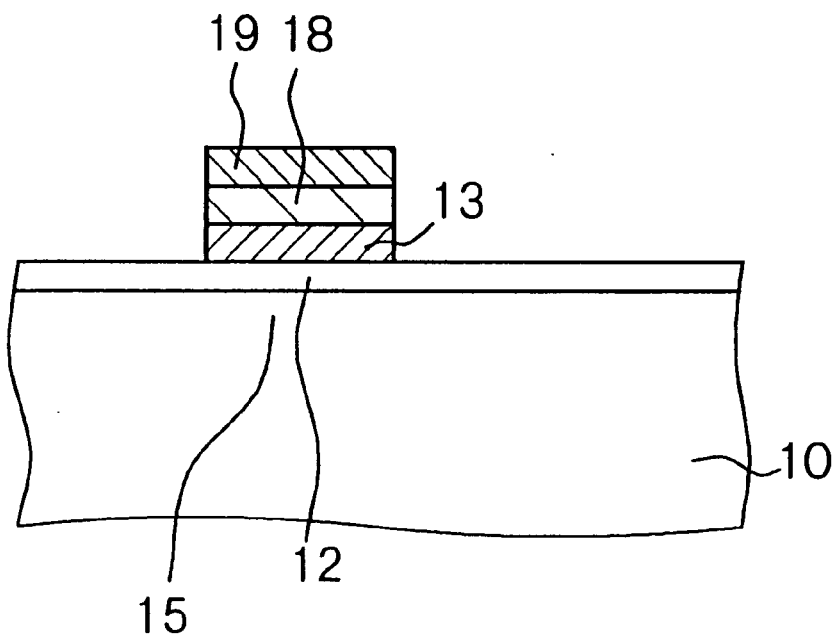
FIGS. 11A and 11B, subsequent to FIGS. 10A and 10B, are schematic, partial cross-sectional views of a semiconductor substrate, etc., for explaining the process for the manufacture of the memory cell in Example 1.
Figure 11B:
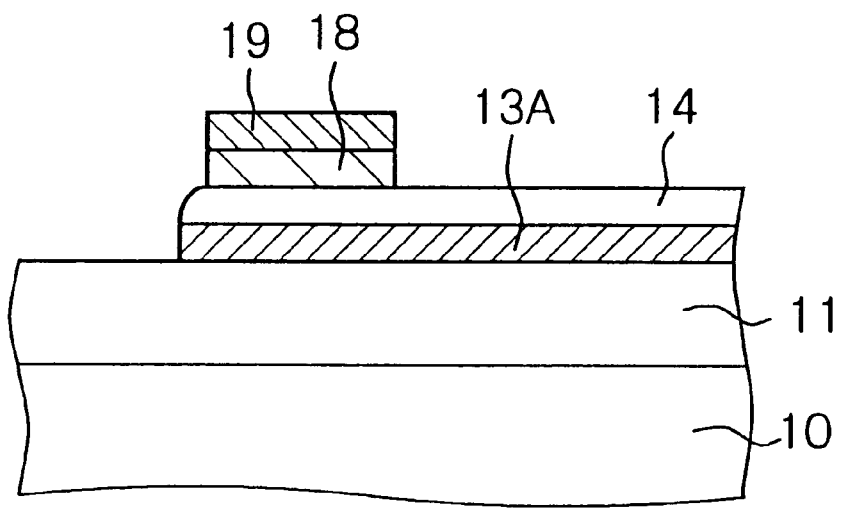
Figure 12A:
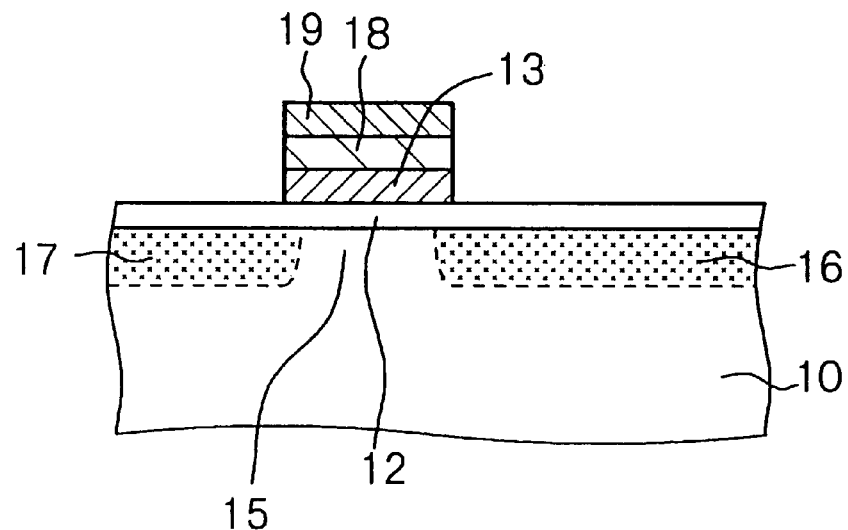
FIGS. 12A and 12B, subsequent to FIGS. 11A and 11B, are schematic, partial cross-sectional views of a semiconductor substrate, etc., for explaining the process for the manufacture of the memory cell in Example 1.
Figure 12B:
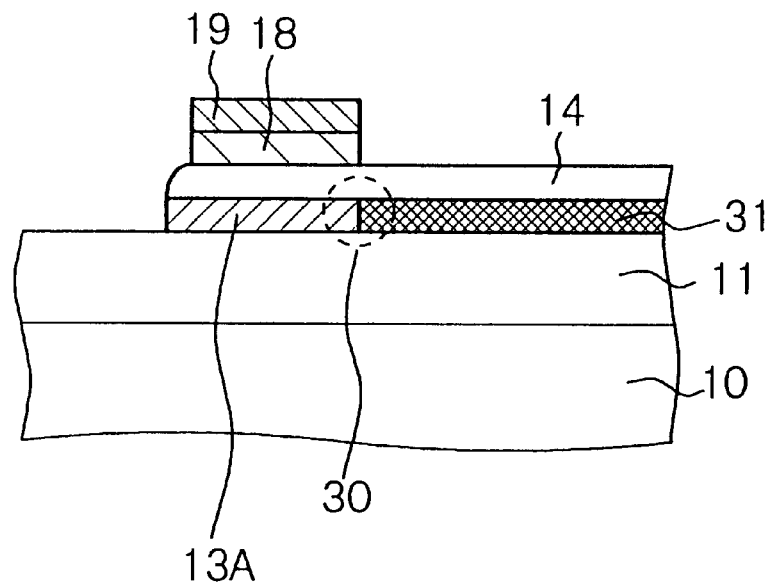

The process for the manufacture of the memory cell of Example 1 shown in FIGS. 8A, 8B and 9A will be explained with reference to FIGS. 10A, 10B, 11A, 11B, 12A and 12B which are schematic, partial cross-sectional views of a semiconductor substrate 10 and the like. FIGS. 10A, 11A and 12A are schematic, partial cross-sectional views, which are similar to that taken along arrows A—A in FIG. 9A. FIGS. 10A, 11B and 12B are schematic, partial cross-sectional views, which are similar to that taken along arrows B—B in FIG. 9A.

[Step-100]

Figure 9B:
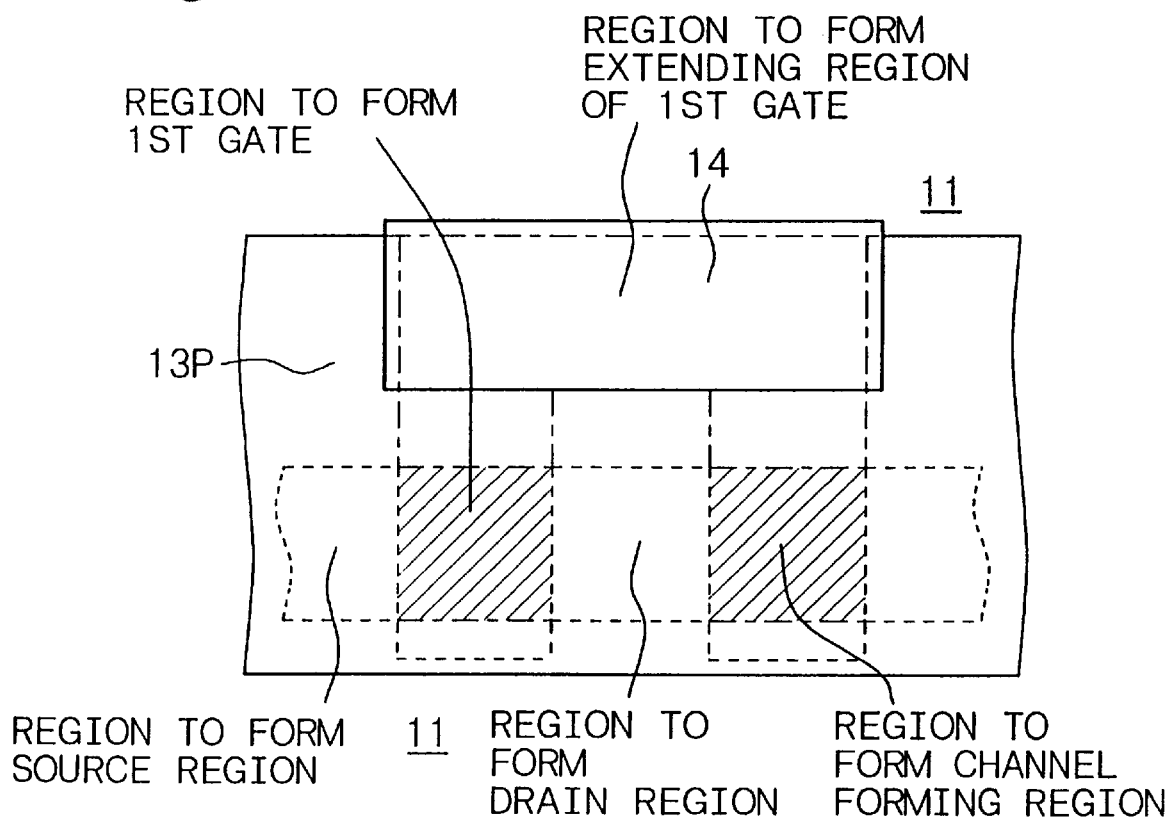

First, the device separation region 11 having a LOCOS structure and/or a trench structure is formed in the semiconductor substrate 10 by a known method. Then, the semiconductor substrate 10 is ion-implanted with a p-type dopant (impurity) for forming the channel forming region 15. Then, the insulation layer 12 corresponding to a gate insulation layer is formed on the surface of the semiconductor substrate 10 by treating the surface of the semiconductor substrate 10 with a heat oxidation method or a method using heat nitriding after the heat oxidation. Thereafter, a silicon thin film 13P (which may be a polysilicon thin film or an amorphous silicon thin film) doped with, for example, a p-type dopant is deposited on the entire surface by a CVD method, and then the silicon film 13P is patterned such that at least plane shapes identical with the plane shapes of the first gate 13 and the first gate extended region 13A are retained. Then, the etching stopper layer 14 which has a larger thickness than the dielectric film 18 to be described later and is formed of, for example, SiO$_2$ is deposited. Then, the etching stopper layer 14 is patterned so as to retain a plane shape identical with the shape of the first gate extended region 13A to be formed later (see FIGS. 9B, 10A and 10B). FIG. 9B shows a schematic and partial layout of the patterned silicon thin film 13P and the etching stopper layer 14. In FIG. 9B, a region to form the first gate 13 in the silicon thin film 13P is provided with slanting lines. Further, a region to form the first gate extended region 13A in the silicon thin film 13P is surrounded by an alternate long and short dash line. Further, a region to form the drain region in the silicon thin film 13P, a region to form the channel forming region in the silicon thin film 13P and a region to form the source region in the silicon thin film 13P are surrounded by dotted lines.

[Step-110]

Then, an insulation interlayer which works as the dielectric film 18 and is composed of, for example, SiO$_2$, SiO$_2$/Si$_x$N$_y$, SiO$_2$/Si$_x$N$_y$/SiO$_2$ or Ta$_2$O$_5$/Si$_x$N$_y$ is formed on the entire surface by a CVD method, a heat oxidation method, a heat nitriding method or a plasma nitriding method. Then, a polysilicon layer doped with, for example, an n-type dopant is deposited on the entire surface by a CVD method, and then the polysilicon layer, the dielectric film 18 and the silicon thin film 13P are consecutively patterned through one etching mask (not shown), whereby the second gate 19 and the first gate 13 are formed. The first gate 13 is formed of the silicon thin film, and the second gate 19 is formed of the polysilicon layer. Further, the channel forming region 15 is formed below the first gate 13. In this case, the silicon thin film 13P which is to constitute the first gate extended region 13A is left below the patterned etching stopper layer 14. That is, the first gate extended region 13A is formed outside the second gate 19 as well (see FIGS. 11A and 11B). Further, part of the first gate extended region 13A is formed below the second gate 19. The second gate 19 has a common region with the word line WL.

[Step-120]

Then, the semiconductor substrate 10 and part of the first gate extended region 13A below the patterned etching stopper layer 14 are ion-implanted with, for example, an n-type dopant, thereby to form the drain region 16 and the source region 17 and also to form the semiconductor region 31 in the part of the first gate extended region 13A (see FIGS. 12A and 12B). In this manner, the non-linear resistance element 30 which is formed of a pn junction diode and has a pn junction region can be formed.

[Step-130]

Then, the insulation interlayer 20 formed of, for example, SiO$_2$ is deposited on the entire surface by a CVD method, and then opening portions are formed in the insulation interlayer 20 above the drain region 16 and the semiconductor region 31. A wiring layer of, for example, an aluminum alloy is deposited on the insulation interlayer 20 and in the above opening portions by a sputtering method, and then the wiring layer is patterned, thereby to form the bit line (BL) 21 electrically connected to the semiconductor region 31 which is the end B of the non-linear resistance element 30 and the read line (RL) 22 electrically connected to the drain region 16. In this manner, the memory cell having a constitution shown in FIGS. 8A, 8B and 9A can be obtained.

EXAMPLE 2

Example 2 is a variant of Example 1. Example 2 differs from Example 1 in that the pn junction diode as a non-linear resistance element 30 has a pn junction region (a region of a lateral pn junction) formed of a single crystal semiconductor. The other structure of the memory cell of Example 2 can be the same as those of the memory cell of Example 1. The process for the manufacture of the memory cell of Example 2 will be explained below.

[Step-200]

First, in the same manner as in [Step-100] in Example 1, the device separation region 11 having a LOCOS structure and/or a trench structure is formed in the semiconductor substrate 10, the semiconductor substrate 10 is ion-implanted with a p-type dopant and the insulation layer 12 is formed. Then, a silicon thin layer is formed on the semiconductor substrate 10.

[Step-210]

The silicon thin layer corresponding at least to the first gate 13 and the first gate extended region 13A where the non-linear resistance element 30 is to be formed, is ion-implanted with, for example, Si to make it amorphous. Then, a protective layer formed of, for example, $SiO_2$ or $Si_xN_y$ is deposited as required, and then the semiconductor substrate 10 is heated in an inert gas atmosphere at a temperature between 600° C. and 800° C. for 1 to 3 hours. As a result, a portion of the silicon thin layer corresponding to the first gate 13 and the first gate extended region 13A where the non-linear resistance element 30 is to be formed, is single-crystallized or increased in particle size, to form a single crystal semiconductor region. Then, the single crystal semiconductor region is ion-implanted with, for example, a p-type dopant. Then, the single-crystallized silicon thin layer is patterned in the same manner as in [Step-100] of Example 1, and an etching stopper layer 14 which has a greater thickness than the dielectric film 18 and is formed of, for example, $SiO_2$ is deposited. Then, the etching stopper layer 14 is patterned so as to retain a plane shape similar to the plane shape of the first gate extended region 13A to be formed later.

[Step-220]

Then, an insulation interlayer which works as the dielectric film 18 and is composed of, for example, $SiO_2$, $SiO_2/Si_xN_y$, $SiO_2/Si_xN_y/SiO_2$ or $Ta_2O_5/Si_xN_y$ is formed on the entire surface by a CVD method, a heat oxidation method, a heat nitriding method or a plasma nitriding method. Then, a polysilicon layer doped with, for example, an n-type dopant is deposited on the entire surface by a CVD method, and then the polysilicon layer, the dielectric film 18 and the silicon thin film are consecutively patterned through one etching mask, whereby the second gate 19 and the first gate 13 are formed. The first gate 13 is formed of the single-crystallized silicon thin film, and the second gate 19 is formed of the polysilicon layer. Further, the channel forming region 15 is formed below the first gate 13. In this case, the single-crystallized silicon thin film which is to constitute the first gate extended region 13A is left below the patterned etching stopper layer 14. That is, the first gate extended region 13A composed of a single-crystallized semiconductor region is formed outside the second gate 19. Further, part of the first gate extended region 13A is formed below the second gate 19. The second gate 19 has a common region with the word line WL.

[Step-230]

Then, the semiconductor substrate 10 and part of the first gate extended region 13A below the patterned etching stopper layer 14 are ion-implanted with, for example, an n-type dopant, thereby to form the drain region 16 and the source region 17 and also to form the semiconductor region 31 in the part of the first gate extended region 13A. In this manner, a pn junction diode which is the non-linear resistance element 30 is formed, and the pn junction region (a region of a lateral pn junction) is formed in the semiconductor region.

[Step-240]

Then, [Step-130] in Example 1 is repeated, whereby the memory cell having a constitution shown in FIGS. 8A, 8B and 9A can be obtained.

EXAMPLE 3

Figure 13:
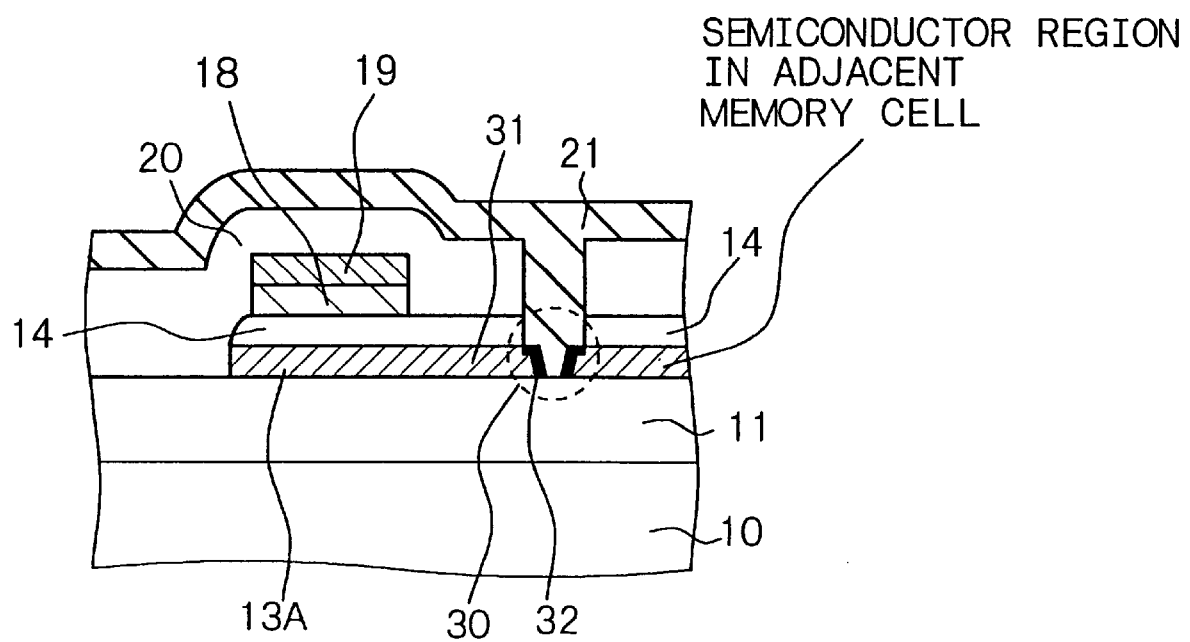
FIG. 13 is a schematic, partial cross-sectional view of a memory cell in Example 3.

Example 3 is also a variant of Example 1. Example 3 differs from Example 1 in that the non-linear resistance element 30 is formed of a hetero-junction diode (e.g., Schottky barrier diode). FIG. 13 shows a schematic, partial cross-sectional view of the memory cell of Example 3, which is similar to that taken along arrows B—B in FIG. 9A. A silicide layer is formed on the surface of part of the first gate extended region 13A. The other structures of the memory cell of Example 3 can be the same as those of the memory cell in Example 1. The process for the manufacture of the memory cell of Example 3 will be explained below. In Example 3, the conductivity type in various regions is opposite to that in Example 1. The first gate extended regions 13A of two adjacent memory cells in Example 3 are required to be separated from each other.

[Step-300]

First, in the same manner as in [Step-100] in Example 1, the device separation region 11 having a LOCOS structure and/or a trench structure is formed in the semiconductor substrate 10, the semiconductor substrate 10 is ion-implanted with an n-type dopant, and the insulation layer 12 is formed. Then, a silicon thin layer doped with, for example, an n-type dopant is deposited, and then, the silicon thin layer is patterned in the same manner as in [Step-100] in Example 1. The concentration of the n-type dopant is preferably equal to, or less than $10^{19}$ atoms/cm$^3$ for securing a peak inverse voltage of the hetero-junction.

[Step-310]

The first gate 13, the first gate extended region 13A, the dielectric film 18 and the second gate 19 are formed in the same manner as in [Step-110] in Example 1. The first gate extended regions 13A are patterned such that the first gate extended regions 13A of the two adjacent memory cells are separated from each other.

[Step-320]

Then, the semiconductor substrate 10 is ion-implanted with a p-type dopant by ion implantation, to form the drain region 16 and the source region 17. In Example 3, the first gate extended region 13A is kept containing an n-type dopant without ion-implanting the p-type dopant.

[Step-330]

Then, an insulation interlayer 20 formed of, for example, $SiO_2$ is deposited on the entire surface by a CVD method, and then opening portions are formed in the insulation interlayer 20 above the drain region 16 and part of the first gate extended region 13A. And, for example, a titanium layer (not shown) is deposited 3 on the insulation interlayer 20 and in the opening portions by a sputtering method and then is annealed, whereby Ti atoms of the titanium layer deposited in the bottom of the opening portion react with Si atoms of the first gate extended region 13A formed of polysilicon. As a result, a titanium silicide layer 32 is formed on the surface of the part of the first gate extended region 13A positioned in the bottom of the opening portion. Then, unreacted titanium layer is removed. Thereafter, a wiring layer of an aluminum alloy is deposited by a sputtering method, and the wiring layer is patterned to form the bit line (BL) 21 electrically connected to the titanium silicide layer 32 which is the end B of the non-linear resistance element 30 and the read line RL (not shown in FIG. 13) electrically connected to the drain region 16. In this manner, the memory cell having a structure shown in FIG. 13 can be obtained.

The material for forming the hetero-junction diode is not limited to titanium silicide, and it can be selected from, for example, cobalt silicide or tungsten silicide or can be selected from other metal materials such as molybdenum. When the non-linear resistance element is formed of a hetero-junction diode, $V_{F1}$ can be controlled by properly selecting an annealing temperature or a metal for forming a silicide. Further, by combining Example 3 with Example 2, the non-linear resistance element formed of a hetero-junction diode can be formed of a single crystal semiconductor.

EXAMPLE 4

Figure 5B:
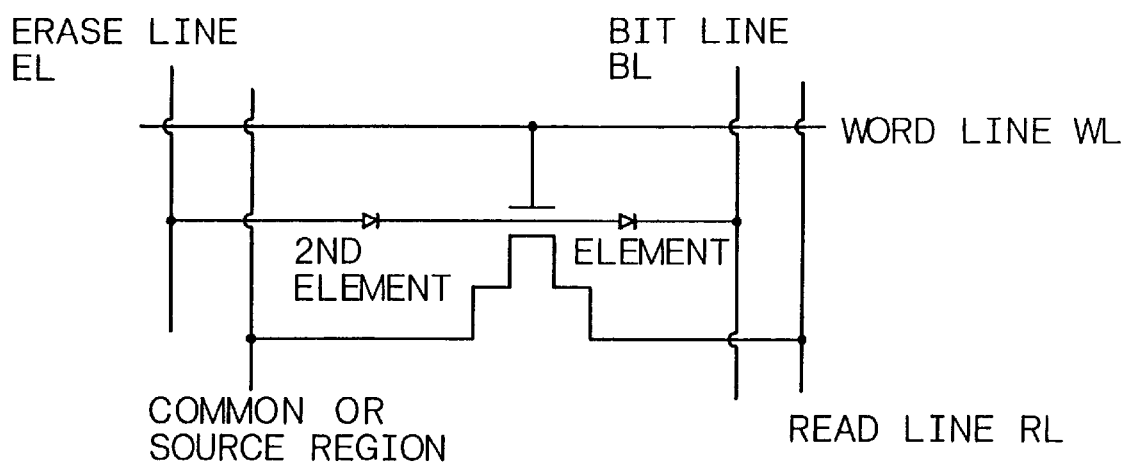
Figure 14A:
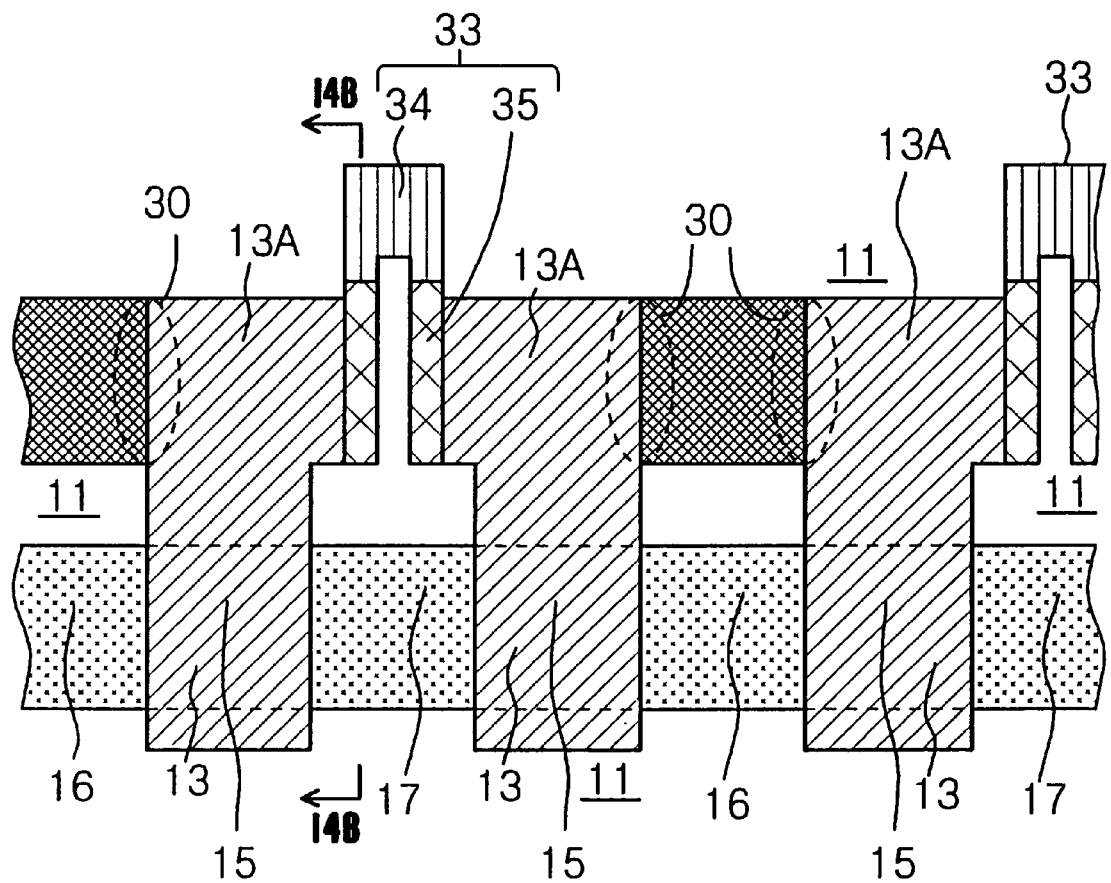
FIGS. 14A and 14B are a schematic, partial layout and a schematic, partial cross-sectional view of a memory cell in Example 4.
Figure 14B:
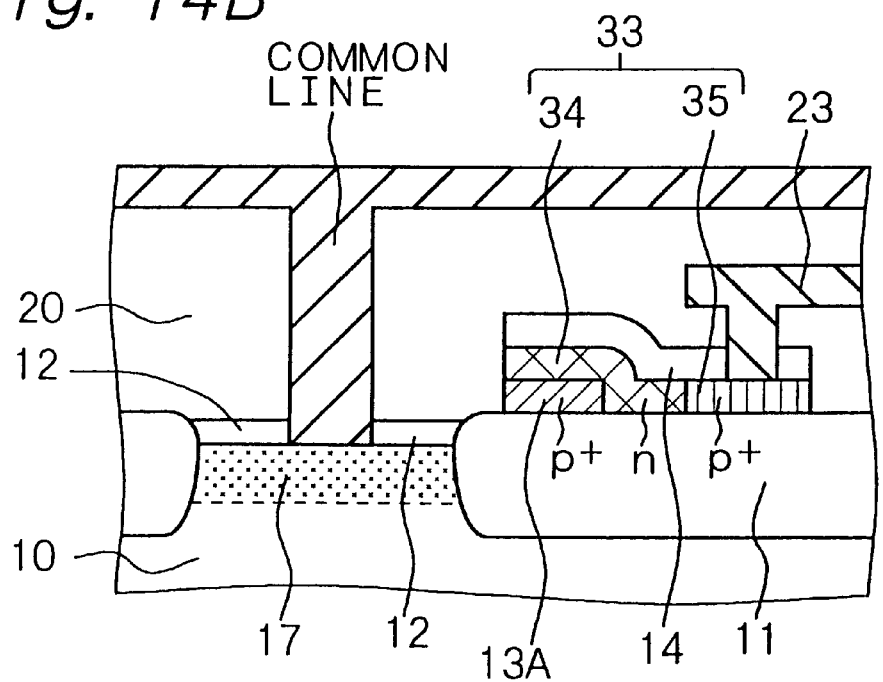

Example 4 is concerned with the memory cell according to the second A configuration of the present invention. The memory cell of Example 4 differs from the memory cell of Example 1 in that it further has a second non-linear resistance element 33 having two ends (end A and end B) with one end (the end A) connected to the first gate 13. FIG. 14A shows a schematic layout of first gates 13, first gate extended regions 13A, channel forming regions 15, drain regions 16, source regions 17, non-linear resistance elements 30 and second non-linear resistance elements 33 in the memory cell of Example 4. FIG. 14B shows a schematic, partial cross-sectional view taken along arrows B—B in FIG. 14A. FIG. 5A shows a fundamental, principle drawing of the memory cell of Example 4, and FIG. 5B shows an equivalent circuit thereof.

The second non-linear resistance element 33 has a two-terminal operation characteristic, and further specifically, it has characteristics that, as shown in FIG. 2B, when the fifth voltage having the same polarity as that of the second forward conduction voltage ($VF_2$) and having an absolute value which is equal to, or greater than, the absolute value of the second forward conduction voltage ($VF_2$) is applied across the two ends (the end A and the end B), it is brought into a low resistive state and that when the sixth voltage having the same polarity as that of the second forward conduction voltage ($V_{F2}$) and having an absolute value smaller than the absolute value of the second forward conduction voltage ($V_{F2}$) or the seventh voltage having an opposite polarity to the second forward conduction ($V_{F2}$) is applied across the two ends (the end A and the end B), it is brought into a low resistive state. That is, it has characteristics that when a predetermined voltage is applied, it is brought into a low resistive state. One end (the end A) of the second non-linear resistance element 33 is connected to the first gate 13 and the other end (the end B) is connected to the erase line (EL) 23.

In Example 4, the second non-linear resistance element 33 is formed of a pn junction diode and formed in the first gate extended region 13A on the insulation region 11. The pn junction diode has a semiconductor region 34 (third semiconductor region) which is the same as the source/drain regions 16 and 17 in conductivity type (e.g., n-type) and a semiconductor region 35 (fourth semiconductor region) having a conductivity type (e.g., $p^+$ type) opposite to the conductivity type of the source/drain regions 16 and 17. The semiconductor region 34 (third semiconductor region) corresponds to the end A of the second non-linear resistance element 33, and the semiconductor region 35 (fourth semiconductor region) corresponds to the end B of the second non-linear resistance element 33. The semiconductor region 35 corresponding to the end B of the second non-linear resistance element 33 is connected to the erase line (EL) 23. The pn junction diode which is the second non-linear resistance element 33 in Example 4 has a lateral pn junction. By forming a vertical junction of the semiconductor region 34 containing an n-type dopant and the first gate extended region 13A (p-type in conductivity type) as a junction, there can be obtained a junction which has a remarkably small current leakage and is relatively nearly ohmic as compared with a lateral pn junction when, especially, the first gate extended region 13A and the semiconductor region 34 are formed of a polycrystal. The process for the manufacture of the memory cell having the second non-linear resistance element 33, provided in Example 4, will be explained hereinafter.

The non-linear resistance element (first non-linear resistance element) 30 in Example 4 has the same constitution as that of the non-linear resistance element 30 in the memory cell explained in Example 1. Alternatively, the non-linear resistance element (first non-linear resistance element) 30 in Example 4 may have the constitution explained in Example 2 or 3. Further, the non-linear resistance element (first non-linear resistance element) 30 having characteristics shown in FIG. 2B may be used. That is, when the second non-linear resistance element 33 is provided, the non-linear resistance element (first non-linear resistance element) 30 is not required to be a non-linear resistance element of which the reverse conduction voltage ($V_{R1}$) is controlled to a defined value.

[Step-400]

First, in the same manner as in [Step-100] in Example 1, the device separation region 11 having a LOCOS structure and/or a trench structure is formed in the semiconductor substrate 10, the semiconductor substrate 10 is ion-implanted with an n-type dopant, and the insulation layer 12 is formed. Then, in a step similar to [Step-100] in Example 1, a silicon thin layer (the silicon thin layer may be a polysilicon thin layer or an amorphous thin layer) doped with, for example, a p-type dopant is deposited on the entire surface by a CVD method, and then, the silicon thin layer is patterned in the same manner as in [Step-100] in Example 1 to form a region including at least a region where the first gate 13 is to be formed and a region where the first gate extended region 13A is to be formed. The silicon thin layer is patterned such that portions to form second non-linear resistance elements in first gate extended regions 13A of two adjacent memory cells are separated from each other (see a plan view shown in FIG. 14A).

[Step-410]

Then, a polysilicon layer is deposited, and then the polysilicon layer is patterned so as to leave a portion where the second non-linear resistance elements are to be formed. Then, the patterned polysilicon layer is ion-implanted with, for example, an n-type dopant, whereby the semiconductor region 34 (corresponding to the end A of the second non-linear resistance element 33) containing an n-type dopant can be formed. Then, part of the semiconductor region 34 (region distant from the first gate extended region 13A) is ion-implanted with a p-type dopant by ion implantation, to form the semiconductor region 35 containing a p+-type dopant (corresponding to the end B of the second non-linear resistance element 33). In this manner, the second non-linear resistance element 33 can be formed. Alternatively, the second non-linear resistance element formed of a pn junction diode may be separately formed on the device separation region 11 (insulation region) positioned apart from the first gate extended region 13A, and one end (the end A) of the second non-linear resistance element may be connected to the first gate 13 or the first gate extended region 13A, e.g., with a wiring layer.

[Step-420]

Then, an etching stopper layer 14 which is thicker than a dielectric film 18 and is formed of, for example, $SiO_2$ is deposited on the entire surface. Then, the etching stopper layer 14 is patterned so as to retain a plane shape similar to the plane shape of the first gate extended region 13A and so as to cover the second non-linear resistance element 33. Then, the first gate 13, the dielectric film 18 and the second gate 19 are formed in the same manner as in [Step-110] in Example 1.

[Step-430]

Then, the semiconductor substrate 10 and part of the first gate extended region 13A are ion-implanted with, for example, an n-type dopant by ion implantation, thereby to form a drain region 16 and a source region 17, and also to form a semiconductor region 31 in the part of the first gate extended region 13A. Then, [Step-130] in Example 1 is carried out. In this manner, the memory cell shown in FIGS. 14A and 14B can be obtained.

The pn junction region of the pn junction diode constituting the second non-linear resistance element 33 may be formed of a single crystal semiconductor. Specifically, in [Step-400], the formed silicon thin layer is patterned to form a region including at least a region where the first gate 13 is to be formed and a region where the first gate extended region 13A to be formed. Then, in [Step-410], a polysilicon layer is deposited on the entire surface. Then, the polysilicon layer is patterned, and then the polysilicon layer is ion-implanted with, for example, Si to make amorphous the polysilicon layer where the second non-linear resistance element 33 is to be formed. Then, the semiconductor substrate 10 is heated in an inert atmosphere at a temperature between 600° C. and 800° C. for 1 to 3 hours. As a result, the polysilicon layer where the second non-linear resistance element 33 is to be formed is single-crystallized or increased in particle size, to form a single crystal semiconductor region. When the range (average depth) of the ion-implanted Si is set within the above polysilicon layer, a portion of the single crystal semiconductor region where the pn junction is to be formed in a step to come can be improved in crystallizability, and further, a portion of the single crystal semiconductor region overlapping the first gate extended region 13A can be formed as a polycrystal having a crystal orientation continued from the first gate extended region 13A. In this manner, the ohmic contact of the end A of the second non-linear resistance element 33 and the first gate extended region 13A can be improved. Then, the so-patterned single crystal semiconductor region is ion-implanted with, for example, an n-type dopant and the following process in [Step-410] can be carried out, and further, [Step-420] and [Step-430] can be carried out.

Figure 15:
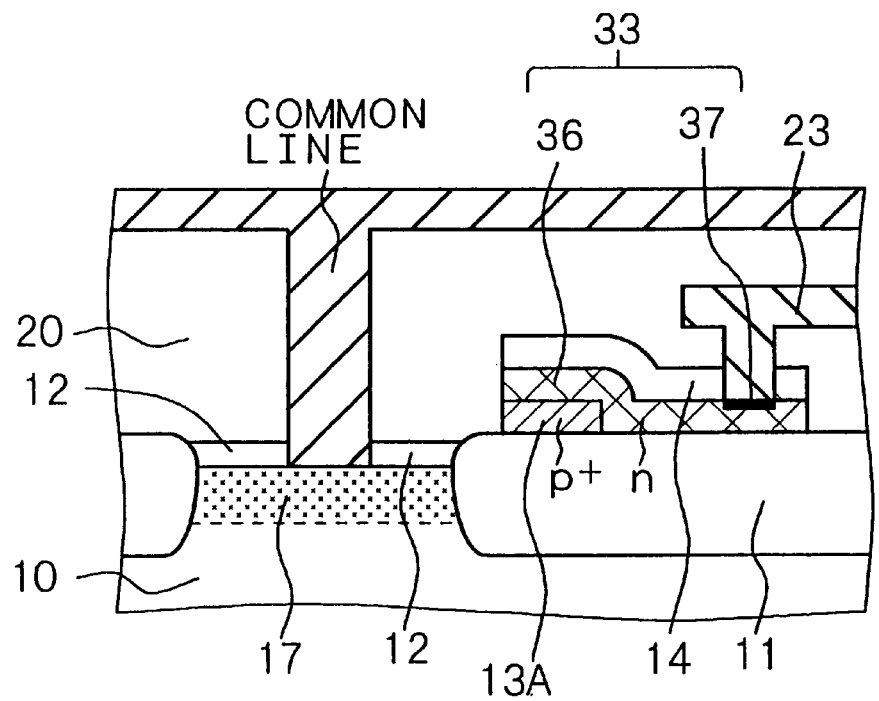
FIG. 15 is a schematic, partial cross-sectional view of a variant of the memory cell in Example 4.

Alternatively, the second non-linear resistance element 33 can be formed of a hetero-junction diode such as a Schottky barrier diode. FIG. 15 shows a schematic, partial cross-sectional view, which is similar to that taken along arrows B—B in FIG. 14A. In FIG. 15, reference numeral 37 stands for a silicide layer, reference numeral 36 is a semiconductor region containing an n-type dopant, and a hetero-junction diode is formed of the semiconductor region 36 and the silicide layer 37. The second non-linear resistance element 33 formed of the above hetero-junction diode, or particularly, the silicide layer can be substantially formed by the method explained in Example 3, and detailed explanations thereof are therefore omitted. The material for forming the hetero-junction diode can be selected from, for example, titanium silicide, cobalt silicide or tungsten silicide or can be selected from other metal materials such as molybdenum. When the second non-linear resistance element 33 is formed of a hetero-junction diode, $VF_2$ can be controlled by properly selecting an annealing temperature or a metal for forming a silicide.

The constitution of the above-explained second non-linear resistance element 33 can be applied to all of memory cells to be explained in Examples 5 to 10 to be described later. That is, in the memory cells in Examples 5 to 10, the same second non-linear resistance element as that in Example 4 can be formed on or in a first gate extended region. In each of Examples 5 to 10, the principle and equivalent circuit of the memory cell having the second non-linear resistance element are as shown in FIGS. 6A and 6B and FIGS. 7A and 7B. The (first) non-linear resistance element and the second non-linear resistance element may be structurally the same or different.

EXAMPLE 5

Figure 16:
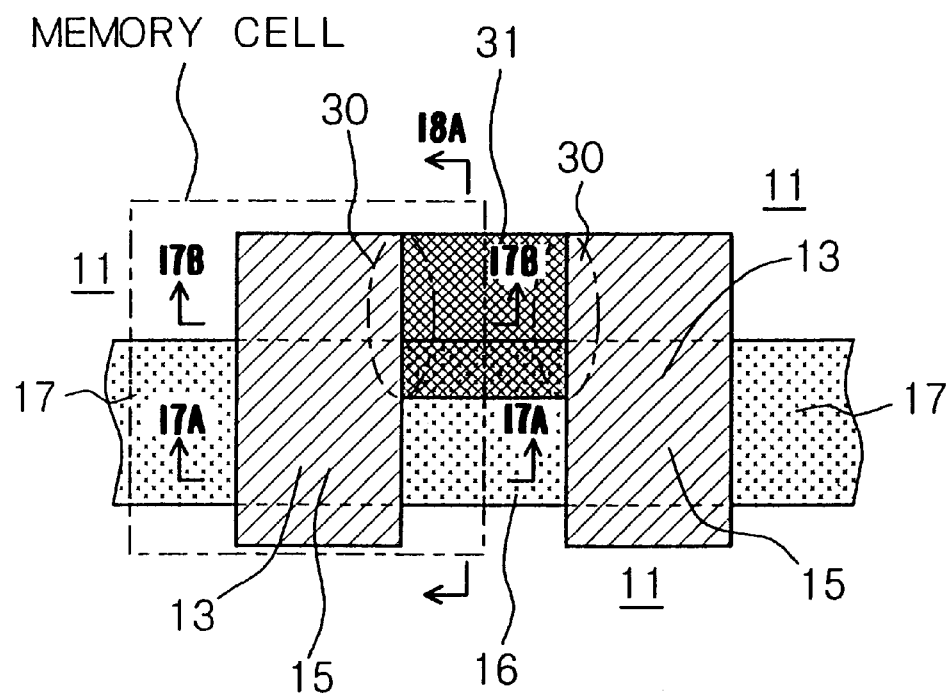
FIG. 16 is a schematic, partial layout of a memory cell in Example 5.
Figure 17A:
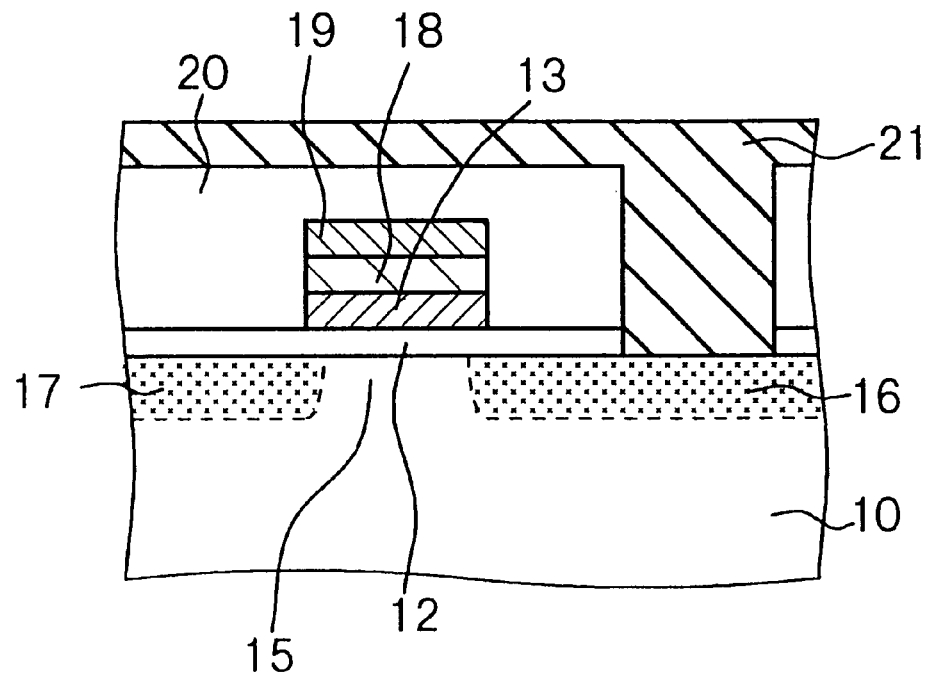
FIGS. 17A and 17B are schematic, partial cross-sectional views of the memory cell in Example 5.
Figure 17B:
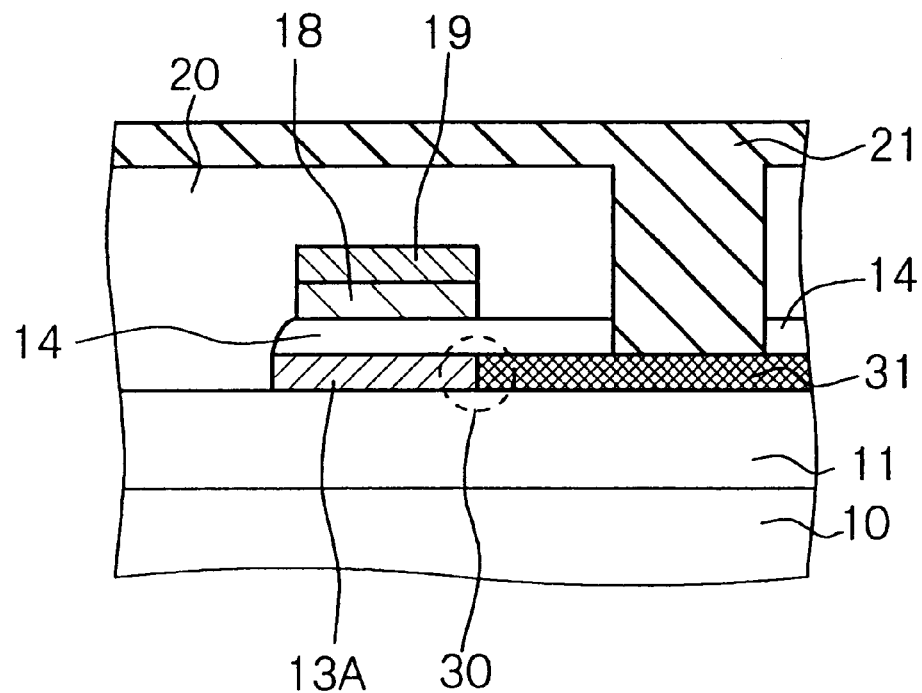
Figure 18A:
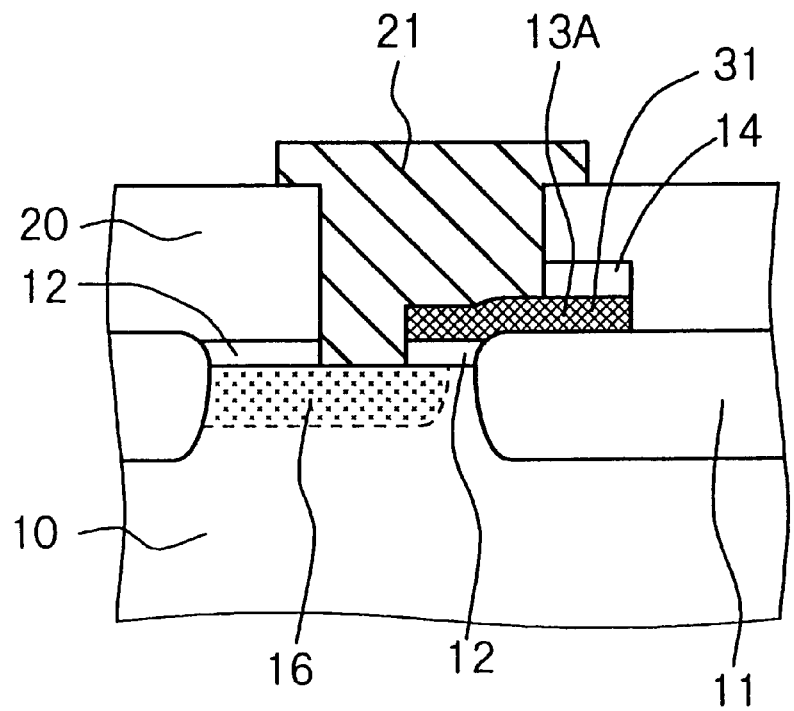
FIGS. 18A and 18B are schematic, partial cross-sectional views of the memory cell in Example 5.
Figure 18B:
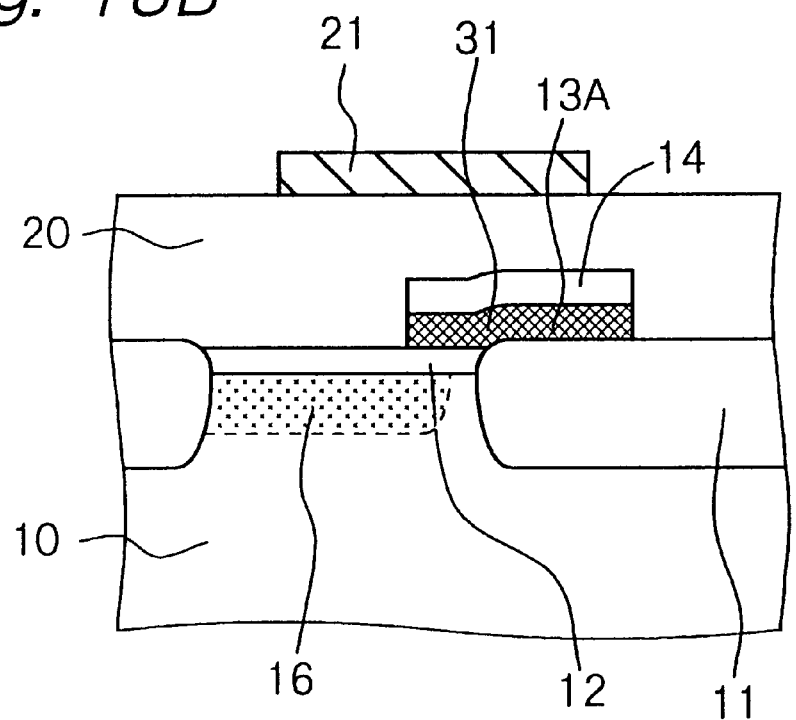

Example 5 is concerned with the memory cell according to the first B configuration of the present invention and further with the process for the manufacture of the memory cell according to the first aspect of the present invention. FIGS. 3B and 3C show equivalent circuits of the memory cell of Example 5. FIG. 16 shows a schematic layout of first gates 13, a first gate extended region 13A, channel forming regions 15, a drain region 16, source regions 17 and non-linear resistance elements 30 in two adjacent memory cells. Further, FIGS. 17A and 17B and FIGS. 18A and 18B show schematic, partial cross-sectional views. FIG. 17A is a schematic, partial cross-sectional view taken along arrows A—A in FIG. 16. FIG. 17B is a schematic, partial cross-sectional view taken along arrows B—B in FIG. 16. FIG. 18A is a schematic, partial cross-sectional view taken along arrows C—C in FIG. 16 (including a contact hole). FIG. 18B is a schematic, partial cross-sectional view taken along arrows C—C in FIG. 16 (including no contact hole).

The memory cell of Example 5 can have the same constitution as that explained in Example 1 except that where the non-linear resistance element 30 is formed and that the semiconductor region 31 which is the end B of the non-linear resistance element 30 and one source/drain region (drain region 16) are connected to the bit line (BL) 21 through a so-called shared contact hole.

That is, the memory cell of Example 5 has the channel forming region 15, the first gate 13, the second gate 19 capacitively coupled with the first gate 13, the source/drain regions (the drain region 16 and the source region 17) formed in contact with the channel forming region 15 and spaced from each other, and the non-linear resistance element 30 with two ends (end A and end B). The first gate 13 is formed on the insulation layer 12 (so-called gate insulation layer), and the first gate 13 and the channel forming region face each other through the insulation layer 12. The second gate 19 is capacitively coupled with the first gate 13 through the dielectric film 18. The second gate 19 is connected to the word line WL. Specifically, the second gate 19 has a common region with the word line WL.

In Example 5, the non-linear resistance element 30 also has characteristics explained in Example 1, and more specifically, it is formed of a pn junction diode having a lateral pn junction. Part of the non-linear resistance element 30 formed of a pn junction diode is formed in a first gate extended region 13A on the insulation layer 12 formed on one source/drain region (the drain region 16 in Example 5). Further, the rest of the non-linear resistance element 30 is formed in the first gate extended region 13A on an insulation region (device separation region 11).

That is, the pn junction diode constituting the non-linear resistance element 30 has a semiconductor region 31 which is the same as the source/drain regions 16 and 17 in conductivity type (e.g., n-type) and a semiconductor region (the first gate extended region 13A) which is opposite to the source/drain regions 16 and 17 in conductivity type (e.g., p-type). The first gate extended region 13A corresponds to the end A of the non-linear resistance element 30, and the semiconductor region 31 corresponds to the end B of the non-linear resistance element 30. Further, a lateral pn junction is formed in a boundary region between the first gate extended region 13A and the semiconductor region 31. The semiconductor region 31 (e.g., n-type in conductivity type) which corresponds to the end B of the non-linear resistance element 30 and one source/drain region (the drain region 16 in Example 5) are connected to the bit line (BL) 21 through the shared contact hole.

The process for the manufacture of the memory cell of Example 5 is, in principle, the same as the process explained in Example 1 or 2, and detailed explanations thereof are therefore omitted.

Figure 19A:
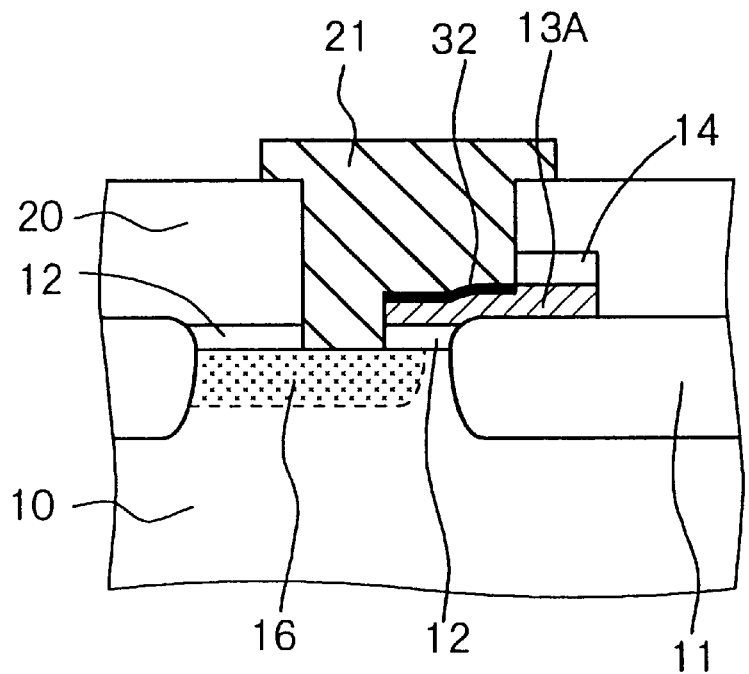
FIGS. 19A and 19B are schematic, partial cross-sectional views of a variant of the memory cell in Example 5.
Figure 19B:
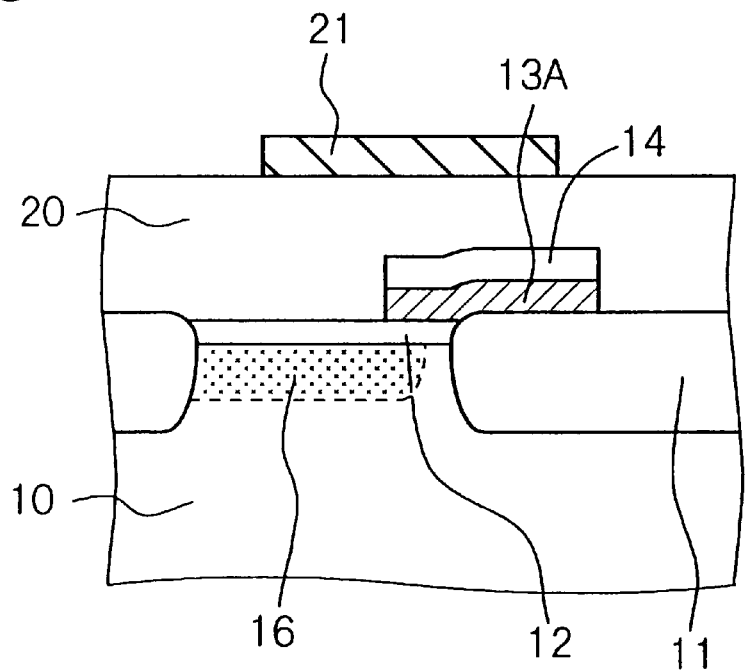
Figure 20:
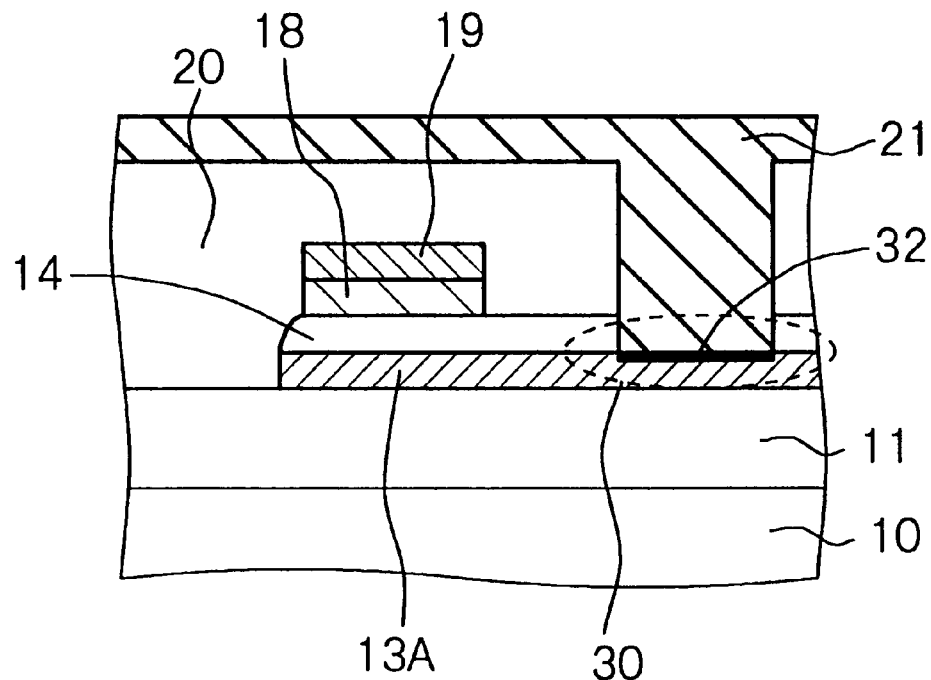
FIG. 20 is a schematic, partial cross-sectional view of the variant of the memory cell in Example 5.

Alternatively, as FIGS. 19A, 19B and 20 show schematic, partial cross-sectional views, the non-linear resistance element 30 may be formed of a hetero-junction diode, for example, by forming a silicide layer 32 on the surface region of part of the first gate extended region 13A positioned in the bottom portion of the shared contact hole. The schematic, partial cross-sectional views of the memory cell shown in FIGS. 19A and 19B are similar to the schematic, partial cross-sectional views of the memory cell shown in FIGS. 18A and 18B. The schematic, partial cross-sectional view of the memory cell shown in FIG. 20 is similar to the schematic, partial cross-sectional view of the memory cell shown in FIG. 17B.

EXAMPLE 6

Figure 21:
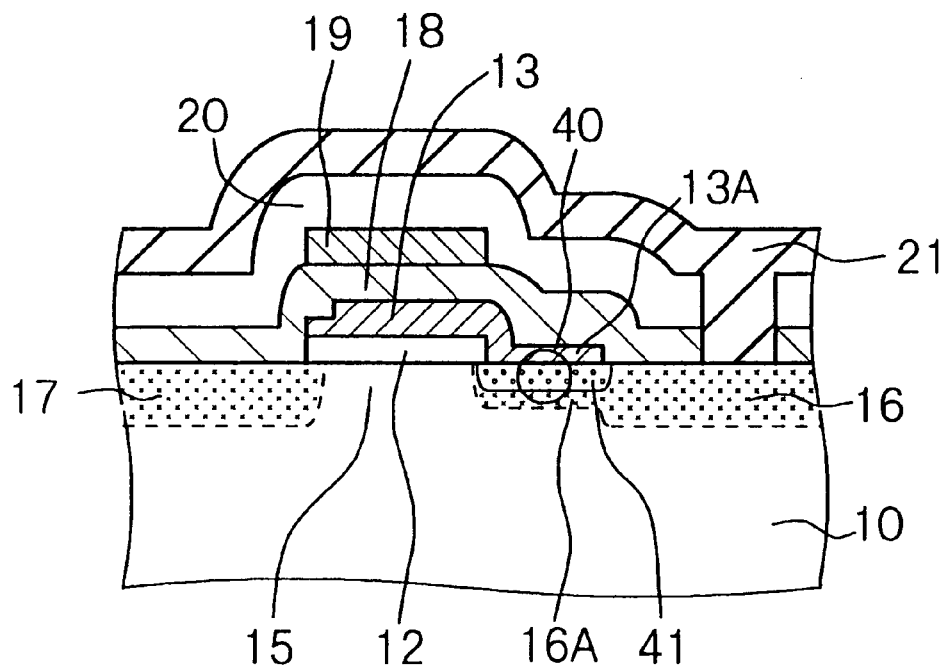
FIG. 21 is a schematic, partial cross-sectional view of a memory cell in Example 6.

Example 6 is concerned with the memory cell according to the first C configuration of the present invention and further with the process for the manufacture of the memory cell according to the second aspect of the present invention. FIG. 21 shows a schematic, partial cross-sectional view of the memory cell of Example 6, and FIGS. 4A and 4B show a fundamental, principle drawing and an equivalent circuits thereof. The memory cell of Example 6 has a channel forming region 15, a first gate 13, a second gate 19 capacitively coupled with the first gate 13, source/drain regions 16 and 17 (drain region 16 and source region 17) formed in contact with the channel forming region 15 and spaced from each other, and a non-linear resistance element 40 with two ends (end A and end B). In Example 6, one end (the end A) of the non-linear resistance element 40 is connected to the first gate 13, and the other end (the end B) of the non-linear resistance element 40 is connected to one source/drain region (the drain region 16). The first gate 13 is formed on an insulation layer 12 (so called gate insulation layer), and the first gate 13 and the channel forming region 15 face each other through the insulation layer 12. The second gate 19 is capacitively coupled with the first gate 13 through a dielectric film 18. The second gate 19 is connected to a word line WL. Specifically, the second gate 19 has a common region with the word line WL. One source/drain region (the drain region 16) is connected to a bit line (BL) 21.

The memory cell of Example 6 also has characteristics that it is brought into a low resistive state when a predetermined voltage is applied. That is, the non-linear resistance element 40 has the same characteristics as those explained in Example 1, and it is formed of a diode of which the reverse conduction voltage ($V_{R1}$) is controlled to a defined value, more specifically, of a pn junction diode. The pn junction diode has two regions. One region of the pn junction diode has a conductivity type (e.g., p-type) opposite to the conductivity type of the source/drain regions 16 and 17 (e.g., n-type), and corresponds to one end (the end A) of the non-linear resistance element 40. This region of the pn junction diode is referred to as "opposite conductivity-type region 41". The opposite conductivity-type region 41 is formed in the surface region of one source/drain region (the drain region 16). The other region of the pn junction has the same conductivity type (e.g., n-type) as the conductivity type of the source/drain regions 16 and 17, corresponds to the other end (the end B) of the non-linear resistance element 40, and has a common region with one source/drain region (the drain region 16). That is, in the surface of a region 16A having a relatively low dopant (impurity) concentration in the drain region 16, there is formed the opposite conductivity-type region 41. A first gate extended region 13A is in contact with the surface of the opposite conductivity-type region 41. In the non-linear resistance element 40 formed of the above pn junction diode, the reverse conduction voltage ($V_{R1}$) is controlled to a defined value. More specifically, the control of the reverse conduction voltage ($V_{R1}$) uses a Zener breakdown or a avalanche breakdown, or uses a punchthrough in the depth direction of the drain region 16. When the Zener breakdown or the avalanche breakdown is used, it is sufficient to control the dopant (impurity) concentration in the drain region 16 or 16A to, for example, $10^{17}/cm^3$ to $10^{19}/cm^3$ for obtaining the defined value of the reverse conduction voltage ($V_{R1}$). On the other hand, when the punchthrough is used, it is sufficient to control the dopant (impurity) concentration in the opposite conductivity-type region 41 and the dopant (impurity) concentration in the region 16A in the drain region 16 below the opposite conductivity-type region 41.

The process for the manufacture of the memory cell of Example 6 shown in FIG. 21 will be explained with reference to FIGS. 22A, 22B and 22C which schematically show a semiconductor substrate and the like.

[Step-600]

First, a device separation region (not shown) having a LOCOS structure and/or a trench structure is formed in a semiconductor substrate 10 by a known method. Then, the semiconductor substrate 10 is ion-implanted with a p-type dopant for forming the channel forming region 15. Then, the surface of the semiconductor substrate 10 is treated by a heat oxidation method or a method in which heat nitriding is carried out after heat oxidation, to form the insulation layer 12 corresponding to a gate insulation layer on the semiconductor substrate 10. Then, a first polysilicon layer doped with, for example, a p-type dopant is deposited on the entire surface by a CVD method, and the first polysilicon layer and the insulation layer 12 are patterned so as to retain the first polysilicon layer to form part of the first gate 13. Then, a second polysilicon layer doped with, for example, a p-type dopant is deposited by a CVD method, and the second polysilicon layer is patterned, whereby the first gate 13 and the first gate extended region 13A can be formed. The above second polysilicon layer is required to be so thin that doped impurities can reach the surface region of the semiconductor substrate 10 in the subsequent step of ion-implantation with an n-type dopant. In the Figures, the first gate 13 is shown as one layer, while it is formed of the above two polysilicon layers. In this manner, the first gate 13 is formed on the insulation layer 12, and the first gate extended region 13A extending from the first gate 13 to a region (region in a semiconductor layer such as the semiconductor substrate 10 in Example 6, where a drain region is to be formed) can be formed on the semiconductor layer (the semiconductor substrate 10 in Example 6). That is, the above first gate extended region 13A extends from the first gate 13 to the semiconductor layer (the semiconductor substrate 10 in Example 6) where the opposite conductivity-type region 41 is to be formed. Further, the channel forming region 15 is formed below the first gate 13.

[Step-610]

Figure 22A:
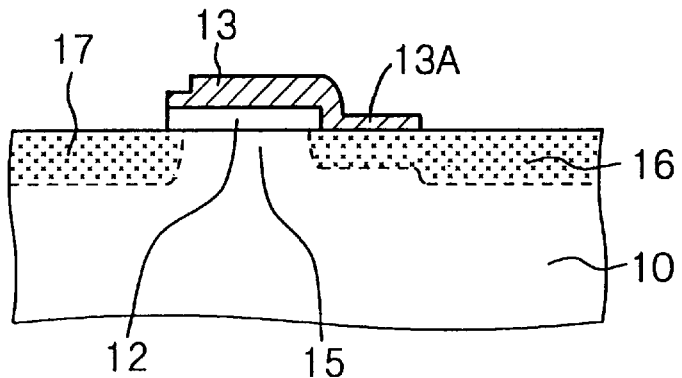
FIGS. 22A, 22B and 22C are schematic, partial cross sectional views of a semiconductor substrate, etc., for explaining the process for the manufacture of the memory cell in Example 6.
Figure 22B:
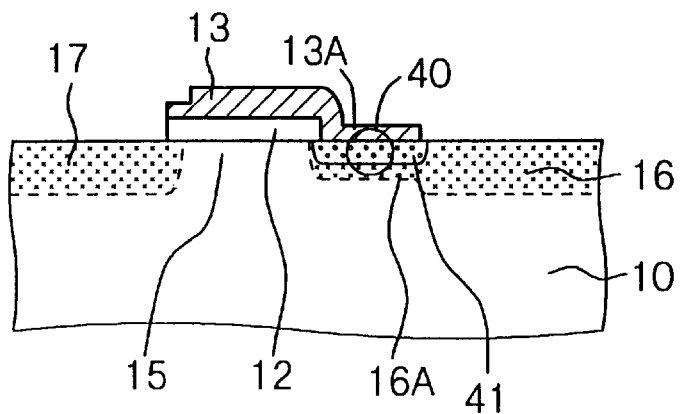
Figure 22C:
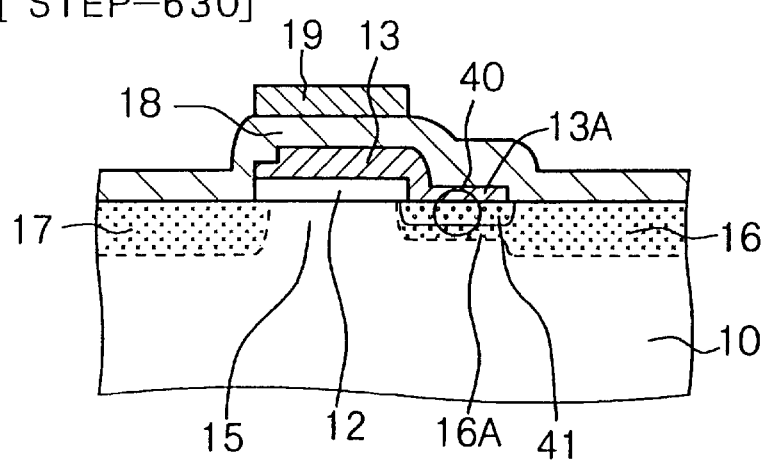

Then, the semiconductor substrate 10 is ion-implanted with an n-type dopant by ion implantation, to form the drain region 16 and the source region 17 (see FIG. 22A).

[step-620]

Then, the non-linear resistance element 40 composed of a pn junction diode is formed. For this purpose, for example, the dopant (impurity) from the second polysilicon layer constituting the first gate extended region 13A is diffused to the surface region of the drain region 16 below the first gate extended region 13A, or the surface region of the drain region 16 is ion-implanted with a p-type dopant, whereby the opposite conductivity-type region 41 is formed (see FIG. 22B). Then, the dopant (impurity) is annealed for activation. [Step-610] and [Step-620] may be reversed. In some cases, the formation of the opposite conductivity-type region 41 or the formation of the drain region 16 and the source region 17 may be carried out before the formation of the first gate 13 and the first gate extended region 13A.

[Step-630]

Then, an insulation interlayer, which works as the dielectric film 18 and is composed of, for example, $SiO_2$, $SiO_2/Si_xN_y$, $SiO_2/Si_xN_y/SiO_2$ or $Ta_2O_5/Si_xN_y$, is formed on the entire surface by a CVD method, a heat oxidation method, a heat nitriding method or a plasma nitriding method. Then, a polysilicon layer doped with, for example, an n-type dopant is deposited on the entire surface by a CVD method, and then the polysilicon layer is patterned, whereby the second gate 19 is formed (see FIG. 22C). The second gate 19 has a common region with the word line WL.

[Step-640]

Then, an insulation interlayer 20 formed of, for example, $SiO_2$ is deposited on the entire surface by a CVD method, and then an opening portion is formed in the insulation interlayer 20 above the drain region 16. Then, a wiring layer of, for example, an aluminum alloy is deposited on the insulation interlayer 20 and in the above opening portion by a sputtering method, and the wiring layer is patterned, thereby to form the bit line (BL) 21 electrically connected to the drain region 16. In this manner, the memory cell having a structure shown in FIG. 21 can be obtained.

Figure 23:
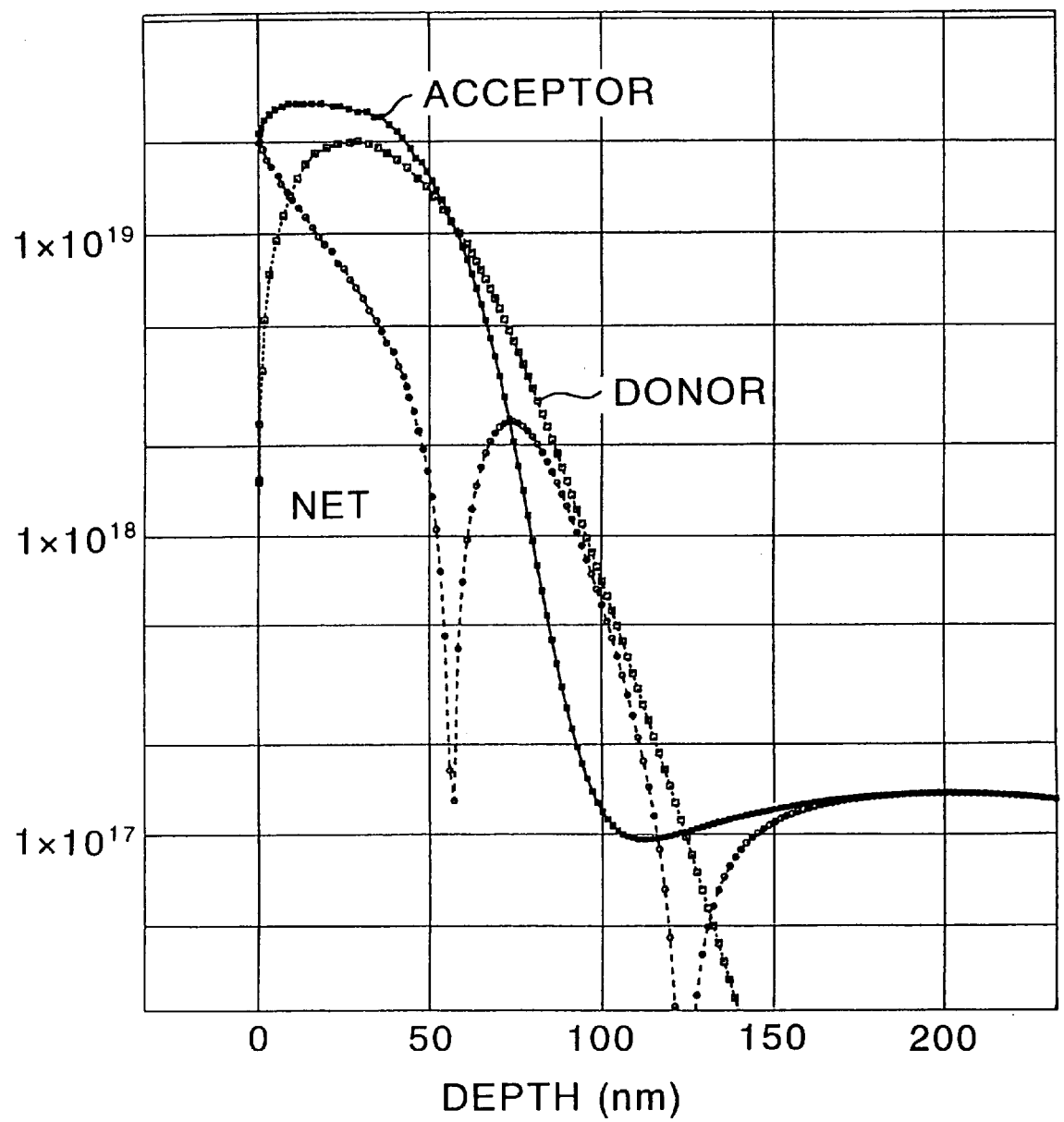
FIG. 23 shows results of simulation of dopant concentration profiles in a depth direction in an opposite conductivity-type region and a drain region present therebelow.
Figure 24:
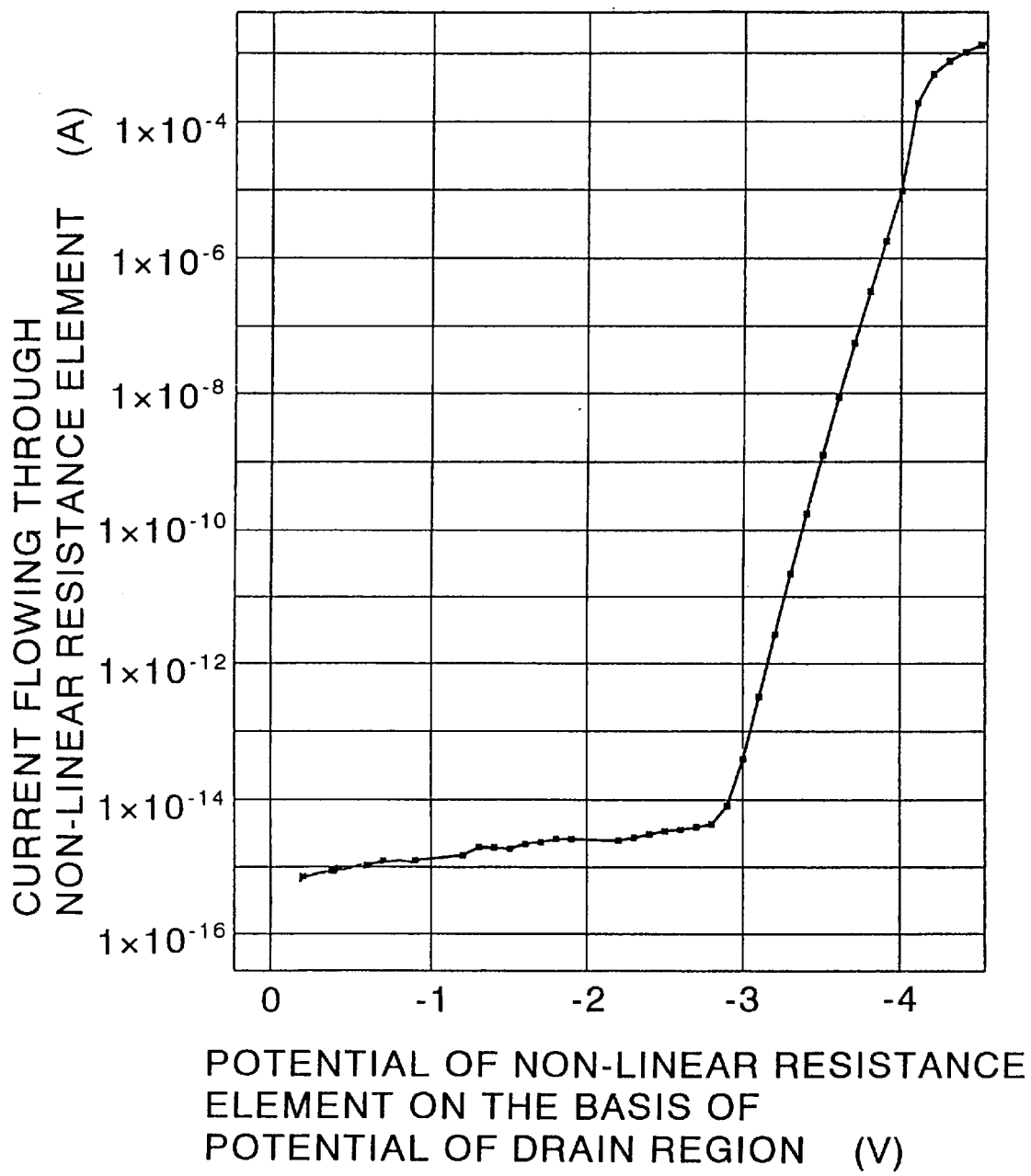
FIG. 24 shows the result of simulation of I–V characteristic of a non-linear resistance element in the dopant concentration profile shown in FIG. 23.
Figure 25:
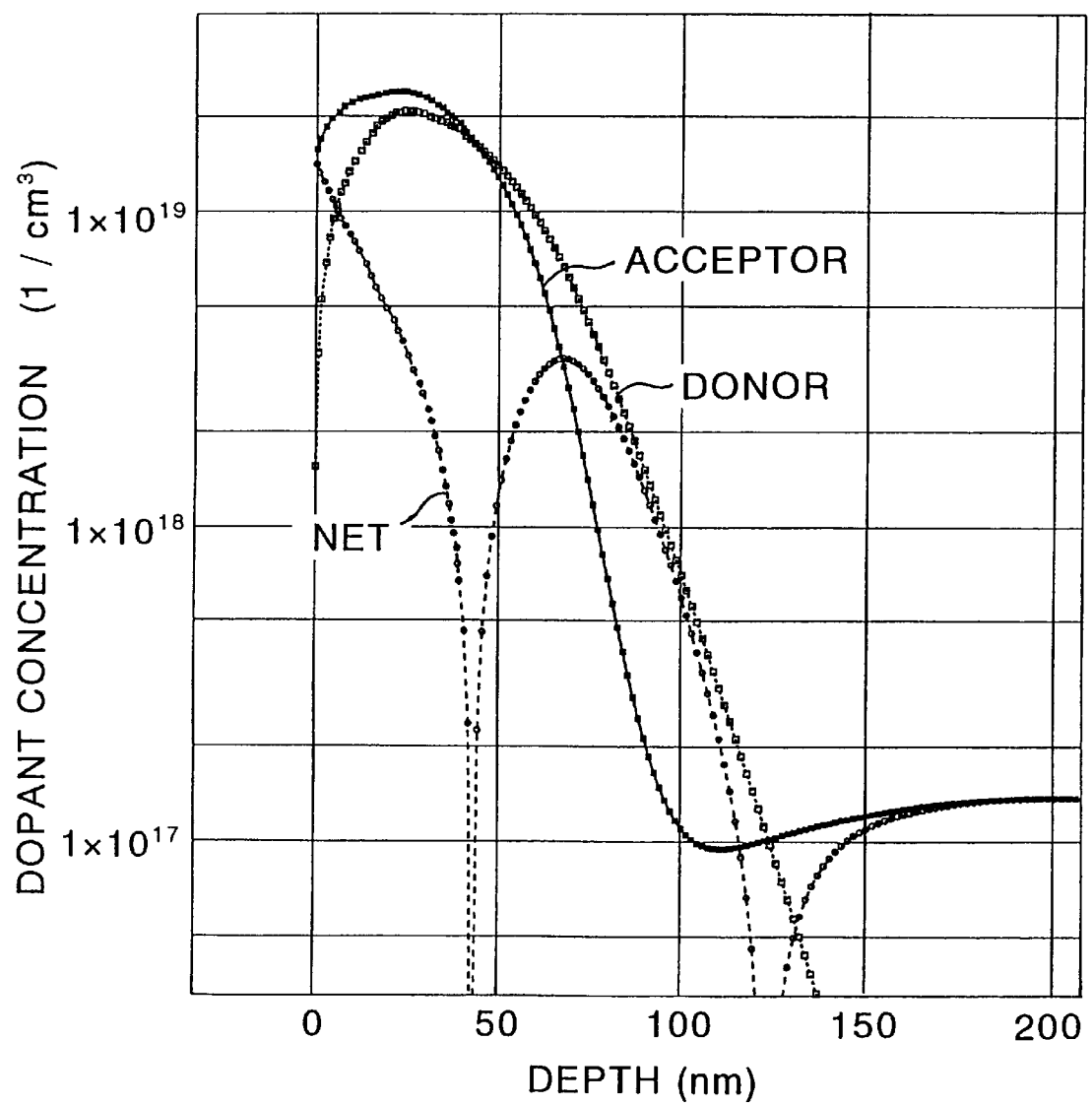
FIG. 25 shows results of simulation of dopant concentration profiles in a depth direction in an opposite conductivity-type region and a drain region present therebelow, different from those in FIG. 23.
Figure 26:
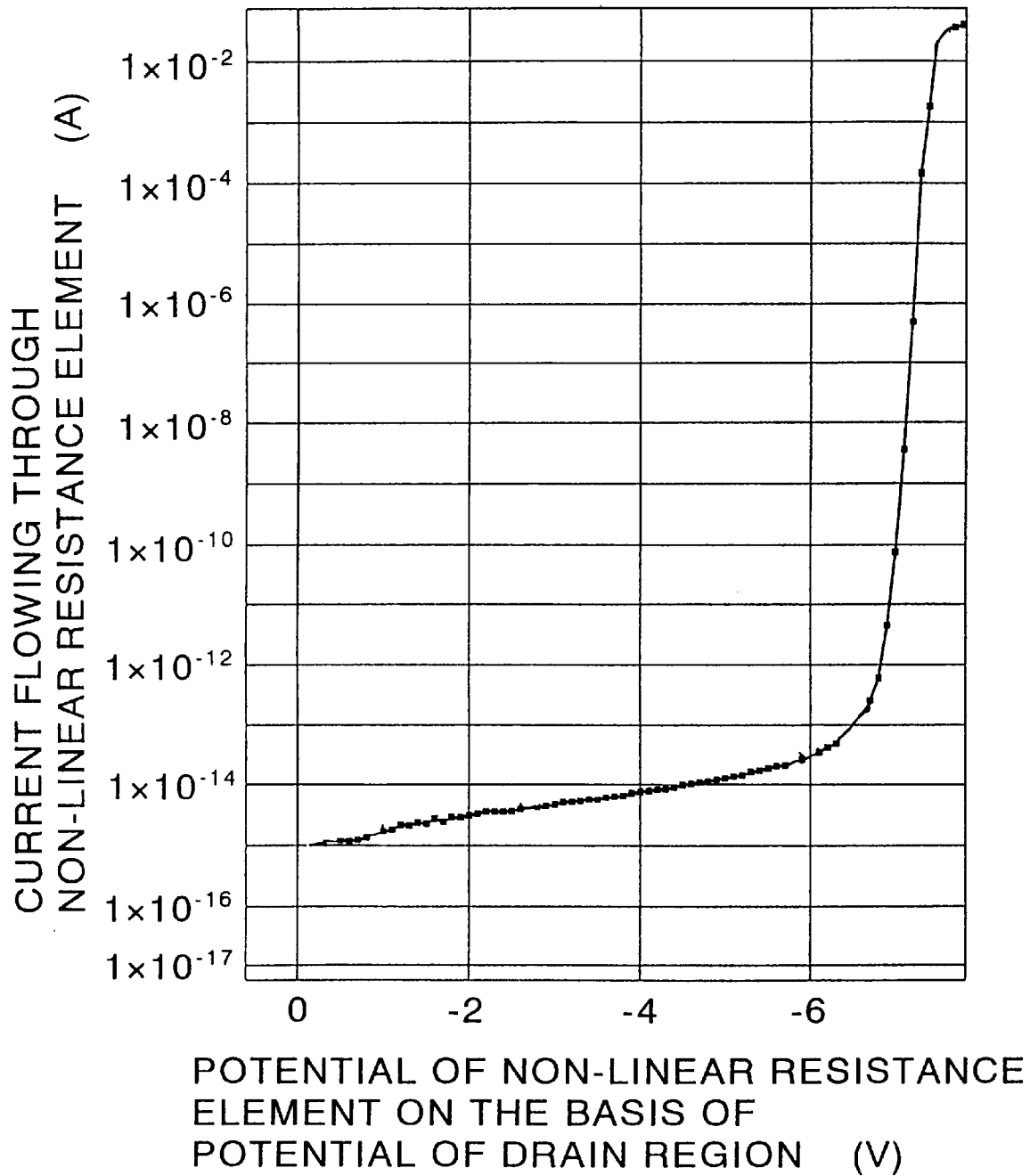
FIG. 26 shows the result of simulation of I–V characteristic of a non-linear resistance element in the dopant concentration profile shown in FIG. 25.

FIG. 23 shows simulation results of a dopant (impurity) concentration profile (1) in the depth direction in the opposite conductivity-type region 41 and the drain region 16 below it. FIG. 25 shows simulation results of another dopant (impurity) concentration profile (2) in the depth direction in the opposite conductivity-type region 41 and the drain region 16 below it. Ion implanting conditions of each simulation are as shown in Table 7 to follow later. In FIGS. 23 and 25, the axis of ordinates shows dopant (impurity) concentrations (unit: $1/cm^3$), and the axis of abscissas shows depths (unit:nm) from the surface of the opposite conductivity-type region 41. In FIGS. 23 and 25, "■" shows an acceptor concentration, "□" shows a donor concentration, and "○" shows a net dopant concentration. FIGS. 24 and 26 show simulation results of I–V characteristics of the non-linear resistance element 40 in the dopant (impurity) concentration profiles shown in FIGS. 23 and 25. The design rule was set at 0.25 $\mu$m. A punchthrough is used for the control of the reverse conduction voltage ($V_{R1}$). Table 8 shows the simulation results. In the dopant (impurity) concentration profile (1) shown in FIG. 23, the value of the reverse conduction voltage ($V_{R1}$) was about −3 V, and in the dopant (impurity) concentration profile (2) shown in FIG. 25, the value of the reverse conduction voltage ($V_{R1}$) was about −7 V. As explained above, by controlling the dopant (impurity) concentration profile in the depth direction in the opposite conductivity-type region 41 and the drain region 16 below it, the reverse conduction voltage ($V_{R1}$) can be controlled. In Table 8, $I_{F1}$, $I_{R1}$ and $I_{R2}$ show values obtained when the junction portion had a width (length of junction portion in left-to-right direction on surface in FIG. 21) of 0.35 $\mu$m and a depth (length of junction portion in the direction perpendicular to surface in FIG. 21) of 10 $\mu$m.

TABLE 7

Dopant concentration profile (1)

Ion implanting conditions of n-type dopant

| Deposition of 0.01 $\mu$m thick insulation layer | |
|---|---|
| Ion species: | As |
| Acceleration energy: | 35 keV |
| Dose: | 1.04 × $10^{13}$/$cm^2$ |

Ion implanting conditions of p-type dopant

| Deposition of 0.03 $\mu$m thick insulation layer | |
|---|---|
| Ion species: | $BF_2$ |
| Acceleration energy: | 20 keV |
| Dose: | 8 × $10^{15}$/$cm^2$ |

Dopant concentration profile (2)

Ion implanting conditions of n-type dopant

| Deposition of 0.01 $\mu$m thick insulation layer | |
|---|---|
| Ion species: | As |
| Acceleration energy: | 35 keV |
| Dose: | 1.04 × $10^{13}$/$cm^2$ |

Ion implanting conditions of p-type dopant

| Deposition of 0.0288 $\mu$m thick insulation layer | |
|---|---|
| Ion species: | $BF_2$ |
| Acceleration energy: | 20 keV |
| Dose: | 8 × $10^{15}$/$cm^2$ |

TABLE 8

Dopant concentration profile (1)

| $V_{F1}$: | about 0.6 V |
|---|---|
| $I_{F1}$: | 7 × $10^{-8}$ A |
| $I_{R1}$: | 3 × $10^{-15}$ A (average) |
| $V_{R1}$: | about −3 V |
| $I_{R2}$: | 6 × $10^{-14}$ A |

TABLE 8-continued

Dopant concentration profile (2)

| | |
|---|---|
| $V_{F1}$: | about 0.6 V |
| $I_{F1}$: | $7 \times 10^{-8}$ A |
| $I_{R1}$: | $1 \times 10^{-14}$ A (average) |
| $v_{R1}$: | about −7 V |
| $I_{R2}$: | $1 \times 10^{-12}$ A |

EXAMPLE 7

Figure 27A:
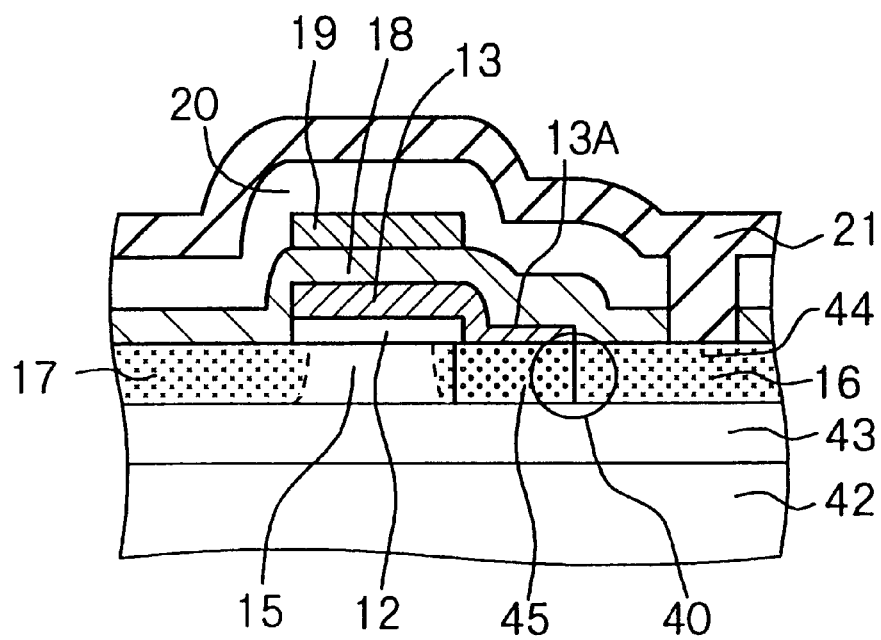
FIGS. 27A and 27B are a schematic, partial cross-sectional view and a layout of a memory cell in Example 7.
Figure 27B:
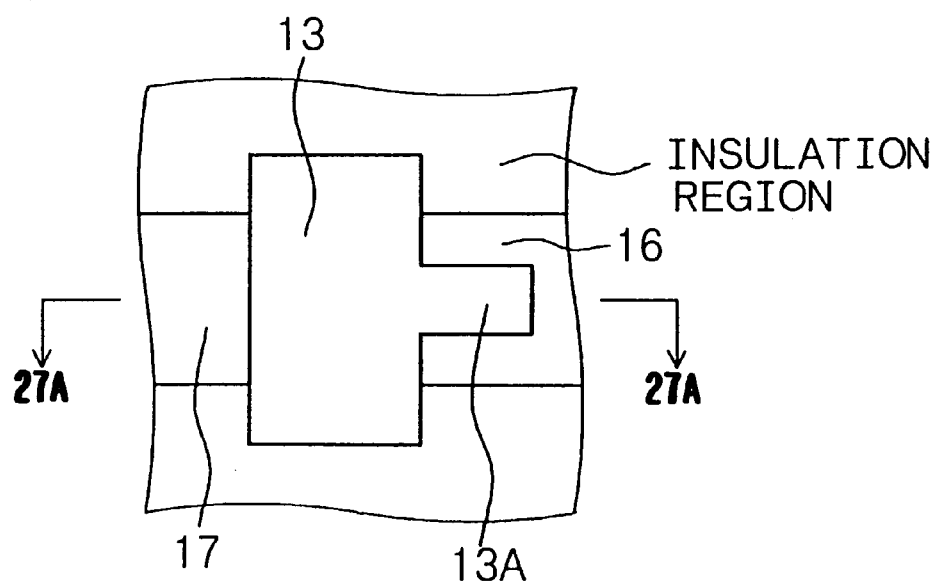

Example 7 is a variant of the memory cell of Example 6. As shown in the schematic, partial cross-sectional view of FIG. 27A, the memory cell of Example 7 differs from the memory cell of Example 6 in that the memory cell has a so-called SOI structure and that a non-linear resistance element 40 is formed of an opposite conductivity-type region 45 (containing, e.g., a p-type dopant) formed all through the entire thickness direction of a silicon layer 44 and a drain region 16 (containing, e.g., a p-type dopant). The pn junction diode has two regions. One region of the pn junction diode is an opposite conductivity-type region 45 which has a conductivity type (e.g., p-type) opposite to the conductivity type (e.g., n-type) of the source/drain regions 16 and 17, corresponds to one end (the end A) of the non-linear resistance element 40 and is formed in part of one source/drain region (the drain region 16). The other region of the pn junction diode corresponds to the other end (the end B) of the non-linear resistance element 40 and has a common region with one source/drain region (the drain region 16 in Example 7). The pn junction diode constituting the non-linear resistance element 40 has a lateral pn junction and is formed in a silicon layer 44 which is a single crystal semiconductor region. FIG. 27B shows a schematic layout of the first gate 13, the first gate extended region 13A, the drain region 16 and the source region 17. FIG. 27A shows the schematic, partial cross sectional view taken along arrows A—A in FIG. 27B. The opposite conductivity-type region 45 is formed below the first gate extended region 13A, and is formed in part of the drain region 16 in a width direction. When the non-linear resistance element 40 has the above constitution, a pn junction area can be decreased, and the value of $I_{RP}$ can be decreased. As a result, information stored on or in the first gate 13 can be read out for a longer period of time.

Figure 28A:
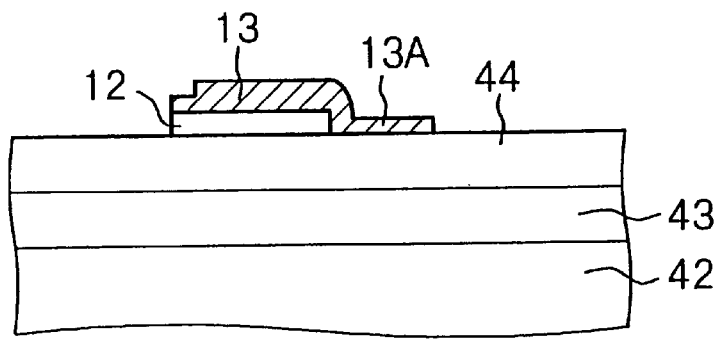
FIGS. 28A, 28B and 28C are schematic, partial cross sectional views of a semiconductor substrate, etc., for explaining the process for the manufacture of the memory cell in Example 7.

The process for the manufacture of the memory cell of Example 7 shown in FIGS. 27A and 27B will be explained with reference to FIGS. 28A, 28B and 28C which show schematic, partial cross-sectional views of a semiconductor substrate and the like.

[Step-700]

First, a single crystal thin-film silicon layer 44 is formed on a supporting substrate 42 such as a silicon semiconductor substrate through an insulation layer 43 formed of, for example, $SiO_2$ by a so-called bonding method in which substrates are bonded, ground and polished, by a SIMOX method, or by a lateral solid phase epitaxy method. Then, the silicon layer 44 is subjected to selective oxidation treatment to form a so-called field oxide film (insulation region) with retaining a region where memory cells are to be formed. Then, the surface of a semiconductor layer (the silicon layer 44 in Example 7) is treated by a heat oxidation method or a method in which heat nitriding is carried out after heat oxidation, to form an insulation layer 12 corresponding to a gate insulation layer on the surface of the silicon layer 44. Then, a first polysilicon layer doped with, for example, a p-type dopant is deposited on the entire surface by a CVD method, and then the first polysilicon layer and the insulation layer 12 are patterned so as to leave the first polysilicon layer which is to form part of the first gate 13. Then, a second polysilicon layer doped with, for example, a p-type dopant is deposited on the entire surface by a CVD method, and the second polysilicon layer is patterned, whereby the first gate 13 and the first gate extended region 13A can be formed. The above second polysilicon layer is required to be so thin that doped impurities can reach the silicon layer 44 in the subsequent step of ion implantation with an n-type dopant. In the Figures, the first gate 13 is shown as one layer, while it is formed of the above two polysilicon layers. In this manner, the first gate 13 is formed on the insulation layer 12, and the first gate extended region 13A extending from the first gate 13 to a region where one of the source/drain regions is to be formed in a semiconductor layer (the silicon layer 44 in Example 7) can be formed on the semiconductor layer (the silicon layer 44 in Example 7) (see FIG. 28A). That is, the first gate extended region 13A extends from the first gate 13 to a region where the opposite conductivity-type region 45 is to be formed in the semiconductor layer (the silicon layer 44 in Example 7). The first gate extended region 13A preferably has a plane shape as shown in FIG. 27B, while the plane shape of the first gate extended region 13A shall not be limited thereto.

[Step-710]

Figure 28B:
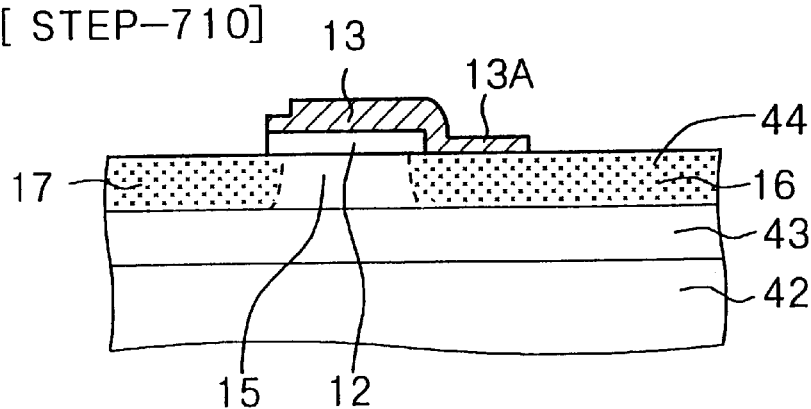
Figure 28C:
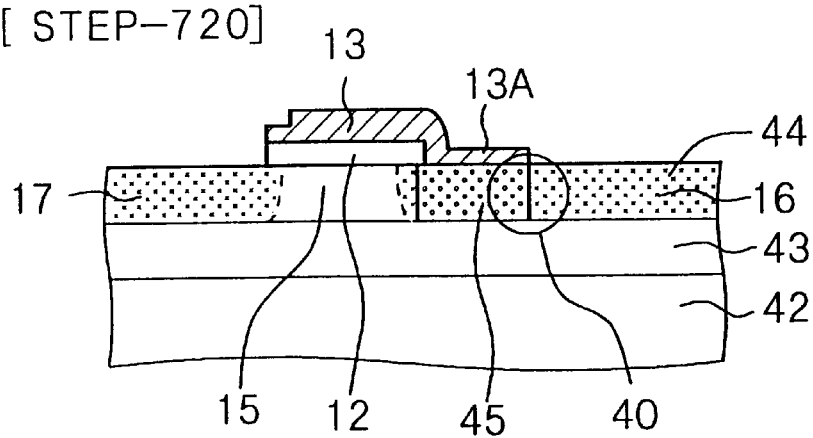

Then, the silicon layer 44 is ion-implanted with, for example, an n-type dopant by ion implantation, to form the drain region 16 and the source region 17 (see FIG. 28B).

[Step-720]

The silicon layer 44 below the first gate extended region 13A is ion-implanted with, for example, a p-type dopant all through the thickness direction of the silicon layer 44 to form the opposite conductivity-type region 45, for forming the non-linear resistance element 40 composed of a pn junction diode (see FIG. 28C). Then, the implanted dopant (impurity) is annealed for activation. [Step-710] and [Step-720] may be reversed in order. In some cases, the opposite conductivity-type region 45 may be formed before the formation of the first gate 13 and the first gate extended region 13A.

[Step-730]

Then, an insulation interlayer which works as the dielectric film 18 and is composed of, for example, $SiO_2$, $SiO_2/Si_xN_y$, $SiO_2/Si_xN_y$, $SiO_2/Si_xN_y/SiO_2$ or $Ta_2O_5/Si_xN_y$ is formed on the entire surface by a CVD method, a heat oxidation method, a heat nitriding method or a plasma nitriding method. Then, a polysilicon layer doped with, for example, an n-type dopant is deposited on the entire surface by a CVD method, and then the polysilicon layer is patterned, to form the second gate 19. The second gate 19 has a common region with the word line WL.

[Step-740]

Then, an insulation interlayer 20 formed of, for example, $SiO_2$ is deposited on the entire surface by a CVD method, and then an opening portion is formed in the insulation interlayer 20 above the drain region 16. Then, a wiring layer of, for example, an aluminum alloy is deposited on the insulation interlayer 20 and in the above opening portion by a sputtering method, and the wiring layer is patterned, thereby to form the bit line (BL) 21 electrically connected to the drain region 16. In this manner, the memory cell having a constitution shown in FIGS. 27A and 27B can be obtained.

EXAMPLE 8

Figure 29:
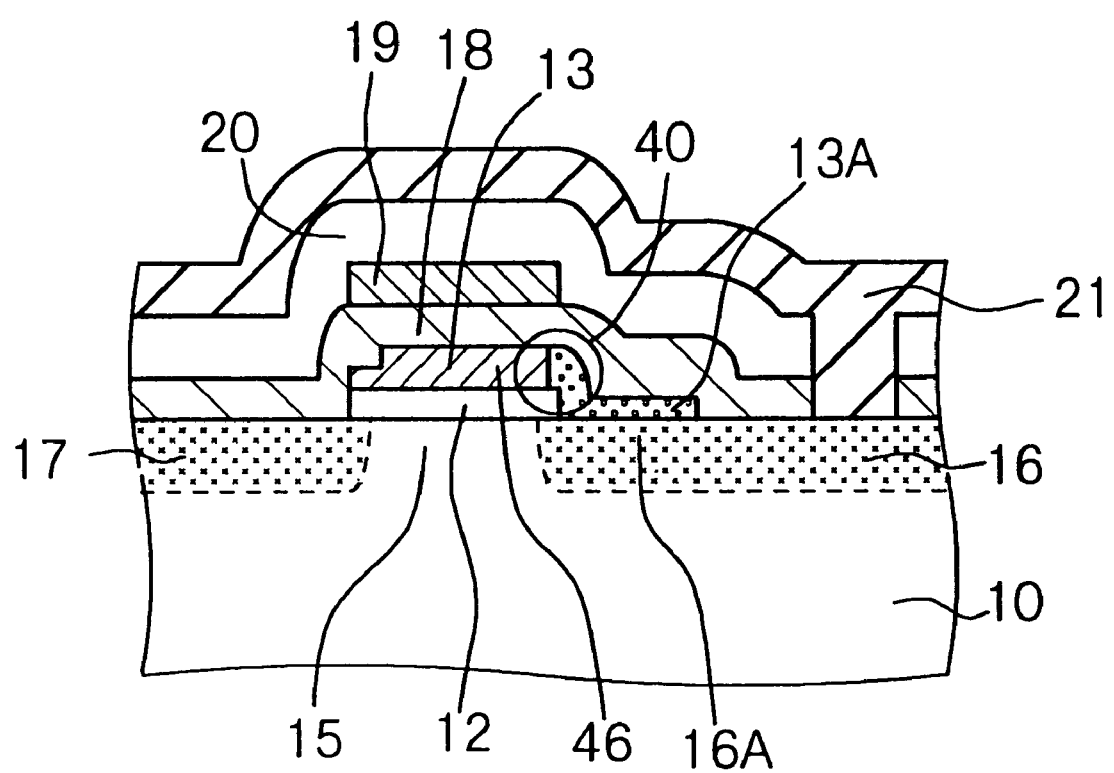
FIG. 29 is a schematic, partial cross-sectional view of a memory cell in Example 8.

The memory cell of Example 8 is also a variant of the memory cell of Example 6. The memory cell of Example 8 differs from the memory cell of Example 6 in the following points. That is, as FIG. 29 shows a schematic, partial cross-sectional view, the non-linear resistance element 40 is formed of a pn junction diode having two regions. One region of the pn junction diode has a conductivity type (e.g., p-type) opposite to the conductivity type (e.g., n-type) of the source/drain regions 16 and 17, corresponds to one end (the end A) of the non-linear resistance element, and has a common region with the first gate 13. The other region of the pn junction diode region has a conductivity type (e.g., n-type) which is the same as the conductivity type (e.g., n-type) of the source/drain regions 16 and 17, corresponds to the other end (the end B) of the non-linear resistance element 40, and is formed in the first gate extended region 13A extending from the first gate 13 to one source/drain region (the drain region 16). That is, the pn junction diode is composed of the first gate 13 containing, e.g., a p-type dopant and the first gate extended region 13A (containing, e.g., an n-type dopant) extending from the first gate 13 to the drain region 16. When the non-linear resistance element 40 has the above constitution, the pn junction area can be decreased and the value of $I_{R1}$ can be decreased as well. As a result, information stored on or in the first gate 13 can be read out for a longer period of time.

The process for the manufacture of the memory cell of Example 8 shown in FIG. 29 will be explained hereinafter.

[Step-800]

First, in the same manner as in [Step-600] of Example 6, a device separation region (not shown) having a LOCOS structure and/or a trench structure is formed in a semiconductor substrate 10 by a known method. Then, the surface of the semiconductor substrate 10 is treated by a heat oxidation method or a method in which heat nitriding is carried out after heat oxidation, to form an insulation layer 12 corresponding to a gate insulation layer on the semiconductor substrate 10. Then, a first amorphous silicon layer doped with, for example, a p-type dopant is deposited on the entire surface by a CVD method, and then the first amorphous silicon layer and the insulation layer 12 are patterned so as to retain the first amorphous silicon layer which is to form part of the first gate 13. Then, a natural oxide layer and surface contamination are intentionally removed to clean the surface, and then, a thin second amorphous silicon layer doped with, for example, a p-type dopant is deposited on the entire surface by a CVD method. Then, the amorphous silicon layer is heated approximately up to 700° C. in an inert gas atmosphere. As a result, the second amorphous silicon layer on the semiconductor substrate 10 is converted to a single crystal layer from a portion adjacent to the semiconductor substrate 10 and the single crystal layer laterally grows. Then, the single-crystallized silicon layer is patterned, whereby the first gate 13 and the first gate extended region 13A can be formed. The above second amorphous silicon layer is required to be so thin that doped impurities can reach the surface region of the semiconductor substrate 10 in the subsequent step of ion implantation with an n-type dopant. In FIG. 28, the first gate 13 is shown as one layer, while it is formed of the above two silicon layers. In this manner, the first gate 13 is formed on the insulation layer 12, and the first gate extended region 13A extending from the first gate 13 to a region where one of the source/drain regions is to be formed in a semiconductor layer (the semiconductor substrate 10 in Example 8) can be formed on the semiconductor layer (the semiconductor substrate 10).

[Step-810]

Then, the semiconductor substrate 10 is ion-implanted with, for example, an n-type dopant, to form the drain region 16 and the source region 17. In this case, the first gate extended region 13A is ion-implanted with the n-type dopant. When the first gate 13 is selectively masked with a resist material, the first gate 13 is left as the above-mentioned one region of the pn junction diode containing a p-type dopant, and the first gate 13 works as an opposite conductivity-type region 46 of the non-linear resistance element 40.

[Step-820]

Then, the same steps as [Step-630] and [Step-640] of Example 6 are carried out, whereby the memory cell having the structure shown in FIG. 29 can be obtained.

In Example 8, in [Step-800], a pn junction having a lateral pn junction can be formed in a single-crystallized silicon layer. When the pn junction is formed in the single-crystallized silicon layer, the leak current ($I_{Rf}$) of the non-linear resistance element 40 in a non-conductive state can be reliably decreased.

EXAMPLE 9

Figure 30A:
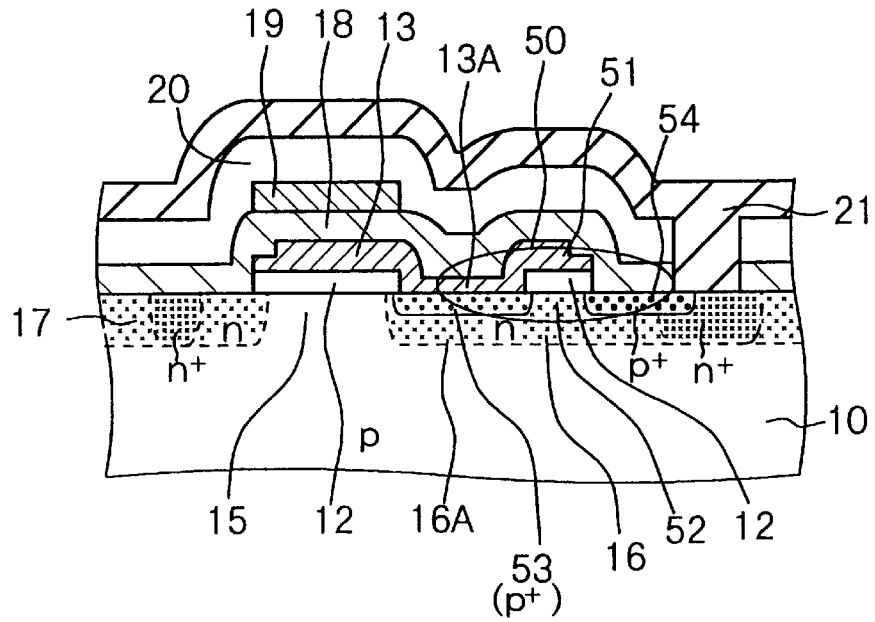
FIGS. 30A and 30B are a schematic, partial cross-sectional view and an equivalent circuit of a memory cell in Example 9.
Figure 30B:
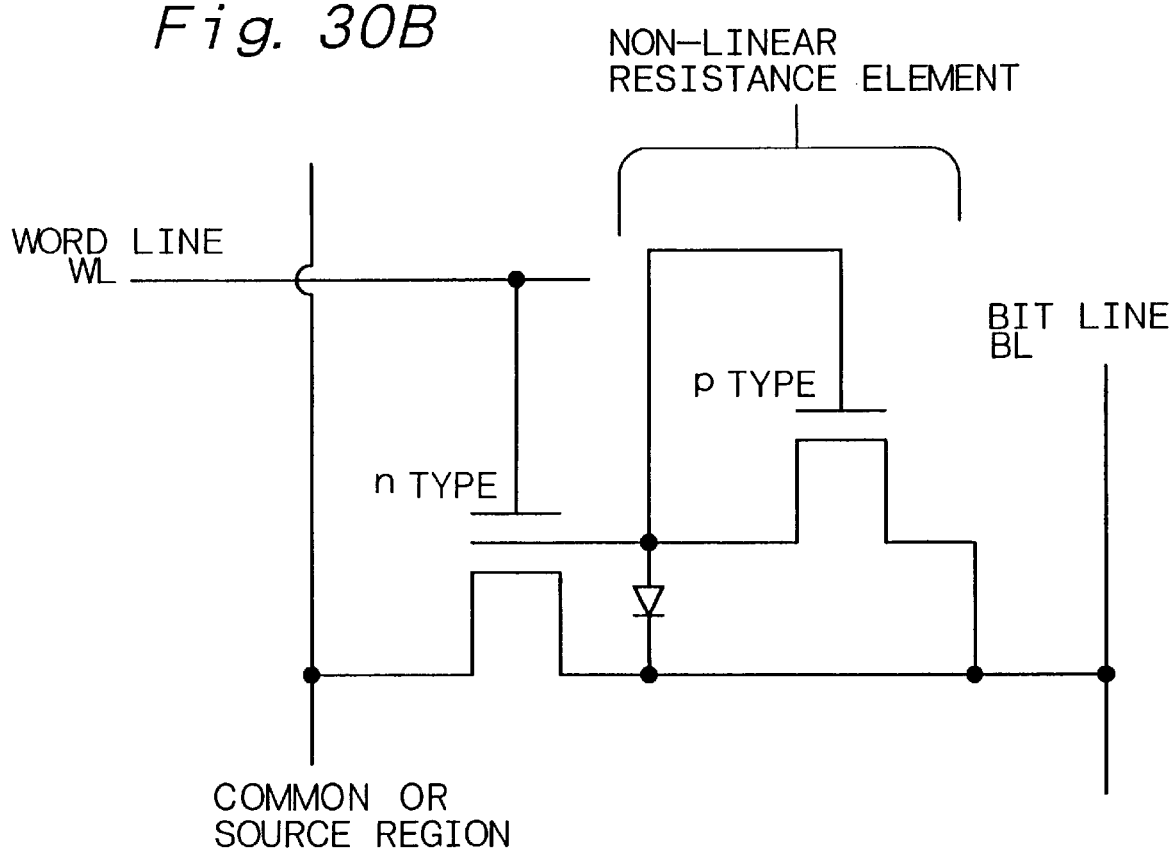

The memory cell of Example 9 has a non-linear resistance element 50 formed of a field effect transistor as FIG. 30A schematically shows its partial cross section and FIG. 30B shows its equivalent circuit. The above field effect transistor is formed in the surface region of one source/drain region (the drain region 16) of the memory cell. One source/drain portion (drain portion 53) of the field effect transistor is connected to the first gate 13. Further, the above one source/drain portion (the drain portion 53) is also connected to a gate portion 51 of the field effect transistor. When the memory cell is an n-type, the field effect transistor can be a p-type. In the Figures, reference numeral 52 indicates a channel forming region of the field effect transistor, and reference numeral 54 indicates a source portion of the field effect transistor.

The reverse conduction voltage ($V_{R1}$) of the non-linear resistance element 50 can be controlled on the basis of a gate threshold voltage of the field effect transistor. On the other hand, $V_{F1}$ can be controlled on the basis of a pn junction formed of the drain portion 53 of the field effect transistor and the drain region 16 of the memory cell. In the above pn junction, it is assumed that no punchthrough takes place. The process for the manufacture of the memory cell of Example 9 will be explained with reference to FIGS. 31A and 31B hereinafter.

[Step-900]

In the manufacture of the memory cell of Example 9, first, a device separation region (not shown) is formed in a semiconductor substrate 10 in the same manner as in [Step-600] of Example 6. Further, the surface of the semiconductor substrate 10 is ion-implanted with a p-type dopant by ion implantation to form the channel forming region 15 in the surface of the semiconductor substrate 10. Further, a portion which is to form the channel forming region of the non-linear resistance element is ion-implanted with an n-type dopant. Then, the surface of the semiconductor substrate 10 is treated by a heat oxidation method or a method in which heat nitriding is carried out after heat oxidation, to form the insulation layer 12 corresponding to a gate insulation layer on the semiconductor substrate 10. Then, a first polysilicon layer doped with, for example, a p-type dopant is deposited on the entire surface by a CVD method, and then the first polysilicon layer and the insulation layer 12 are patterned so as to leave the first polysilicon layer which is to form part of the first gate 13 and a gate portion 51 of the field effect transistor. Then, a second polysilicon layer doped with, for example, a p-type dopant is deposited on the entire surface by a CVD method, and the second polysilicon layer is patterned, whereby the first gate 13, the first gate extended region 13A and the gate portion 51 of the field effect transistor can be formed. The above second polysilicon layer is required to be so thin that doped impurities can reach the surface region of the semiconductor substrate 10 in the subsequent step of ion implantation with an n-type dopant. In the Figures, the first gate 13 and the gate portion 51 of the field effect transistor are shown as one layer each, while they are formed of the above two polysilicon layers. In this manner, the first gate 13 and the gate portion 51 of the field effect transistor can be formed on the insulation layer 12, and the first gate extended region 13A extending from the first gate 13 to a region where one end of the non-linear resistance element 50 is to be formed in a semiconductor layer (the semiconductor substrate 10 in Example 10) can be formed on the surface of the semiconductor substrate 10. The gate portion 51 of the field effect transistor corresponds to a top portion of the first gate extended region 13A.

[Step-910]

Figure 31A:
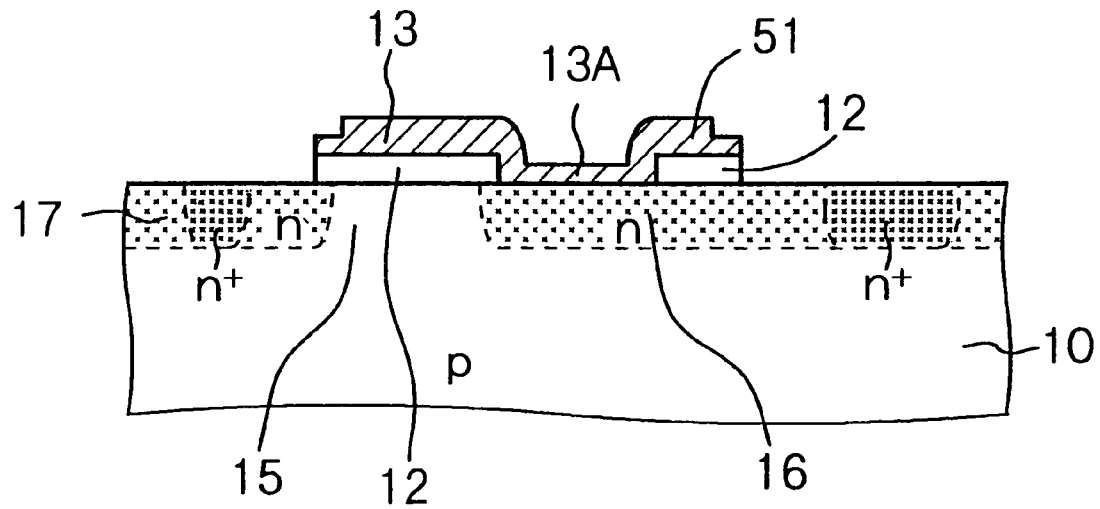
FIGS. 31A and 31B are schematic, partial cross sectional views of a semiconductor substrate, etc., for explaining the process for the manufacture of the memory cell in Example 9.

The semiconductor substrate 10 is ion-implanted with, for example, an n-type dopant by ion implantation, to form the drain region 16 and the source region 17 (see FIG. 31A). A region having a high concentration of a dopant (indicated by $n^+$ in the Figures) may be formed in part of the drain region 16 and the source region 17 as required.

[Step-920]

Figure 31B:
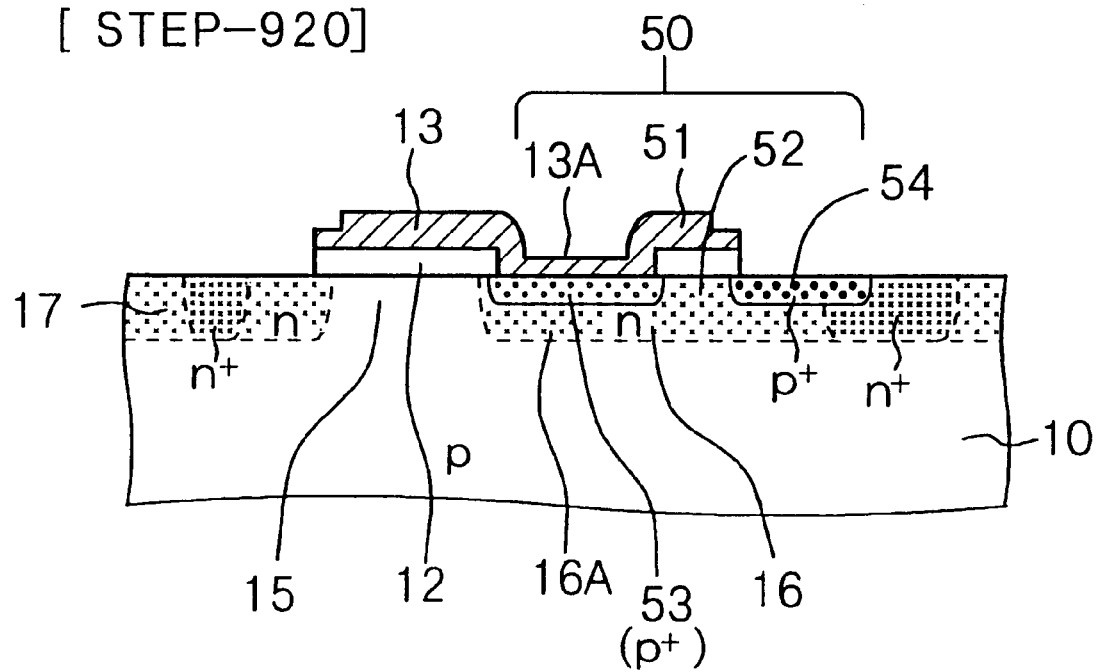

Then, the drain region 16 below the first gate extended region 13A and another portion of the drain region 16 are ion-implanted with, for example, a p-type dopant for forming the source/drain portions 53 and 54 of the field effect transistor which is to constitute the non-linear resistance element 50 (see FIG. 31B). Then, the ion-implanted dopant is annealed for activation. [Step-910] and [Step-920] may be reversed in order.

[Step-930]

Then, an insulation interlayer which works as the dielectric film 18 and is composed of, for example, $SiO_2$, $SiO_2/Si_xN_y$, $SiO_2/Si_xN_y/SiO_2$ or $Ta_2O_5/Si_xN_y$ is formed on the entire surface by a CVD method, a heat oxidation method, a heat nitriding method or a plasma nitriding method. Then, a polysilicon layer doped with, for example, an n-type dopant is deposited on the entire surface by a CVD method, and then the polysilicon layer is patterned, to form the second gate 19. The second gate 19 has a common region with the word line WL.

[Step-940]

Then, an insulation interlayer 20 formed of, for example, $SiO_2$ is deposited on the entire surface by a CVD method, and then opening portion is formed in the insulation interlayer 20 above the drain region 16 and above the source portion 54 of the field effect transistor. Then, a wiring layer of, for example, an aluminum alloy is deposited on the insulation interlayer 20 and in the opening portion by a sputtering method, and the wiring layer is patterned, thereby to form the bit line (BL) 21 electrically connected to the drain region 16 and to the source portion 54 of the field effect transistor. In this manner, the memory cell having a constitution shown in FIGS. 30A and 30B can be obtained.

EXAMPLE 10

The memory cell of Example 10 is also a variant of the memory cell of Example 6. The memory cell of Example 10 has substantially the same constitution as that of the memory cell of Example 6, while the process for the manufacture thereof differs from the process in Example 6 to some extent. In particular, the process for the manufacture of the memory cell of Example 10 serves to decrease the cell area and to decrease the current in a reverse direction in the non-linear resistance element. The process for the manufacture of the memory cell of Example 10 will be explained with reference to FIGS. 32A, 32B, 32C, 33A, 33B, 34A, 34B and 35 hereinafter.

[Step-1000]

First, a device separation region (not shown) having a LOCOS structure and/or a trench structure is formed in a semiconductor substrate 10 by a known method. A well (not shown) may be formed in the surface of the semiconductor substrate 10 as required. Then, the surface of the semiconductor substrate 10 is treated by a heat oxidation method or a method in which heat nitriding is carried out after heat oxidation, to form the insulation layer 12 corresponding to a gate insulation layer on the semiconductor substrate 10. Then, a first polysilicon layer 113A doped with, for example, a p-type dopant is deposited on the entire surface by a CVD method, and then the first polysilicon layer 113A and the insulation layer 12 are patterned by a lithographic technique and a dry etching technique so as to retain the first polysilicon layer which is at least to form part of the first gate 13 and part of the first gate extended region 13A (see FIG. 32A).

[Step-1010]

Figure 32A:
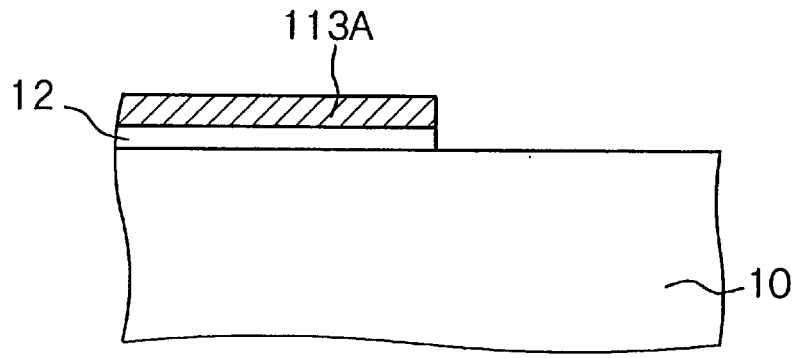
FIGS. 32A, 32B and 32C are schematic, partial cross sectional views of a semiconductor substrate, etc., for explaining the process for the manufacture of a memory cell in Example 10.
Figure 32B:
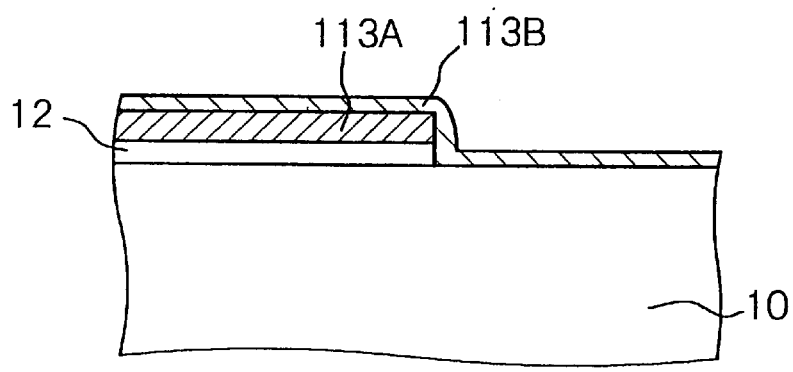
Figure 32C:
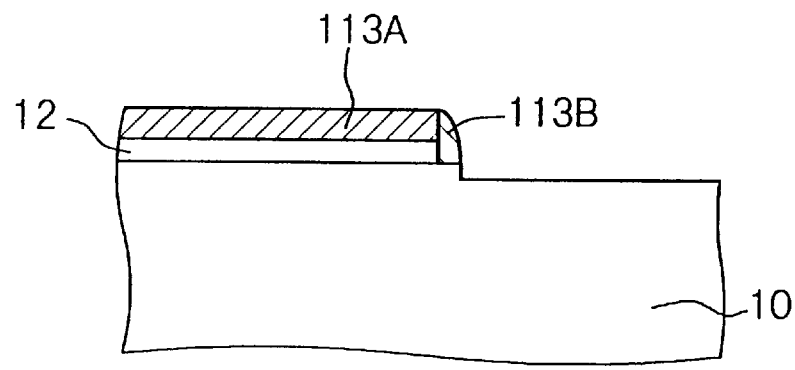
Figure 33A:
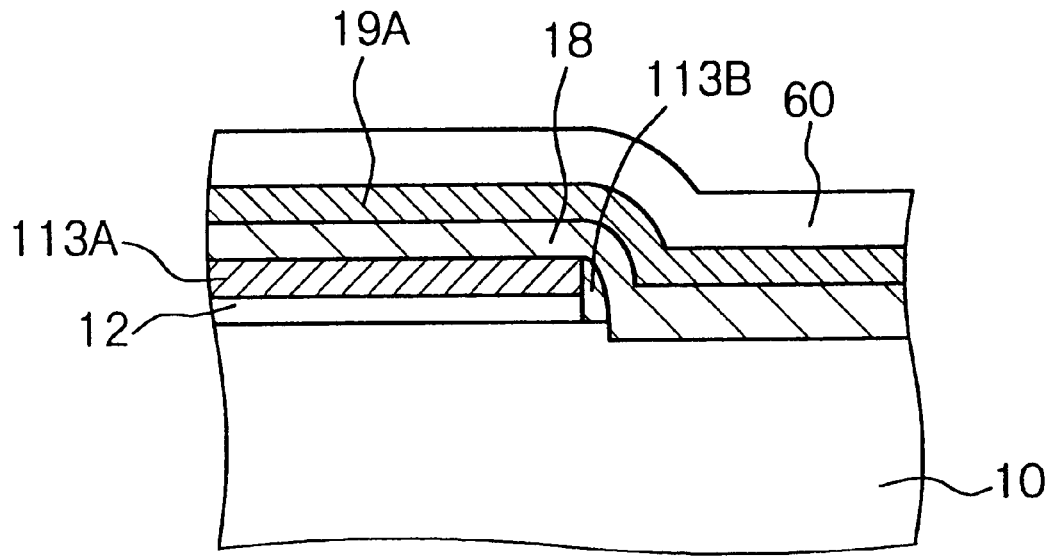
FIGS. 33A and 33B, subsequent to FIG. 32C, are schematic, partial cross-sectional views of a semiconductor substrate, etc., for explaining the process for the manufacture of the memory cell in Example 10.
Figure 33B:
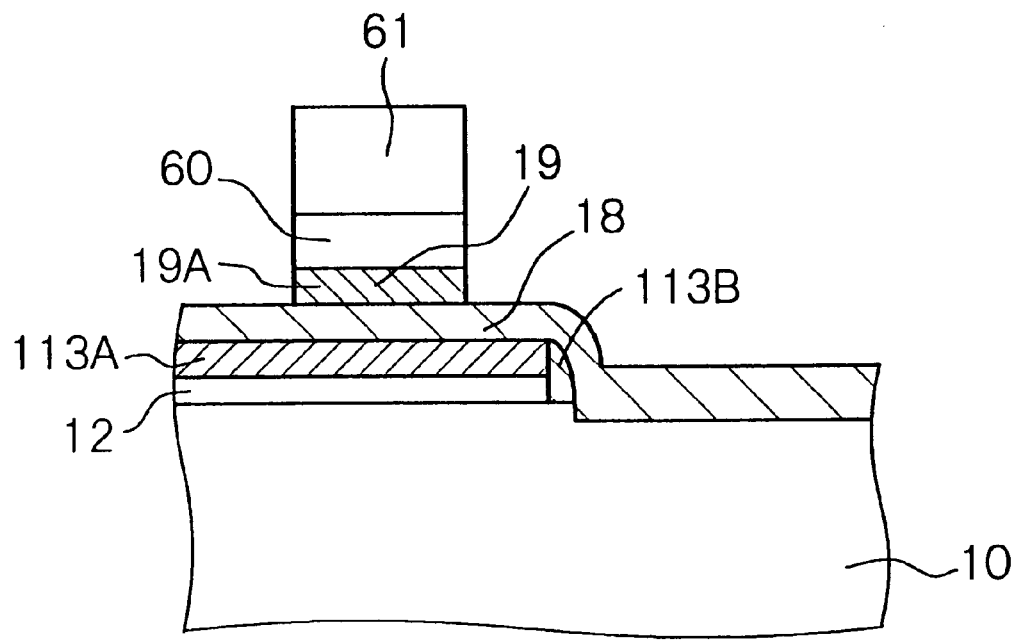
Figure 34A:
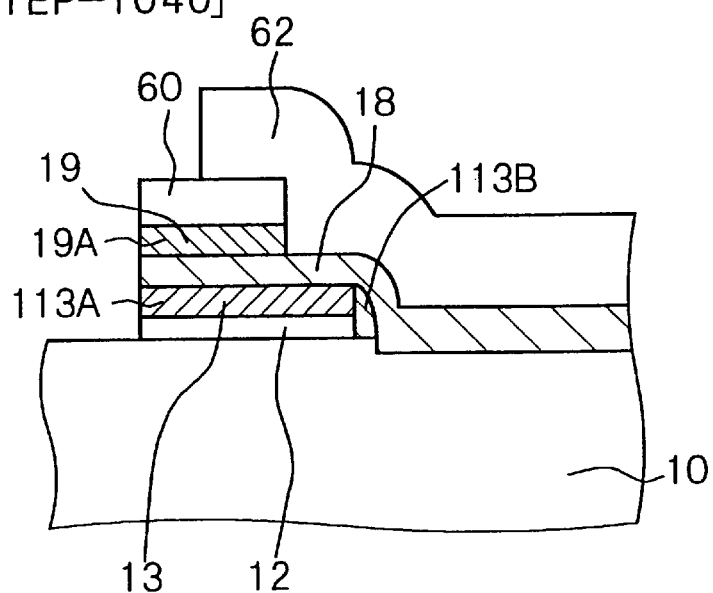
FIGS. 34A and 34B, subsequent to FIG. 33B, are schematic, partial cross-sectional views of a semiconductor substrate, etc., for explaining the process for the manufacture of the memory cell in Example 10.
Figure 34B:
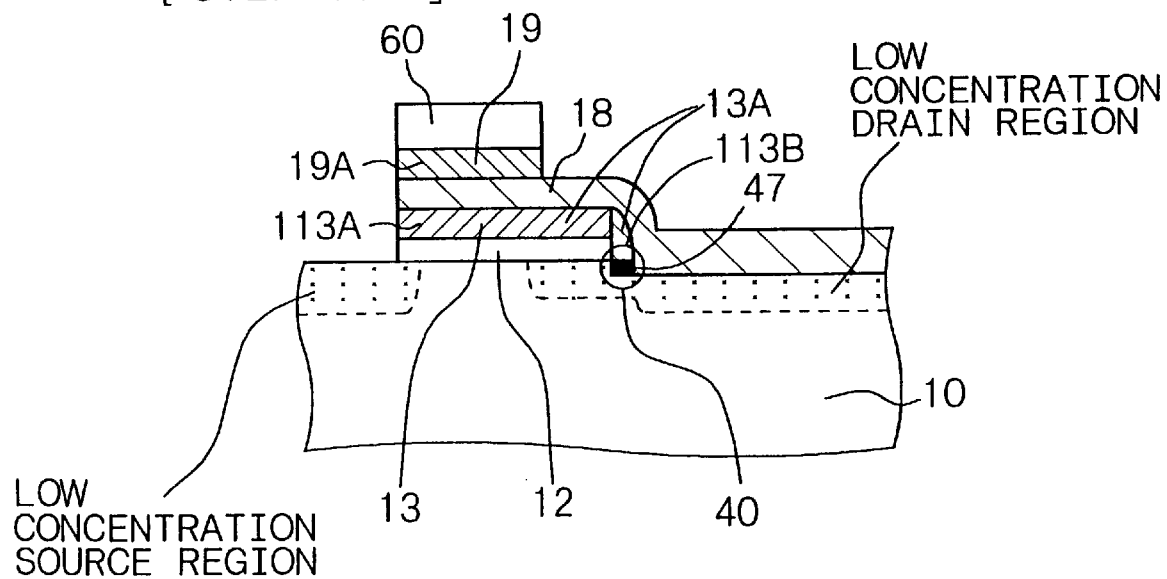

Then, a second polysilicon layer 113B doped with, for example, a p-type dopant is deposited on the entire surface by a CVD method (see FIG. 32B). Preferably, the second polysilicon layer 113B has a smaller thickness than the first polysilicon layer 113A in view of a process margin. Then, the second polysilicon layer 113B and the first polysilicon layer 113A are uniformly etched by a thickness which is greater than the thickness of the second polysilicon layer 113B but is smaller than the total thickness of the first polysilicon layer 113A and the second polysilicon layer 113B, whereby the first polysilicon layer 113A is retained and the second polysilicon layer 113B is retained on a side wall portion of the first polysilicon layer 113A and the insulation layer 12 (see FIG. 32C). Part of the retained first polysilicon layer 113A corresponds to the first gate 13 and the first gate extended region 13A, and the retained second polysilicon layer 113B corresponds to the first gate extended region 13A. If [Step-800] of Example 8 is carried out in this step, the first gate extended region 13A is single-crystallized. As a result, a pn junction can be formed in the single-crystallized silicon layer, and the leak current ($I_{R1}$) of the non-linear resistance element 30 in a non-conductive state can be reliably decreased.

[Step-1020]

Then, the dielectric film 18 composed of, for example, $SiO_2$, $SiO_2/Si_xN_y$, $SiO_2/Si_xN_y/SiO_2$ or $Ta_2O_5/Si_xN_y$ is formed on the entire surface by a CVD method, a heat oxidation method, a heat nitriding method or a plasma nitriding method. Then, a third polysilicon layer 19A doped with, for example, an n-type dopant, or a stacked structure of a polysilicon layer and a tungsten silicide layer, is formed on the entire surface, to form a second gate. Further, an oxide film 60 which works as an etching mask is formed thereon (see FIG. 33A).

[Step-1030]

A resist material 61 having the shape of a second gate is formed on the basis of a lithographic technique, and the oxide film 60 and the third polysilicon layer 19 are etched with using the resist material 61 as a mask. At a time when the dielectric film 18 is exposed, the etching is terminated (see FIG. 33B), whereby the second gate 19 is formed. The second gate 19 has a common region with the word line WL.

[Step-1040]

Then, the resist material 61 is removed, and then a resist material 62 is formed on the basis of a lithographic technique. For forming a source region side end portion of the first gate, the dielectric film 18, the first polysilicon layer 113A and the insulation layer 12 are etched with using the oxide layer 60 and the resist material 62 as a mask (see FIG. 34A). The source region side end portion of the first gate is etched with self-alignment due to the presence of the side surface of the oxide layer 60. In this manner, the first gate 13 composed of the first polysilicon layer 113A is formed on the insulation layer 12, and the first gate extended region 13A extending from the first gate 13 to a region where one source/drain region is to be formed in a semiconductor layer (the semiconductor substrate 10 in Example 10) can be also formed on the semiconductor layer (the semiconductor substrate 10). That is, the first gate extended region 13A extends from the first gate 13 to a region where an opposite conductivity-type region 47 is to be formed, and it is formed of the first polysilicon layer 113A and the second polysilicon layer 113B.

[Step-1050]

Then, the resist material 62 is removed, the surface is cleaned, and then an n-type dopant is selectively ion-implanted with using the second gate 19 as a mask, to form a low-concentration drain region and a low-concentration source region. The total thickness of the insulation layer 12 and the first polysilicon layer 113A is designed in advance so as to be smaller than the range of the above ion implantation. Then, the heat treatment is carried out to thermally diffuse the p-type dopant contained in the second polysilicon layer 113B into the surface region of the low-concentration drain region. In this manner, the opposite conductivity-type region 47 (p-type dopant region) to constitute the non-linear resistance element 40 formed of a pn junction diode is formed in the surface region of the semiconductor layer (the semiconductor substrate 10 in Example 10) (see FIG. 34B).

[Step-1060]

Figure 35:
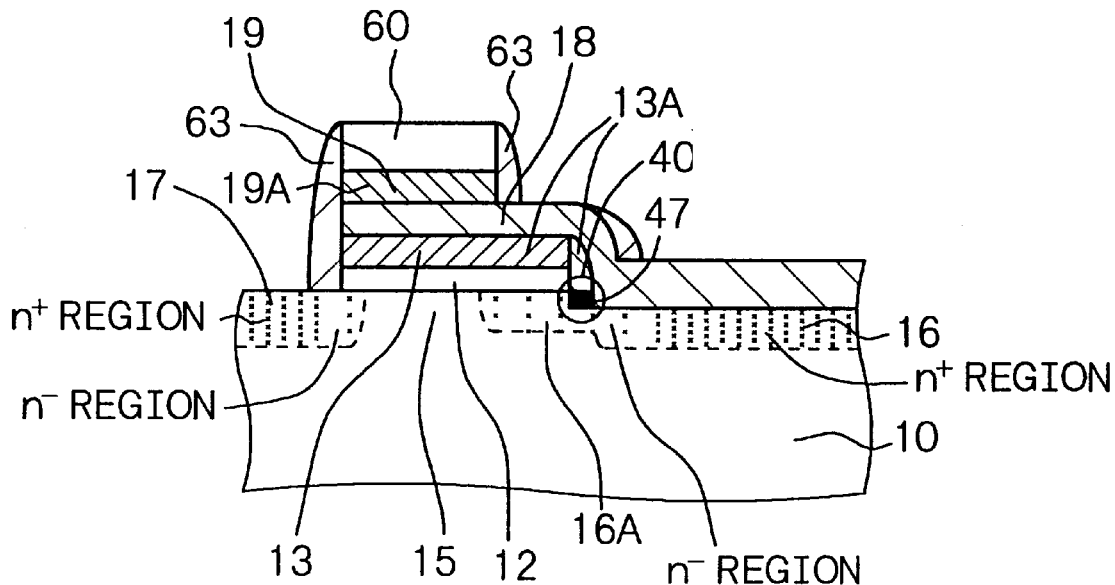
FIGS. 35, subsequent to FIG. 34B, is a schematic, partial cross-sectional view of a semiconductor substrate, etc., for explaining the process for the manufacture of the memory cell in Example 10.

Then, a spacer insulation film 63 is formed by a known LDD process, and ion implantation with an n-type dopant is carried out to form the high-concentration drain region 16 and the high-concentration source region 17 (see FIG. 35).

[Step-1070]

Then, an insulation interlayer formed of, for example, $SiO_2$ is deposited on the entire surface by a CVD method, an opening portion is formed in the insulation interlayer above the drain region 16. Then, a wiring layer of, for example, an aluminum alloy is deposited on the insulation interlayer and in the above opening portion by a sputtering method, and the wiring layer is patterned, thereby to form the bit line (BL) electrically connected to the drain region 16, whereby the memory can be obtained.

According to the above-explained process for the manufacture of the memory cell of Example 10, the non-linear resistance element having a small area can be formed without relying upon a resolution in the lithographic technique. If the minimum etching dimension (line width) is F, there can be manufactured a memory cell having an area close to $6F^2$.

Figure 36:
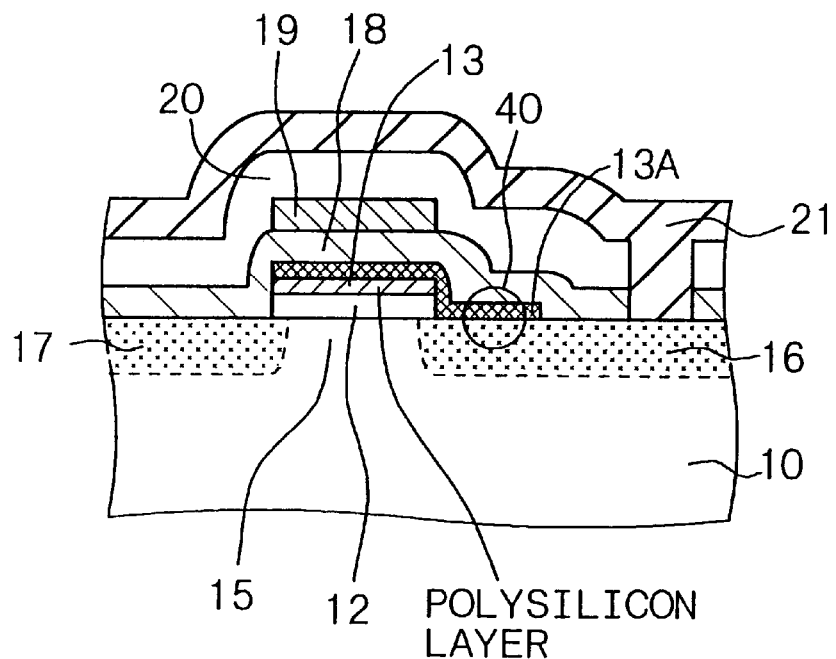
FIG. 36 is a schematic, partial cross-sectional view of a variant of the memory cell in Example 1.

The non-linear resistance element may be formed of a hetero-junction diode (e.g., Schottky barrier diode) of which the partial cross-sectional view is schematically shown in FIG. 36, in place of a pn junction diode. In this case, for example, in Example 6, a titanium silicide layer can be formed on the surface of the drain region 16 instead of the formation of the second polysilicon layer. In this manner, the hetero-junction diode can be composed of a conductive region formed on the surface region of one source/drain region (the drain region 16) and one source/drain region which is the drain region 16 and corresponds to the other end (the end B) of the non-linear resistance element 30. The first gate extended region 13A corresponds to the conductive region, and the conductive region corresponds to one end (the end A) of the non-linear resistance element 30. That is, the first gate 13 may be structured of two layers consisting of a polysilicon layer and a titanium silicide layer, and the first gate extended region 13A from the first gate 13 may be formed of the titanium silicide layer. In this case, the hetero-junction region is formed of the drain region 16 and a portion (conductive region) of the first gate extended region 13A which is formed of titanium silicide and is in contact with the drain region 16. The material for forming the hetero-junction diode shall not be limited to titanium silicide, and it can be also selected from, for example, cobalt silicide or tungsten silicide or can be selected from other metal materials such as molybdenum. When the non-linear resistance element is formed of a hetero-junction diode, $V_{F1}$ can be controlled by properly selecting an annealing temperature or a metal for forming a silicide.

The present invention has been explained with reference to Examples, while the present invention shall not be limited thereto. The memory cell structures are examples, and may be altered in design as required. Further, Examples mainly refer to n-type memory cells as embodiments, while the memory cell of the present invention can naturally apply to a p-type memory cell. In the memory cell explained in Example 7, alternatively, the silicon layer 44 in which the non-linear resistance element is formed may be formed of amorphous or polycrystallined silicon. Further, the memory cell explained in Examples 1 to 6 and the memory cell explained in Examples 8 to 10 can apply to a memory cell having an SOI structure or having a silicon layer formed of amorphous or polycrystallined silicon in which the non-linear resistance element is formed. In some cases, a wiring may be provided to connect the first gate and one end (the end A) of the non-linear resistance element instead of the formation of the first gate extended region extending from the first gate. Further, in Examples, one source/drain region has been explained mainly as a drain region, while one source/drain region may be used as a source region.

Figure 37:
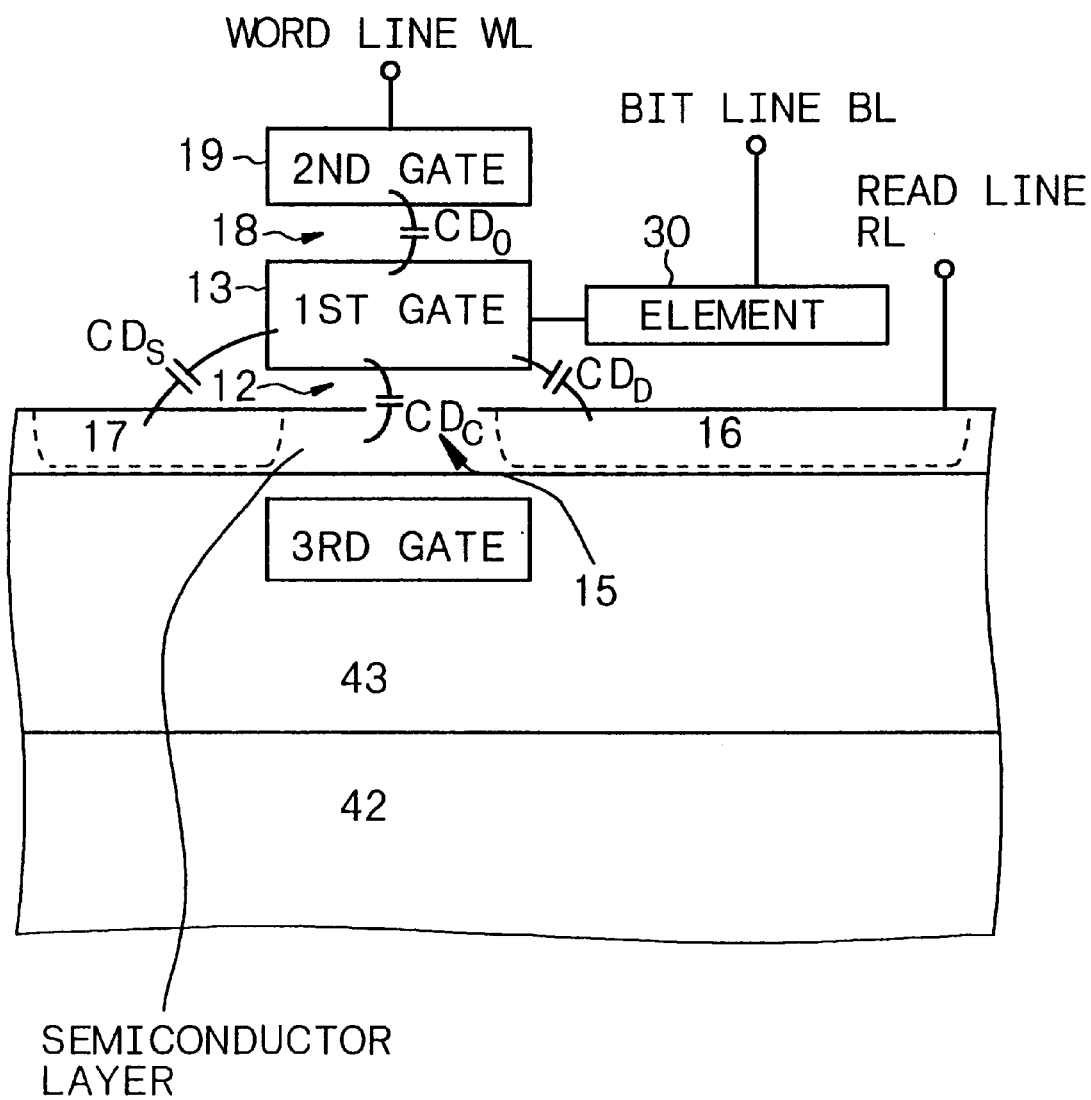
FIG. 37 is a fundamental, principle drawing of a variant of the memory cell according to the first A configuration of the present invention.
Figure 38:
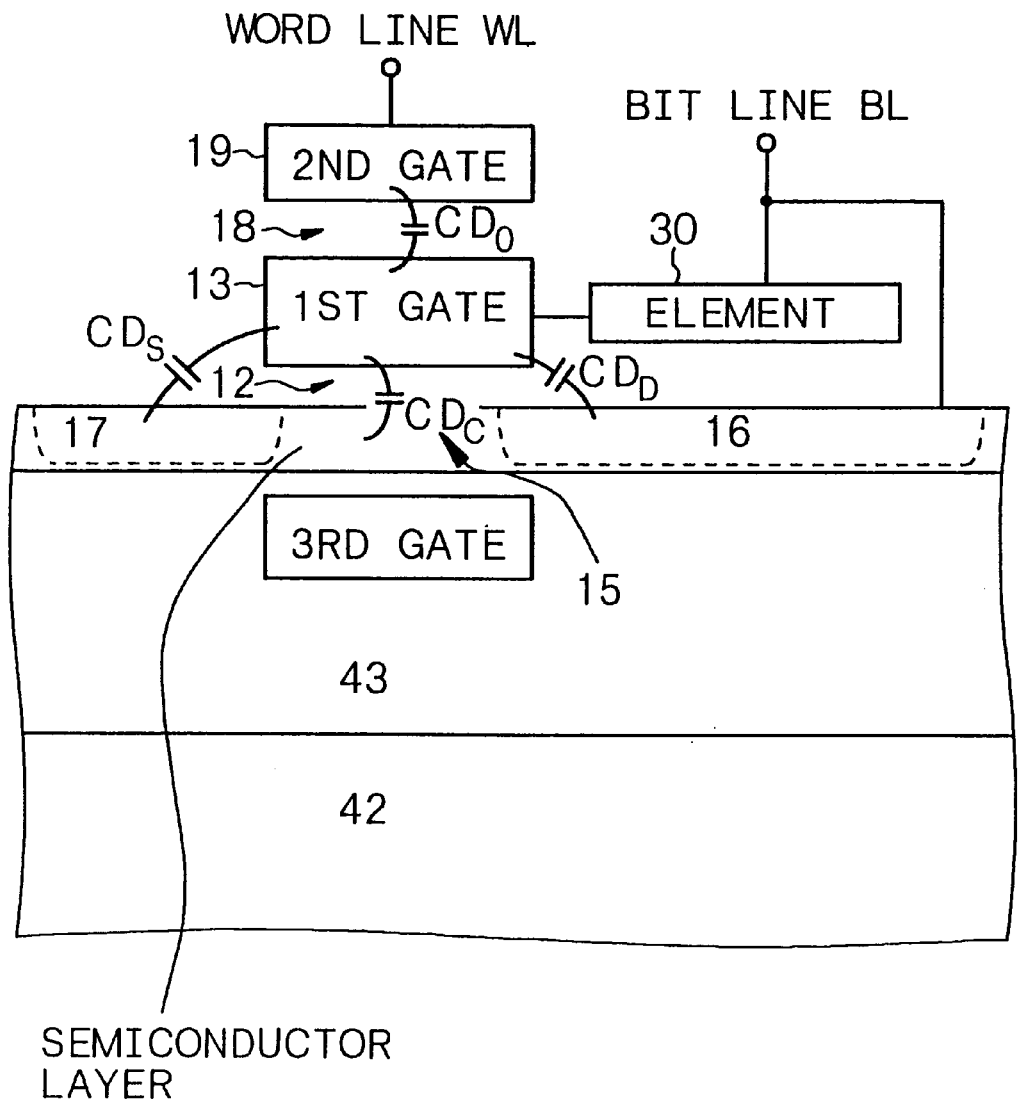
FIG. 38 is a fundamental, principle drawing of a variant of the memory cell according to the first B configuration of the present invention.
Figure 39:
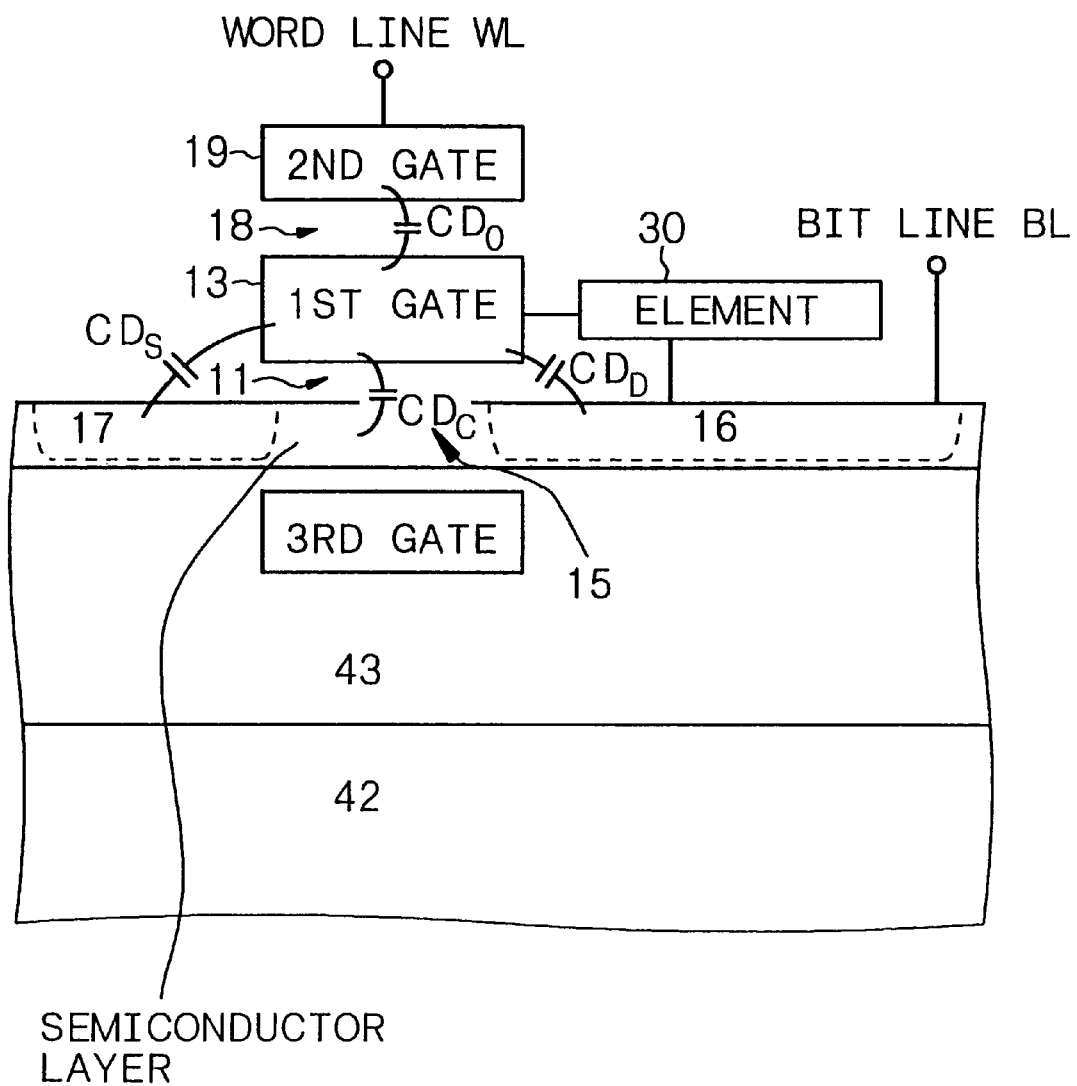
FIG. 39 is a fundamental, principle drawing of a variant of the memory cell according to the first C configuration of the present invention.
Figure 40:
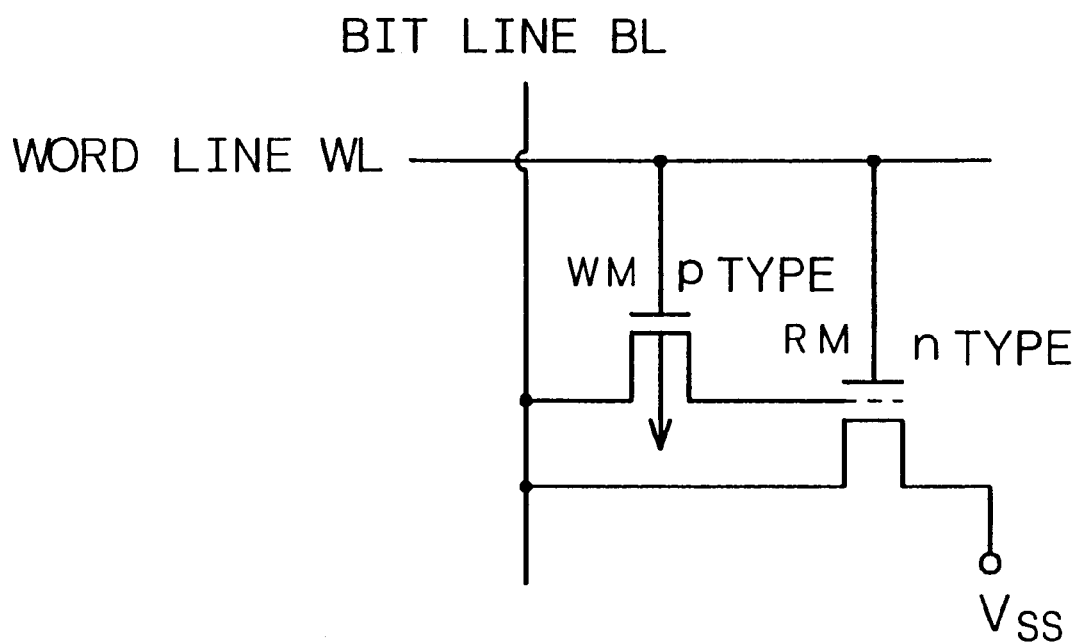
FIG. 40 shows an equivalent circuit of a conventional so-called DRAM gain cell.

Further, as FIGS. 37, 38 and 39 show the third gate portion may be formed below the channel forming region 15 of the memory cell. In this case, the third gate portion may be used for controlling the gate threshold voltage seen from the second gate, while it may be used as a gate for readout as well. That is, since the gate threshold voltage seen from the third gate portion changes depending upon the voltage of the first gate, information can be read out by setting the potential of the third gate portion at an intermediate potential of changing values. The above memory cell can be manufactured according to a known so-called SOI technique, and detailed explanations thereof are therefore omitted. FIG. 37 shows the principle of a variant of the memory cell according to the first A configuration of the present invention shown in FIGS. 1A, 1B and 1C. FIG. 38 shows the principle of a variant of the memory cell according to the first B configuration of the present invention shown in FIGS. 3A, 3B and 3C. FIG. 39 shows the principle of a variant of the memory cell according to the first C configuration of the present invention shown in FIGS. 4A and 4B. The constitution of the memory cell of which the principle is shown in FIGS. 37, 38 and 39 can be applied to the memory cells shown in FIGS. 5A, 5B, 6A, 6B, 7A and 7B. The memory cell explained in Examples 1 to 10 can be formed with a compound semiconductor.

In the memory cell and the process for the manufacture thereof provided by the present invention, a simply structured DRAM gain cell can be obtained, the production process thereof is not so complicated, it is not necessary to produce TFT, the memory cell can be produced almost according to the process for the manufacture of a conventional flash memory, and an increase in the number of external wiring and an increase in the area of terminal portions (contact portions) can be suppressed. Further, unlike a conventional DRAM, no complicatedly structured capacitor is required, and a large capacitor required for a conventional DRAM is, in principle, not required. In the memory cell of the present invention, therefore, the cell area is not much increased. Further, a DRAM-including logic circuit can be easily produced.

What is claimed is:

1. A memory cell with a stored charge on its gate, comprising:
    (A) a channel forming region;
    (B) a first gate formed on an insulation layer formed on the surface of the channel forming region, the first gate and the channel forming region facing each other through the insulation layer;
    (C) a second gate capacitively coupled with the first gate;
    (D) source/drain regions formed in contact with the channel forming region, one source/drain region being spaced from the other source/drain region; and
    (E) a non-linear resistance element having at least two ends with one end connected to the first gate, the non-linear resistance element having a two-terminal operation characteristic.

2. The memory cell according to claim 1, wherein
    the non-linear resistance element is brought into a low resistive state when a first voltage having the same polarity as a polarity of a forward conduction voltage and having an absolute value which is equal to, or greater than, an absolute value of the forward conduction voltage is applied across the two ends, and
    wherein the non-linear resistance element is brought into a high resistive state when a second voltage having the same polarity as the polarity of the forward conduction voltage and having an absolute value smaller than the absolute value of the forward conduction voltage or a voltage having an opposite polarity to the forward conduction voltage is applied across the two ends.

3. The memory cell according to claim 2, wherein
    the non-linear resistance element is brought into a high resistive state when a third voltage having an opposite polarity to the polarity of the forward conduction voltage and having an absolute value smaller than an absolute value of a reverse conduction voltage is applied across the two ends, and
    wherein the non-linear resistance element is brought into a low resistive state when a fourth voltage having an opposite polarity to the polarity of the forward conduction voltage and having an absolute value which is equal to, or greater than, the absolute value of the reverse conduction voltage is applied across the two ends.

4. The memory cell according to claim 3, wherein the non-linear resistance element is formed of a pn junction diode.

5. The memory cell according to claim 4, wherein the pn junction diode has a semiconductor region that is the same as the source/drain regions in conductivity type and a semiconductor region that is opposite to the source/drain regions in conductivity type,
    wherein the semiconductor region that is opposite to the source/drain regions in conductivity type corresponds to said one end of the non-linear resistance element, and
    wherein the semiconductor region that is the same as the source/drain regions in conductivity type corresponds to the other end of the non-linear resistance element.

6. The memory cell according to claim 4, wherein the pn junction diode has a pn junction region formed of a single crystal semiconductor.

7. The memory cell according to claim 4, wherein the reverse conduction voltage is determined by a punch-through.

8. The memory cell according to claim 4, wherein the reverse conduction voltage is determined by an avalanche breakdown.

9. The memory cell according to claim 4, wherein the reverse conduction voltage is determined by a Zener breakdown.

10. The memory cell according to claim 4, wherein the pn junction diode has a lateral pn junction.

11. The memory cell according to claim 2, wherein the non-linear resistance element is formed of a hetero-junction diode.

12. The memory cell according to claim 3, wherein the non-linear resistance element is formed of a field effect transistor.

13. The memory cell according to claim 12, wherein the reverse conduction voltage of the non-linear resistance element is controlled by a gate threshold voltage of the field effect transistor.

14. The memory cell according to claim 1, wherein the second gate is capacitively coupled with the first gate through a dielectric film.

15. The memory cell according to claim 2, wherein the memory cell further has a second non-linear resistance element having at least two ends with one end connected to the first gate.

16. The memory cell according to claim 15, wherein the second non-linear resistance element has a two-terminal operation characteristic.

17. The memory cell according to claim 15, wherein the second non-linear resistance element has characteristics that it is brought into a low resistive state when a fifth voltage having the same polarity as that of a second forward conduction voltage land having an absolute value which is equal to, or greater than, an absolute value of the second forward conduction voltage is applied across the two ends and that it is brought into a high resistive state when a sixth voltage having the same polarity as that of the second forward conduction voltage and having an absolute value smaller than the absolute value of the second forward conduction voltage or a seventh voltage having an opposite polarity to the second forward conduction is applied across the two ends.

18. The memory cell according to claim 17, wherein the second non-linear resistance element is formed of a pn junction diode having a semiconductor region which is the same as the source/drain regions in conductivity type and a semiconductor region which is opposite to the source/drain regions in conductivity type,
    the semiconductor region which is the same as the source/drain regions in conductivity type corresponds to said one end of the second non-linear resistance element, and
    the semiconductor region which is opposite to the source/drain regions in conductivity type corresponds to the other end of the second non-linear resistance element.

19. The memory cell according to claim 18, wherein the pn junction diode has a lateral pn junction.

20. The memory cell according to claim 18, wherein the pn junction diode has a pn junction region formed of a single crystal semiconductor.

21. The memory cell according to claim 17, wherein the second non-linear resistance element is formed of a hetero-junction diode.

22. The memory cell according to claim 2, wherein the second gate is connected to a word line, the other end of the non-linear resistance element is connected to a bit line, and one source/drain region is connected to a read line.

23. The memory cell according to claim 22, wherein a first bit-line potential is applied to the bit line, a first read-line potential is applied to the read line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, whereby a charge of a first polarity is transported from the bit line to the first gate through the non-linear resistance element and the charge of a first polarity is stored on or in the first gate.

24. The memory cell according to claim 22, wherein a second bit-line potential is applied to the bit line, a first read-line potential is applied to the read line and then a word-line potential is switched from a first word-line potential to a second word-line potential, thereby to generate the second voltage or a voltage having an opposite polarity to the forward conduction voltage, between the first gate and said other end of the non-linear resistance element through the capacitive coupling between the first gate and the second gate and to keep the non-linear resistance element in a high resistive state, whereby the charge stored on or in the first gate is prevented from undergoing a change in state.

25. The memory cell according to claim 23 or 24, wherein the other source/drain region is reverse biased with respect to the channel forming region when the second word-line potential is applied to the word line.

26. The memory cell according to claim 23 or 24, wherein the other source/drain region floats with respect to the channel forming region when the second word-line potential is applied to the word line.

27. The memory cell according to claim 23, wherein the charge to be stored on or in the first gate corresponds to stored information and the stored information is information corresponding to a level number of the first bit-line potential.

28. The memory cell according to claim 27, wherein the level number of the first bit-line potential to be applied to the bit line is one and the stored information is binary information.

29. The memory cell according to claim 27, wherein the level number of the first bit-line potential to be applied to the bit line is at least two and the stored information is multi-valued information.

30. The memory cell according to claim 23, wherein the charge to be stored on or in the first gate corresponds to stored information and the stored information is information corresponding to a level number of the second word-line potential.

31. The memory cell according to claim 30, wherein the level number of the second word-line potential to be applied to the word line is one and the stored information is binary information.

32. The memory cell according to claim 30, wherein the level number of the second word-line potential to be applied to the word line is at least two and the stored information is multi-valued information.

33. The memory cell according to claim 23, wherein the charge to be stored on or in the first gate corresponds to stored information and the stored information is information corresponding to a level number of the voltage between the second word-line potential and the first bit-line potential.

34. The memory cell according to claim 33, wherein the level number of the voltage between the second word-line potential and the first bit-line potential is one and the stored information is binary information.

35. The memory cell according to claim 33, wherein the level number of the voltage between the second word-line potential and the first bit-line potential is at least two and the stored information is multi-valued information.

36. The memory cell according to claim 22, wherein
the non-linear resistance element is brought into a high resistive state when a third voltage having an opposite polarity to the polarity of the forward conduction voltage and having an absolute value smaller than an absolute value of a reverse conduction voltage is applied across the two ends, and
wherein the non-linear resistance element is brought into a low resistive state when a fourth voltage having an opposite polarity to the polarity of the forward conduction voltage and having an absolute value that is equal to, or greater than, the absolute value of the reverse conduction voltage is applied across the two ends.

37. The memory cell according to claim 36, wherein a third word-line potential is applied to the word line and a third bit-line potential is applied to the bit line, thereby to generate the fourth voltage between the first gate and said other end of the non-linear resistance element through the capacitive coupling between the first gate and the second gate and to bring the non-linear resistance element into a low resistive state, and a charge of a second polarity which is an opposite polarity to a first polarity is transported from the bit line to the first gate through the non-linear resistance element, or the charge of a first polarity is discharged from the first gate to the bit line through the non-linear resistance element, whereby the charge-stored state of the first gate is brought into a second charge-stored state.

38. The memory cell according to claim 22, wherein the non-linear resistance element is formed of a pn junction diode and is formed in the first gate or formed in or on an extended region of the first gate.

39. The memory cell according to claim 38, wherein the pn junction diode has a semiconductor region that is the same as the source/drain regions in conductivity type and a semiconductor region that is opposite to the source/drain regions in conductivity type,
wherein the semiconductor region that is opposite to the source/drain regions in conductivity type corresponds to said one end of the non-linear resistance element, and
wherein the semiconductor region that is the same as the source/drain regions in conductivity type corresponds to said other end of the non-linear resistance element.

40. The memory cell according to claim 38, wherein the pn junction diode has a lateral pn junction.

41. The memory cell according to claim 40, wherein a pn junction region of the pn junction diode is formed of a single crystal semiconductor.

42. The memory cell according to claim 22, wherein the non-linear resistance element is formed of a hetero-junction diode, and the non-linear resistance element is formed on the first gate or on an extended region of the first gate.

43. The memory cell according to claim 17, wherein the second gate is connected to a word line, the other end of the non-linear resistance element is connected to a bit line, one source/drain region is connected to a read line, and the other end of the second non-linear resistance element is connected to an erase line.

44. The memory cell according to claim 43, wherein a first bit-line potential is applied to the bit line, a first read-line potential is applied to the read line, a first erase-line potential is applied to the erase line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate, whereby a charge of a first polarity is transported from the bit line to the first gate through the non-linear resistance element and the charge of a first polarity is stored on or in the first gate.

45. The memory cell according to claim 43, wherein a second bit-line potential is applied to the bit line, a first read-line potential is applied to the read line, a first erase-line potential is applied to the erase line and then a word-line potential is switched from a first word-line potential to a second word-line potential, thereby to generate the second voltage or a voltage having an opposite polarity to the forward conduction voltage, between the first gate and said other end of the non-linear resistance element through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state.

46. The memory cell according to claim 44 or 45, wherein the other source/drain region is reversely biased with regard to the channel forming region when the second word-line potential is applied to the word line.

47. The memory cell according to claim 44 or 45, wherein the other source/drain region is made floating with regard to the channel forming region when the second word-line potential is applied to the word line.

48. The memory cell according to claim 44, wherein the charge to be stored on or in the first gate corresponds to stored information and the stored information is information corresponding to a level number of the first bit-line potential.

49. The memory cell according to claim 48, wherein the level number of the first bit-line potential to be applied to the bit line is one and the stored information is binary information.

50. The memory cell according to claim 48, wherein the level number of the first bit-line potential to be applied to the bit line is at least two and the stored information is multi-valued information.

51. The memory cell according to claim 44, wherein the charge to be stored on or in the first gate corresponds to stored information and the stored information is information corresponding to a level number of the second word-line potential.

52. The memory cell according to claim 51, wherein the level number of the second word-line potential to be applied to the word line is one and the stored information is binary information.

53. The memory cell according to claim 51, wherein the level number of the second word-line potential to be applied to the word line is at least two and the stored information is multi-valued information.

54. The memory cell according to claim 44, wherein the charge to be stored on or in the first gate corresponds to stored information and the stored information is information corresponding to a level number of the voltage between the second word-line potential and the first bit-line potential.

55. The memory cell according to claim 54, wherein the level number of the voltage between the second word-line potential and the first bit-line potential is one and the stored information is binary information.

56. The memory cell according to claim 54, wherein the level number of the voltage between the second word-line potential and the first bit-line potential is at least two and the stored information is multi-valued information.

57. The memory cell according to claim 43, wherein a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state.

58. The memory cell according to claim 43, wherein each of the non-linear resistance element and the second non-linear resistance element is formed of a pn junction diode and is formed in the first gate or formed in or on an extended region of the first gate.

59. The memory cell according to claim 58, wherein the non-linear resistance element is formed of a pn junction diode having a first semiconductor region which is the same as the source/drain regions in conductivity type and a second semiconductor region which is opposite to the source/drain regions in conductivity type, the second semiconductor region corresponds to said one end of the non-linear resistance element, and the first semiconductor region corresponds to said other end of the non-linear resistance element, and the second non-linear resistance element is formed of a pn junction diode having a third semiconductor region which is the same as the source/drain regions in conductivity type and a fourth semiconductor region which is opposite to the source/drain regions in conductivity type, the third semiconductor region corresponds to said one end of the second non-linear resistance element, and the fourth semiconductor region corresponds to said other end of the second non-linear resistance element.

60. The memory cell according to claim 58, wherein each of the pn junction diode constituting the non-linear resistance element and the pn junction diode constituting the second non-linear resistance element has a lateral pn junction.

61. The memory cell according to claim 60, wherein a pn junction region of each pn junction diode is formed of a single crystal semiconductor.

62. The memory cell according to claim 43, wherein each of the non-linear resistance element and the second non-linear resistance element is formed of a hetero-junction diode, and each of the non-linear resistance element and the second non-linear resistance element is formed on the first gate or on an extended region of the first gate.

63. The memory cell according to claim 2, wherein the second gate is connected to a word line, and the other end of the non-linear resistance element and one source/drain region are connected to a bit line.

64. The memory cell according to claim 63, wherein a first bit-line potential is applied to the bit line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, whereby a charge of a first polarity is transported from the bit line to the first gate through the non-linear resistance element and the charge of a first polarity is stored on or in the first gate.

65. The memory cell according to claim 63, wherein a second bit-line potential is applied to the bit line and then a word-line potential is switched from a first word-line potential to a second word-line potential, thereby to generate the second voltage or a voltage having an opposite polarity to the forward conduction voltage, between the first gate and said other end of the non-linear resistance element through the capacitive coupling between the first gate and the second gate and to keep the non-linear resistance element in a high resistive state, whereby the charge stored on or in the first gate is prevented from undergoing a change in state.

66. The memory cell according to claim 64 or 65, wherein the other source/drain region is reverse biased with respect to the channel forming region when the second word-line potential is applied to the word line.

67. The memory cell according to claim 64 or 65, wherein the other source/drain region floats with respect to the channel forming region when the second word-line potential is applied to the word line.

68. The memory cell according to claim 64, wherein the charge to be stored on or in the first gate corresponds to stored information and the stored information is information corresponding to a level number of the first bit-line potential.

69. The memory cell according to claim 68, wherein the level number of the first bit-line potential to be applied to the bit line is one and the stored information is binary information.

70. The memory cell according to claim 68, wherein the level number of the first bit-line potential to be applied to the bit line is at least two and the stored information is multi-valued information.

71. The memory cell according to claim 64, wherein the charge to be stored on or in the first gate corresponds to stored information and the stored information is information corresponding to a level number of the second word-line potential.

72. The memory cell according to claim 71, wherein the level number of the second word-line potential to be applied to the word line is one and the stored information is binary information.

73. The memory cell according to claim 71, wherein the level number of the second word-line potential to be applied to the word line is at least two and the stored information is multi-valued information.

74. The memory cell according to claim 64, wherein the charge to be stored on or in the first gate corresponds to stored information and the stored information is information corresponding to a level number of the voltage between the second word-line potential and the first bit-line potential.

75. The memory cell according to claim 74, wherein the level number of the voltage between the second word-line potential and the first bit-line potential is one and the stored information is binary information.

76. The memory cell according to claim 74, wherein the level number of the voltage between the second word-line potential and the first bit-line potential is at least two and the stored information is multi-valued information.

77. The memory cell according to claim 63, wherein
the non-linear resistance element is brought into a high resistive state when a third voltage having an opposite polarity to the polarity of the forward conduction voltage and having an absolute value smaller than an absolute value of a reverse conduction voltage is applied across the two ends, and
wherein the non-linear resistance element is brought into a low resistive state when a fourth voltage having an opposite polarity to the polarity of the forward conduction voltage and having an absolute value which is equal to, or greater than, the absolute value of the reverse conduction voltage is applied across the two ends.

78. The memory cell according to claim 77, wherein a third word-line potential is applied to the word line and a third bit-line potential is applied to the bit line, thereby to generate the fourth voltage between the first gate and said other end of the non-linear resistance element through the capacitive coupling between the first gate and the second gate and to bring the non-linear resistance element into a low resistive state, and a charge of a second polarity which is an opposite polarity to a first polarity is transported from the bit line to the first gate through the non-linear resistance element, or the charge of a first polarity is discharged from the first gate to the bit line through the non-linear resistance element, whereby the charge-stored state of the first gate is brought into a second charge-stored state.

79. The memory cell according to claim 63, wherein the non-linear resistance element is formed of a pn junction diode and is formed in the first gate or formed in or on an extended region of the first gate.

80. The memory cell according to claim 79, wherein the pn junction diode has a semiconductor region which is the same as the source/drain regions in conductivity type and a semiconductor region which is opposite to the source/drain regions in conductivity type,
the semiconductor region which is opposite to the source/drain regions in conductivity type corresponds to said one end of the non-linear resistance element, and
the semiconductor region which is the same as the source/drain regions in conductivity type corresponds to said other end of the non-linear resistance element.

81. The memory cell according to claim 79, wherein the pn junction diode has a lateral pn junction.

82. The memory cell according to claim 81, wherein a pn junction region of the pn junction diode is formed of a single crystal semiconductor.

83. The memory cell according to claim 63, wherein the non-linear resistance element is formed of a hetero-junction diode, and the non-linear resistance element is formed on the first gate or on an extended region of the first gate.

84. The memory cell according to claim 17, wherein the second gate is connected to a word line, the other end of the non-linear resistance element and one source/drain region are connected to a bit line, and the other end of the second non-linear resistance element is connected to an erase line.

85. The memory cell according to claim 84, wherein a first bit-line potential is applied to the bit line, a first erase-line potential is applied to the erase line and then a word-line potential is switched from a first word-line potential to a second word-line potential, thereby to generate the first voltage between the first gate and said other end of the non-linear resistance element through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby a charge of a first polarity is transported from the bit line to the first gate through the non-linear resistance element and the charge of a first polarity is stored on or in the first gate.

86. The memory cell according to claim 84, wherein a second bit-line potential is applied to the bit line, a first erase-line potential is applied to the erase line and then a word-line potential is switched from a first word-line potential to a second word-line potential, thereby to generate the second voltage or a voltage having an opposite polarity to the forward conduction voltage, between the first gate and said other end of the non-linear resistance element through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state.

87. The memory cell according to claim 85 or 86, wherein the other source/drain region is reversely biased with regard to the channel forming region when the second word-line potential is applied to the word line.

88. The memory cell according to claim 85 or 86, wherein the other source/drain region is made floating with regard to the channel forming region when the second word-line potential is applied to the word line.

89. The memory cell according to claim 85, wherein the charge to be stored on or in the first gate corresponds to stored information and the stored information is information corresponding to a level number of the first bit-line potential.

90. The memory cell according to claim 89, wherein the level number of the first bit-line potential to be applied to the bit line is one and the stored information is binary information.

91. The memory cell according to claim 89, wherein the level number of the first bit-line potential to be applied to the bit line is at least two and the stored information is multi-valued information.

92. The memory cell according to claim 85, wherein the charge to be stored on or in the first gate corresponds to stored information and the stored information is information corresponding to a level number of the second word-line potential.

93. The memory cell according to claim 92, wherein the level number of the second word-line potential to be applied to the word line is one and the stored information is binary information.

94. The memory cell according to claim 92, wherein the level number of the second word-line potential to be applied to the word line is at least two and the stored information is multi-valued information.

95. The memory cell according to claim 85, wherein the charge to be stored on or in the first gate corresponds to stored information and the stored information is information corresponding to a level number of the voltage between the second word-line potential and the first bit-line potential.

96. The memory cell according to claim 95, wherein the level number of the voltage between the second word-line potential and the first bit-line potential is one and the stored information is binary information.

97. The memory cell according to claim 95, wherein the level number of the voltage between the second word-line potential and the first bit-line potential is at least two and the stored information is multi-valued information.

98. The memory cell according to claim 84, wherein a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state.

99. The memory cell according to claim 84, wherein each of the non-linear resistance element and the second non-linear resistance element is formed of a pn junction diode and is formed in the first gate or formed in or on an extended region of the first gate.

100. The memory cell according to claim 99, wherein the non-linear resistance element is formed of a pn junction diode having a first semiconductor region which is the same as the source/drain regions in conductivity type and a second semiconductor region which is opposite to the source/drain regions in conductivity type, the second semiconductor region corresponds to said one end of the non-linear resistance element, and the first semiconductor region corresponds to said other end of the non-linear resistance element, and the second non-linear resistance element is formed of a pn junction diode having a third semiconductor region which is the same as the source/drain regions in conductivity type and a fourth semiconductor region which is opposite to the source/drain regions in conductivity type, the third semiconductor region corresponds to said one end of the second non-linear resistance element, and the fourth semiconductor region corresponds to said other end of the second non-linear resistance element.

101. The memory cell according to claim 99, wherein each of the pn junction diode constituting the non-linear resistance element and the pn junction diode constituting the second non-linear resistance element has a lateral pn junction.

102. The memory cell according to claim 101, wherein a pn junction region of each pn junction diode is formed of a single crystal semiconductor.

103. The memory cell according to claim 84, wherein each of the non-linear resistance element and the second non-linear resistance element is formed of a hetero-junction diode, and each of the non-linear resistance element and the second non-linear resistance element is formed on the first gate or on an extended region of the first gate.

104. The memory cell according to claim 2, wherein the second gate is connected to a word line, the other end of the non-linear resistance element is connected to one source/drain region, and said one source/drain region is connected to a bit line.

105. The memory cell according to claim 104, wherein a first bit-line potential is applied to the bit line and then a word-line potential is switched from a first word-line potential to a second word-line potential, thereby to generate the first voltage between the first gate and said one source/drain region through the capacitive coupling between the first gate and the second gate and to bring the non-linear resistance element into a low resistive state, whereby a charge of a first polarity is transported from the bit line to the first gate through said one source/drain region and the non-linear resistance element, and the charge of a first polarity is stored on or in the first gate.

106. The memory cell according to claim 104, wherein a second bit-line potential is applied to the bit line and then a word-line potential is switched from a first word-line potential to a second word-line potential, thereby to generate the second voltage or a voltage having an opposite polarity to the forward conduction voltage, between the first gate and said one source/drain region through the capacitive coupling between the first gate and the second gate and to keep the non-linear resistance element in a high resistive state, whereby the charge stored on or in the first gate is prevented from undergoing a change in state.

107. The memory cell according to claim 105 or 106, wherein the other source/drain region is reverse biased with respect to the channel forming region when the second word-line potential is applied to the word line.

108. The memory cell according to claim 105 or 106, wherein the other source/drain region is floats with respect to the channel forming region when the second word-line potential is applied to the word line.

109. The memory cell according to claim 105, wherein the charge to be stored on or in the first gate corresponds to stored information and the stored information is information corresponding to a level number of the first bit-line potential.

110. The memory cell according to claim 109, wherein the level number of the first bit-line potential to be applied to the bit line is one and the stored information is binary information.

111. The memory cell according to claim 109, wherein the level number of the first bit-line potential to be applied to the bit line is at least two and the stored information is multi-valued information.

112. The memory cell according to claim 105, wherein the charge to be stored on or in the first gate corresponds to stored information and the stored information is information corresponding to a level number of the second word-line potential.

113. The memory cell according to claim 112, wherein the level number of the second word-line potential to be applied to the word line is one and the stored information is binary information.

114. The memory cell according to claim 112, wherein the level number of the second word-line potential to be applied to the word line is at least two and the stored information is multi-valued information.

115. The memory cell according to claim 105, wherein the charge to be stored on or in the first gate corresponds to stored information and the stored information is information corresponding to a level number of the voltage between the second word-line potential and the first bit-line potential.

116. The memory cell according to claim 115, wherein the level number of the voltage between the second word-line potential and the first bit-line potential is one and the stored information is binary information.

117. The memory cell according to claim 115, wherein the level number of the voltage between the second word-line potential and the first bit-line potential is at least two and the stored information is multi-valued information.

118. The memory cell according to claim 104, wherein the non-linear resistance element has characteristics that it is brought into a high resistive state when a third voltage having an opposite polarity to the forward conduction voltage and having an absolute value smaller than an absolute value of a reverse conduction voltage is applied across the two ends and that it is brought into a low resistive state when a fourth voltage having an opposite polarity to the forward conduction voltage and having an absolute value which is equal to, or greater than, the absolute value of the reverse conduction voltage is applied across the two ends.

119. The memory cell according to claim 118, wherein a third word-line potential is applied to the word line and a third bit-line potential is applied to the bit line, thereby to generate the fourth voltage between the first gate and said one source/drain region through the capacitive coupling between the first gate and the second gate and to bring the non-linear resistance element into a low resistive state, and a charge of a second polarity which is an opposite polarity to a first polarity is transported from the bit line to the first gate through said one source/drain region and the non-linear resistance element, or the charge of a first polarity is discharged from the first gate to the bit line through the non-linear resistance element and said one source/drain region, whereby the charge-stored state of the first gate is brought into a second charge-stored state.

120. The memory cell according to claim 104, wherein the non-linear resistance element is formed of a pn junction diode,
  one region of the pn junction diode corresponding to said one end of the non-linear resistance element is formed in said one source/drain region, and
  the other region of the pn junction diode corresponding to said other end of the non-linear resistance element has a common region with said one source/drain region.

121. The memory cell according to claim 104, wherein the non-linear resistance element is formed of a pn junction diode,
  one region of the pn junction diode corresponding to said one end of the non-linear resistance element has a common region with the first gate, and
  the other region of the pn junction diode corresponding to said other end of the non-linear resistance element is formed in an extended region of the first gate extending to said one source/drain region.

122. The memory cell according to claim 104, wherein the non-linear resistance element is formed of a pn junction diode having a lateral pn junction.

123. The memory cell according to claim 122, wherein a pn junction region of the pn junction diode is formed of a single crystal semiconductor.

124. The memory cell according to claim 104, wherein the non-linear resistance element is formed of a pn junction diode, and
  a pn junction region of the pn junction diode is formed of a single crystal semiconductor.

125. The memory cell according to claim 104, wherein the non-linear resistance element is formed of a hetero-junction diode.

126. The memory cell according to claim 104, wherein the non-linear resistance element is formed of a field effect transistor.

127. The memory cell according to claim 126, wherein the field effect transistor constituting the non-linear resistance element is formed in the surface region of said one source/drain region.

128. The memory cell according to claim 127, wherein one source/drain portion of the field effect transistor corresponding to said one end of the non- linear resistance element is connected to the first gate and to a gate portion of the field effect transistor.

129. The memory cell according to claim 17, wherein the second gate is connected to a word line, the other end of the non-linear resistance element is connected to one source/drain region, said one source/drain region is connected to a bit line, and the other end of the second non-linear resistance element is connected to an erase line.

130. The memory cell according to claim 129, wherein a first bit-line potential is applied to the bit line, a first erase-line potential is applied to the erase line and then a word-line potential is switched from a first word-line potential to a second word-line potential, thereby to generate the first voltage between the first gate and said one source/drain region through the capacitive coupling between the first gate and the second gate and to bring the non-linear resistance element into a low resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby a charge of a first polarity is transported from the bit line to the first gate through said one source/drain region and the non-linear resistance element and the charge of a first polarity is stored on or in the first gate.

131. The memory cell according to claim 129, wherein a second bit-line potential is applied to the bit line, a first erase-line potential is applied to the erase line and then a word-line potential is switched from a first word-line potential to a second word-line potential, thereby to generate the second voltage or a voltage having an opposite polarity to the forward conduction voltage, between the first gate and said one source/drain region through the capacitive coupling between the first gate and the second gate and to keep the non-linear resistance element in a high resistive state, and thereby to generate the sixth voltage or the seventh voltage between the first gate and said other end of the second non-linear resistance element through the capacitive coupling between the first gate and the second gate and to keep the second non-linear resistance element in a high resistive state, whereby the charge stored on or in the first gate is prevented from undergoing a change in state.

132. The memory cell according to claim 130 or 131, wherein the other source/drain region is reversely biased with regard to the channel forming region when the second word-line potential is applied to the word line.

133. The memory cell according to claim 130 or 131, wherein the other source/drain region is made floating with regard to the channel forming region when the second word-line potential is applied to the word line.

134. The memory cell according to claim 130, wherein the charge to be stored on or in the first gate corresponds to stored information and the stored information is information corresponding to a level number of the first bit-line potential.

135. The memory cell according to claim 134, wherein the level number of the first bit-line potential to be applied to the bit line is one and the stored information is binary information.

136. The memory cell according to claim 134, wherein the level number of the first bit-line potential to be applied to the bit line is at least two and the stored information is multi-valued information.

137. The memory cell according to claim 130, wherein the charge to be stored on or in the first gate corresponds to stored information and the stored information is information corresponding to a level number of the second word-line potential.

138. The memory cell according to claim 137, wherein the level number of the second word-line potential to be applied to the word line is one and the stored information is binary information.

139. The memory cell according to claim 137, wherein the level number of the second word-line potential to be applied to the word line is at least two and the stored information is multi-valued information.

140. The memory cell according to claim 130, wherein the charge to be stored on or in the first gate corresponds to stored information and the stored information is information corresponding to a level number of the voltage between the second word-line potential and the first bit-line potential.

141. The memory cell according to claim 140, wherein the level number of the voltage between the second word-line potential and the first bit-line potential is one and the stored information is binary information.

142. The memory cell according to claim 140, wherein the level number of the voltage between the second word-line potential and the first bit-line potential is at least two and the stored information is multi-valued information.

143. The memory cell according to claim 129, wherein a second erase-line potential is applied to the erase line to generate the fifth voltage between the first gate and said other end of the second non-linear resistance element and to bring the second non-linear resistance element into a low resistive state, and a charge of a second polarity which is an opposite polarity to a first polarity is transported from the erase line to the first gate through the second non-linear resistance element, or the charge of a first polarity is discharged from the first gate to the erase line through the second non-linear resistance element, whereby the charge-stored state of the first gate is brought into a second charge-stored state.

144. The memory cell according to claim 129, wherein the non-linear resistance element is formed of a pn junction diode,
    one region of the pn junction diode corresponding to said one end of the non-linear resistance element is formed in said one source/drain region, and
    the other region of the pn junction diode corresponding to said other end of the non-linear resistance element has a common region with said one source/drain region.

145. The memory cell according to claim 129, wherein the non-linear resistance element is formed of a pn junction diode,
    one region of the pn junction diode corresponding to said one end of the non-linear resistance element has a common region with the first gate, and
    the other region of the pn junction diode corresponding to said other end of the non-linear resistance element is formed in an extended region of the first gate extending to said one source/drain region.

146. The memory cell according to claim 129, wherein each of the non-linear resistance element and the second non-linear resistance element is formed of a pn junction diode having a lateral pn junction.

147. The memory cell according to claim 146, wherein a pn junction region of each pn junction diode is formed of a single crystal semiconductor.

148. The memory cell according to claim 129, wherein each of the non-linear resistance element and the second non-linear resistance element is formed of a pn junction diode, and a pn junction region of each pn junction diode is formed of a single crystal semiconductor.

149. The memory cell according to claim 104, wherein each of the non-linear resistance element and the second non-linear resistance element is formed of a hetero-junction diode.

150. The memory cell according to claim 129, wherein the non-linear resistance element is formed of a field effect transistor.

151. The memory cell according to claim 150, wherein the field effect transistor constituting the non-linear resistance element is formed in a surface region of said one source/drain region.

152. The memory cell according to claim 151, wherein one source/drain portion of the field effect transistor corresponding to said one end of the non-linear resistance element is connected to the first gate and to a gate portion of the field effect transistor.

153. The memory cell according to claim 129, wherein the second non-linear resistance element is formed of a pn junction diode,
 one region of the pn junction diode having the same conductivity type as the conductivity type of the source/drain regions corresponds to said one end of the second non-linear resistance element, and
 the other region of the pn junction diode having an opposite conductivity type to the conductivity type of the source/drain regions corresponds to said other end of the second non-linear resistance element.

154. The memory cell according to claim 153, wherein the second non-linear resistance element is formed of a pn junction diode and the second non-linear resistance element is formed in the first gate or formed in or on an extended region of the first gate.

* * * * *

UNITED STATES PATENT AND TRADEMARK OFFICE
CERTIFICATE OF CORRECTION

PATENT NO.   : 6,104,639
DATED        : August 15, 2000
INVENTOR(S)  : Hayashi et al.

It is certified that error appears in the above-identified patent and that said Letters Patent is hereby corrected as shown below:

<u>Column 67,</u>
Line 28, should read:

108. The memory cell according to claim 105 or 106; wherein the other source/drain region floats with respect to the channel forming region when the second word-line potential is applied to the word line.

Signed and Sealed this

Sixteenth Day of April, 2002

Attest:

JAMES E. ROGAN
Attesting Officer     Director of the United States Patent and Trademark Office